(12) United States Patent
Imamura et al.

(10) Patent No.: US 9,871,054 B2
(45) Date of Patent: Jan. 16, 2018

(54) SEMICONDUCTOR DEVICE AND METHOD FOR MANUFACTURING SAME

(71) Applicant: Toshiba Memory Corporation, Tokyo (JP)

(72) Inventors: Tsubasa Imamura, Mie (JP); Atsushi Takahashi, Mie (JP); Toshiyuki Sasaki, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/257,406

(22) Filed: Sep. 6, 2016

(65) Prior Publication Data

US 2017/0301686 A1    Oct. 19, 2017

Related U.S. Application Data

(60) Provisional application No. 62/322,945, filed on Apr. 15, 2016.

(51) Int. Cl.
| | |
|---|---|
| *H01L 27/11582* | (2017.01) |
| *H01L 23/528* | (2006.01) |
| *H01L 27/11556* | (2017.01) |
| *H01L 27/11519* | (2017.01) |
| *H01L 27/11565* | (2017.01) |

(52) U.S. Cl.
CPC .... *H01L 27/11582* (2013.01); *H01L 23/5283* (2013.01); *H01L 27/11519* (2013.01); *H01L 27/11556* (2013.01); *H01L 27/11565* (2013.01)

(58) Field of Classification Search
CPC ............ H01L 29/7813; H01L 29/7802; H01L 29/7827; H01L 29/66666; H01L 29/0696
See application file for complete search history.

(56) References Cited

U.S. PATENT DOCUMENTS

| | | |
|---|---|---|
| 7,989,880 B2 | 8/2011 | Wada et al. |
| 8,395,206 B2 | 3/2013 | Lee et al. |
| 8,680,604 B2 | 3/2014 | Higashi et al. |
| 9,257,444 B2 * | 2/2016 | Oh .................... H01L 27/11565 |
| 2011/0057251 A1 | 3/2011 | Higashi |

* cited by examiner

*Primary Examiner* — Quoc Hoang
(74) *Attorney, Agent, or Firm* — Finnegan, Henderson, Farabow, Garrett & Dunner, L.L.P.

(57) ABSTRACT

According to one embodiment, the stacked body includes a plurality of electrode layers stacked with an insulator interposed. The electrode layers have a plurality of terrace portions arranged in a stairstep configuration with a difference in levels. The insulating layer is provided above the terrace portions. The columnar portions extend in a stacking direction of the stacked body through the insulating layer and through the stacked body under the insulating layer. The columnar portions are insulative. The contact portions are provided at side surfaces of the columnar portions on the terrace portions. The contact portions are connected to the terrace portions.

9 Claims, 64 Drawing Sheets

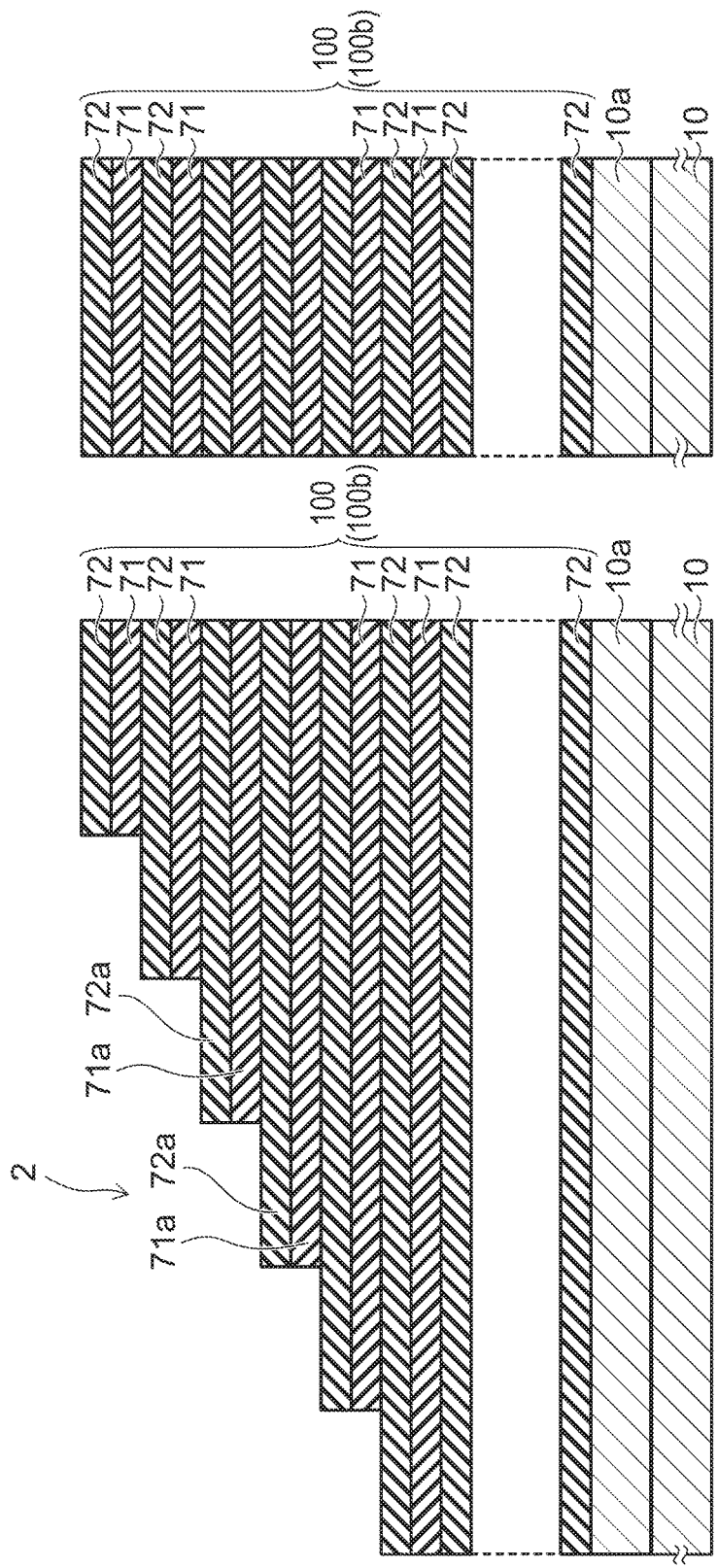

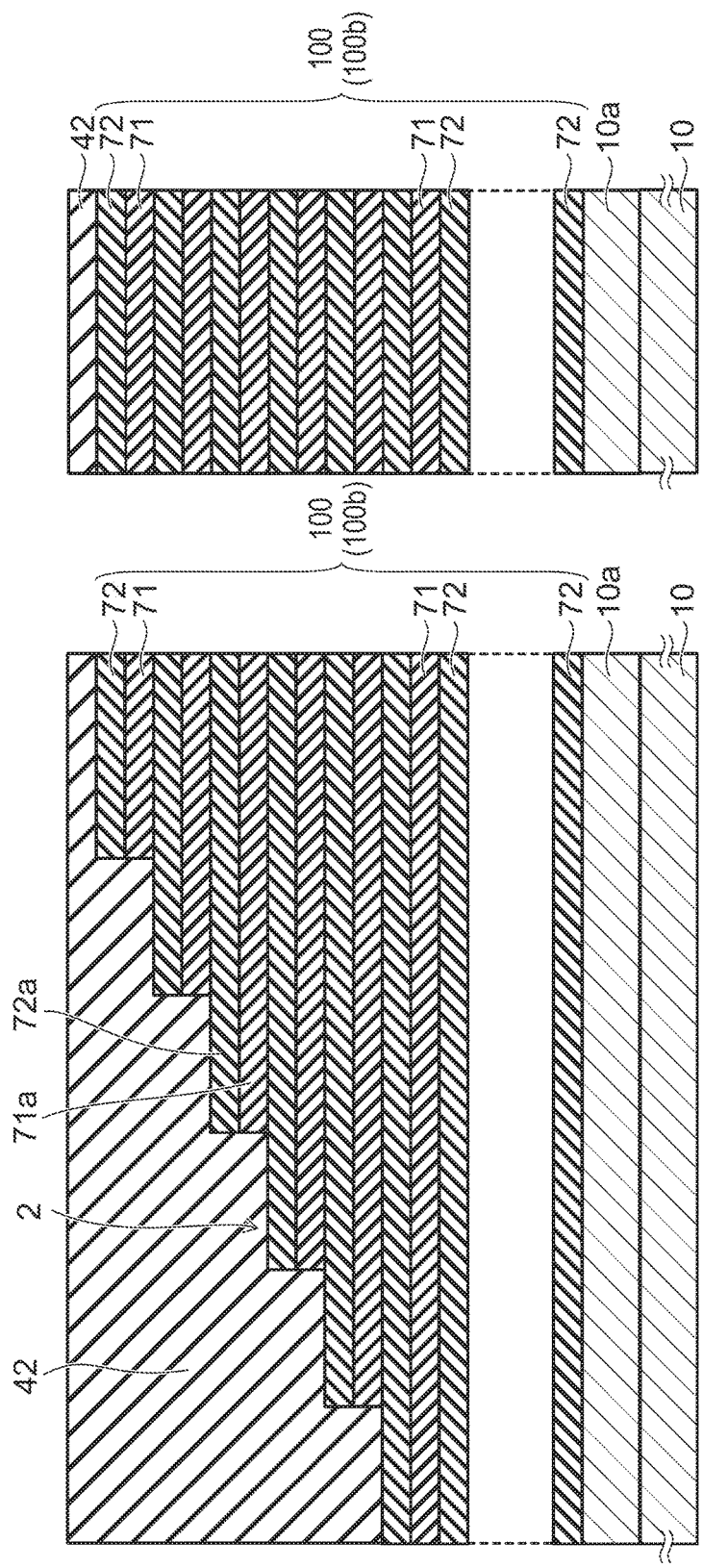

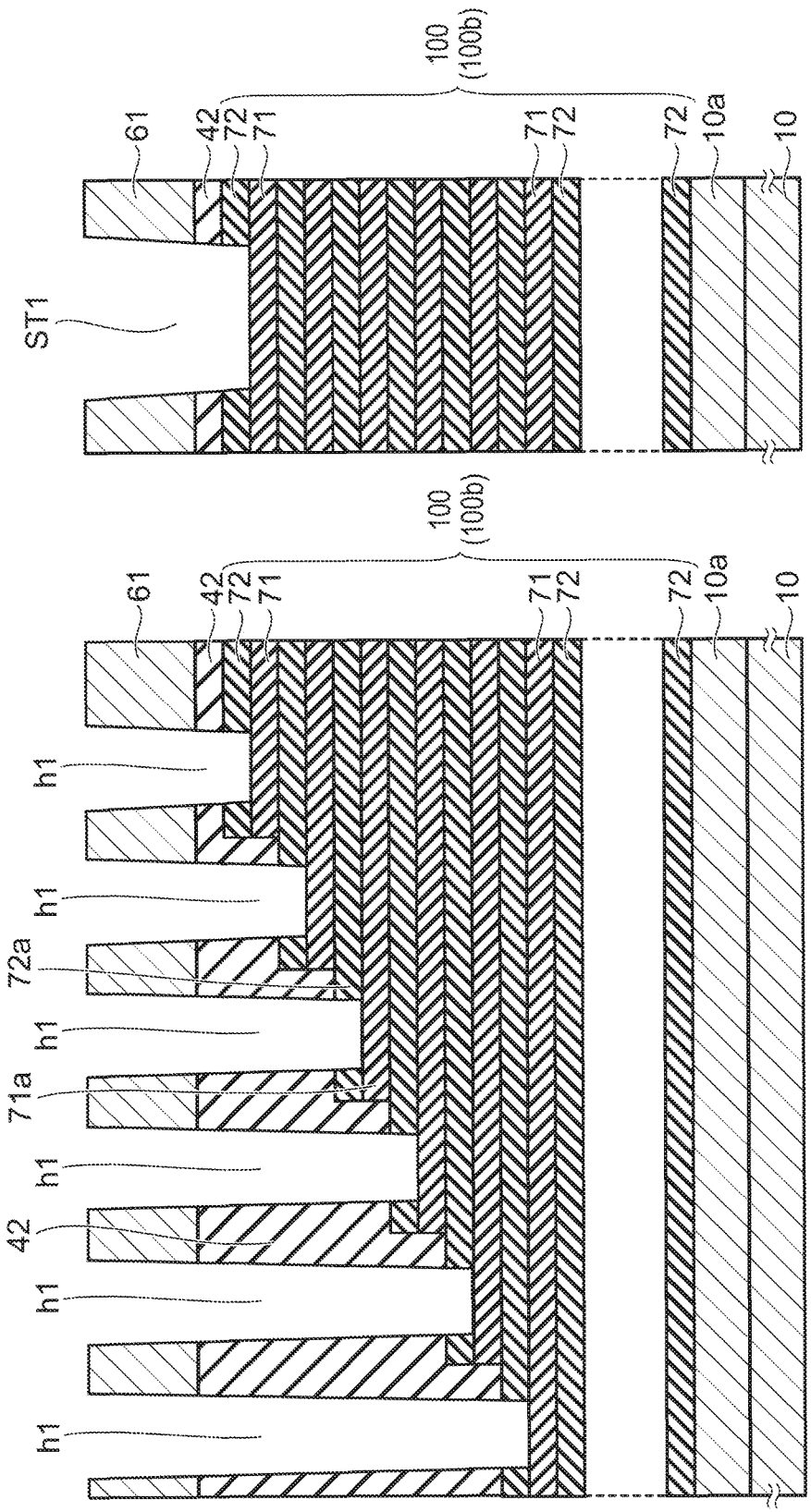

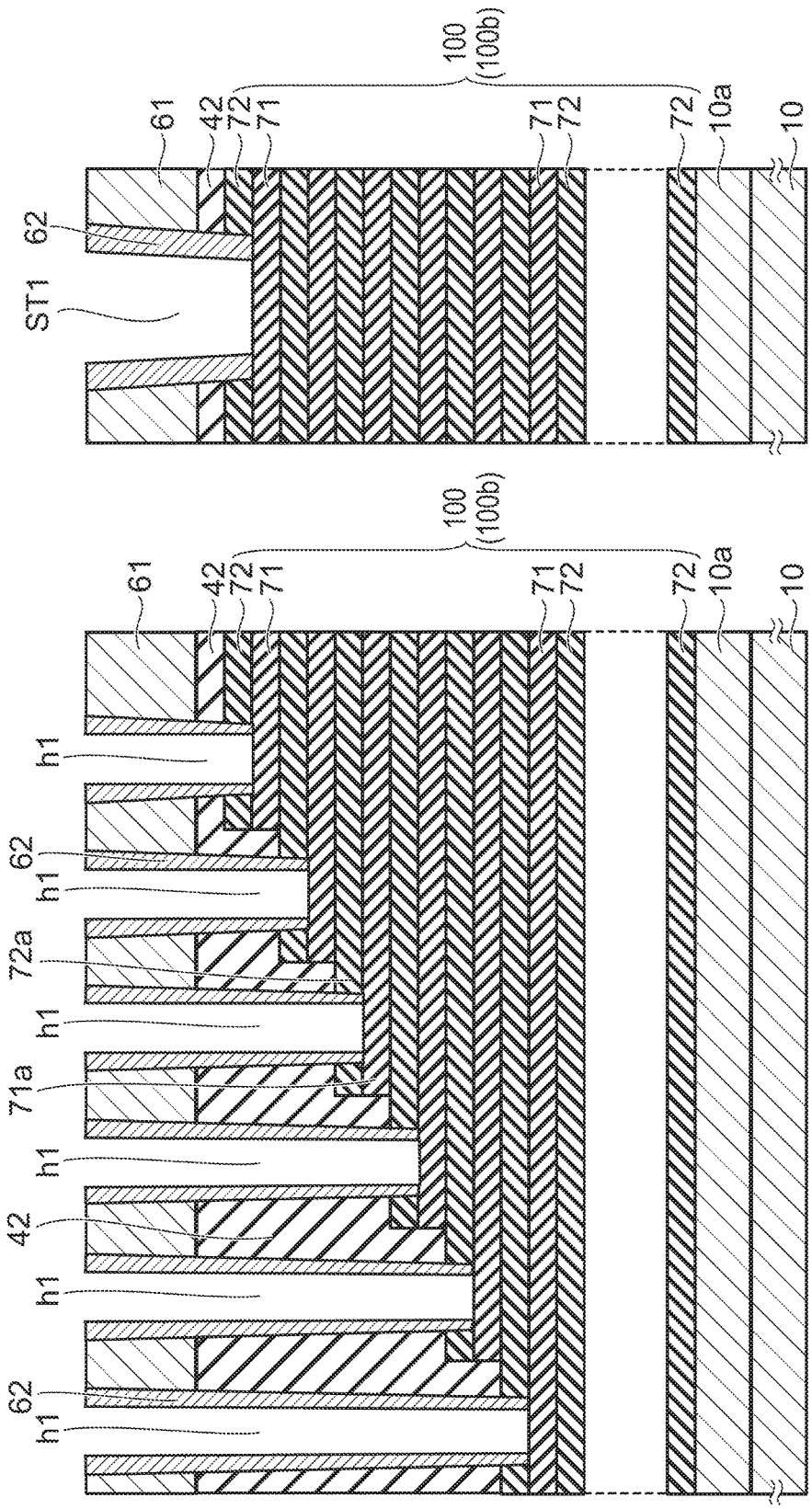

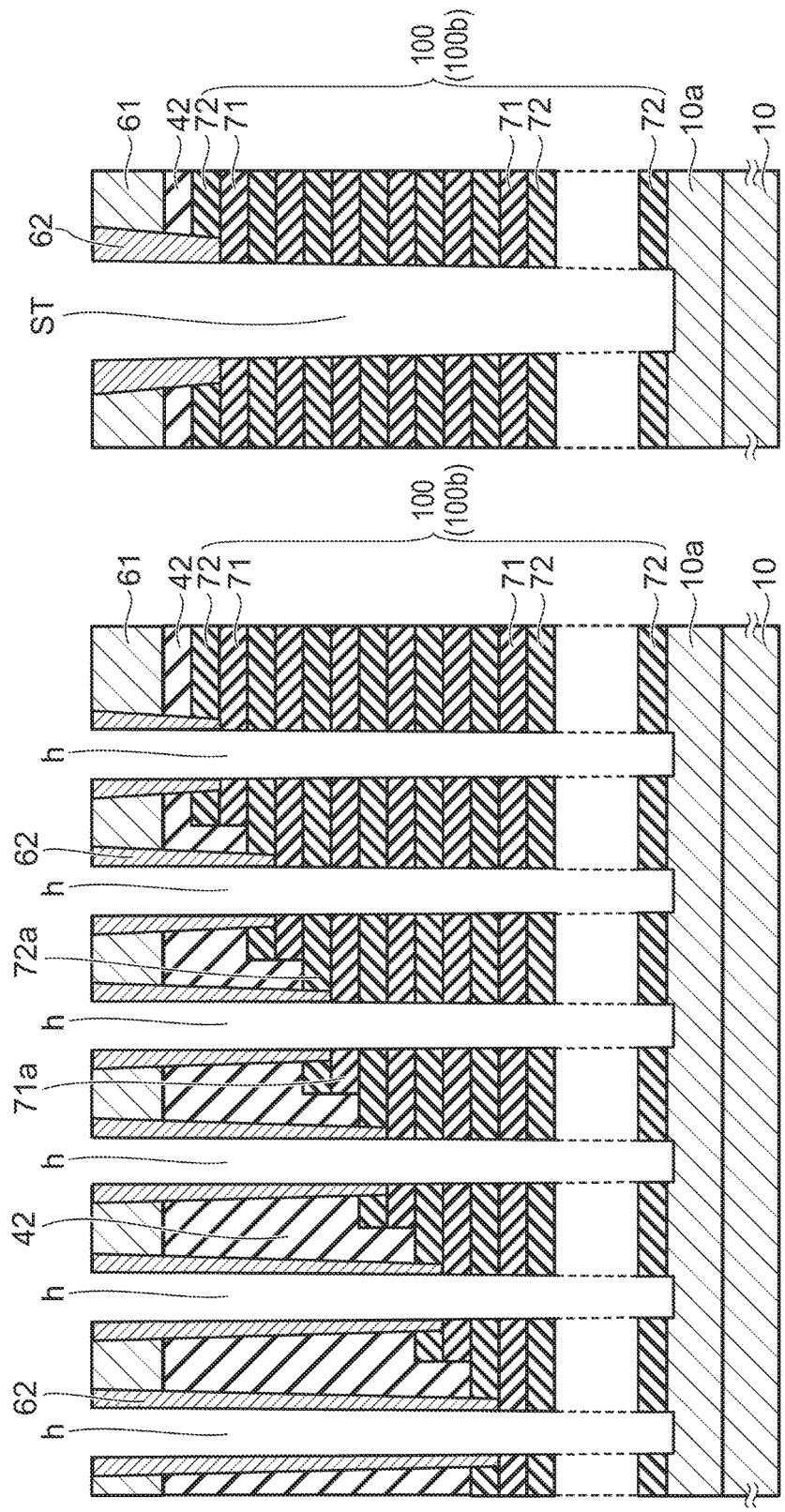

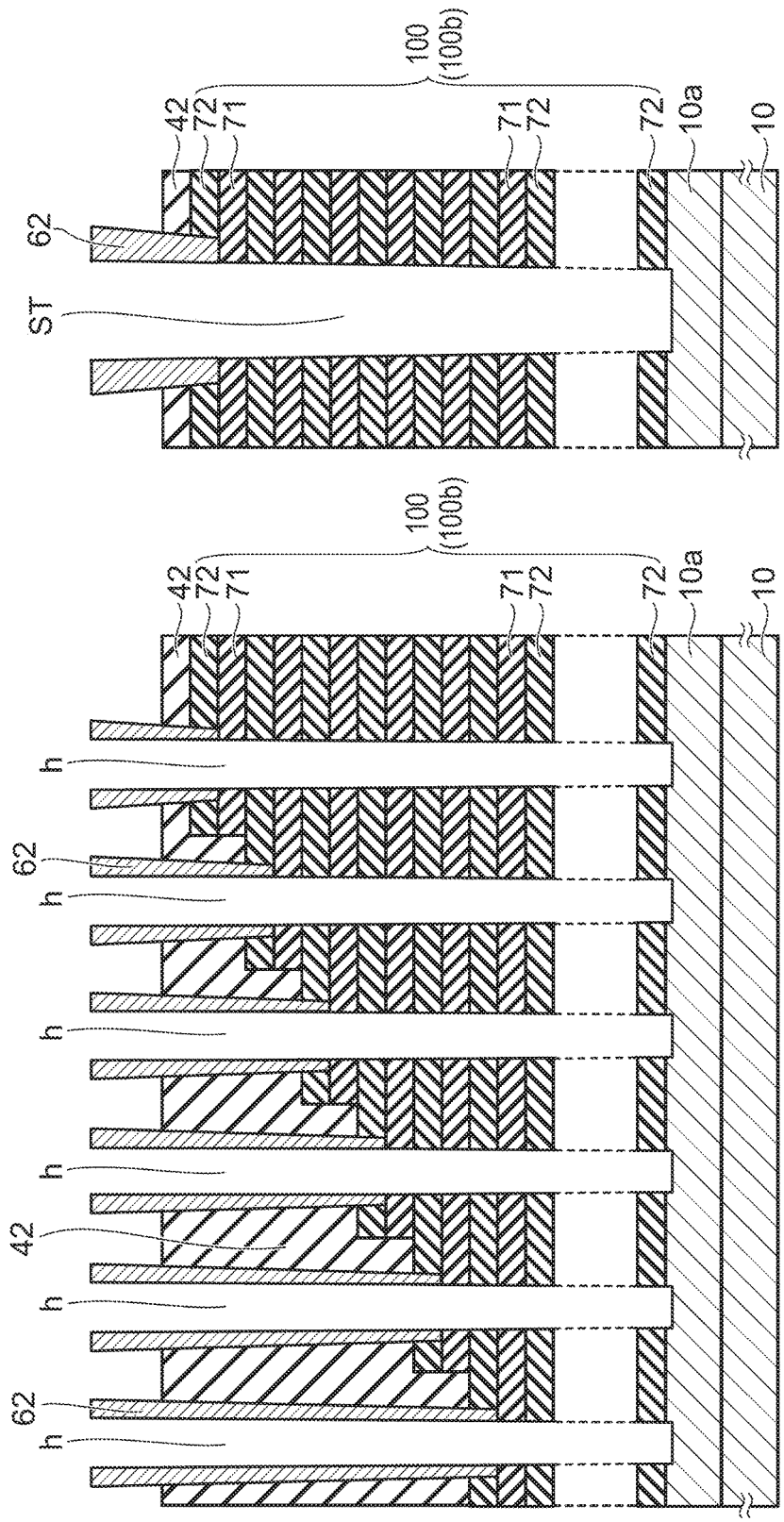

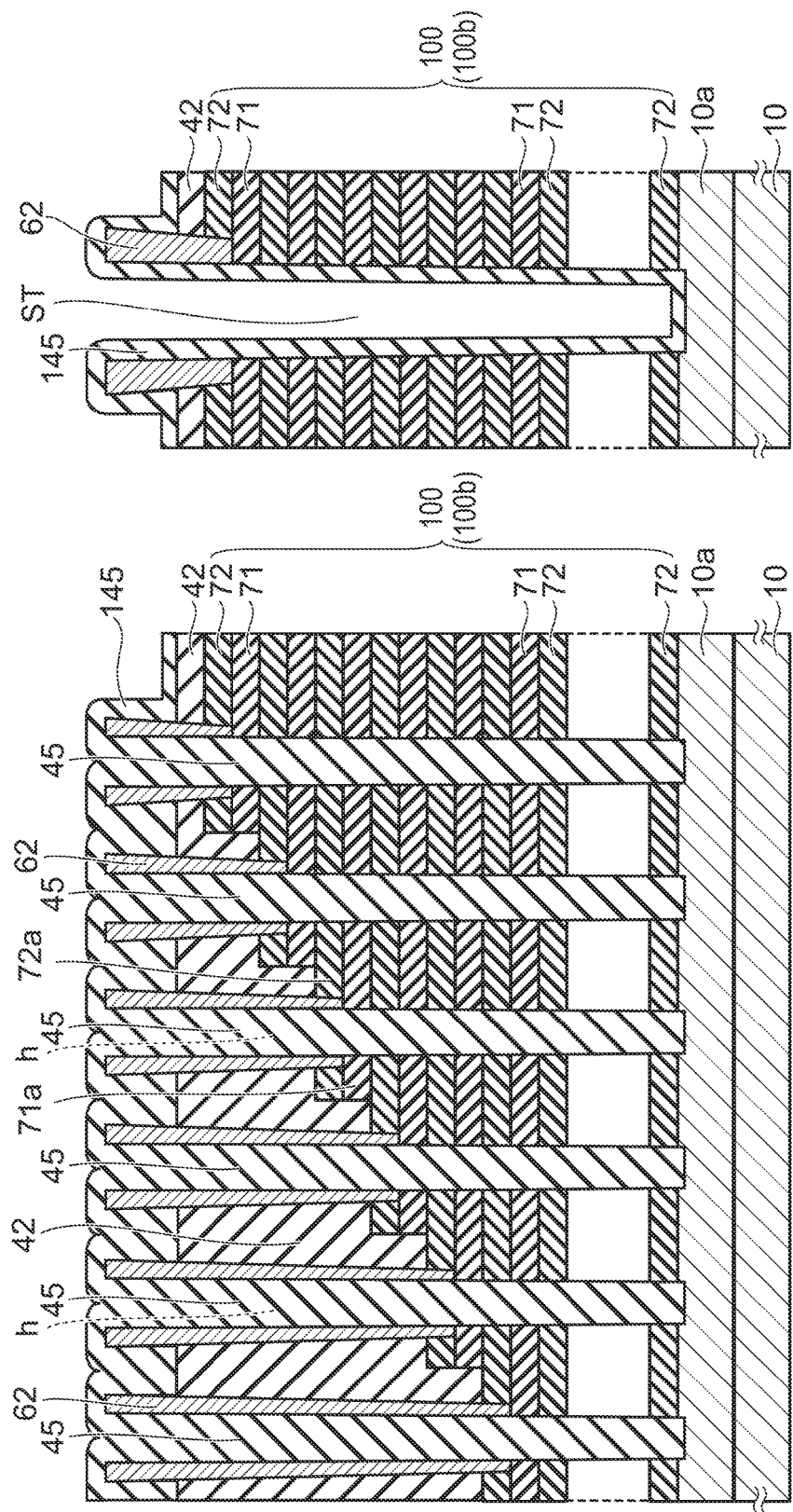

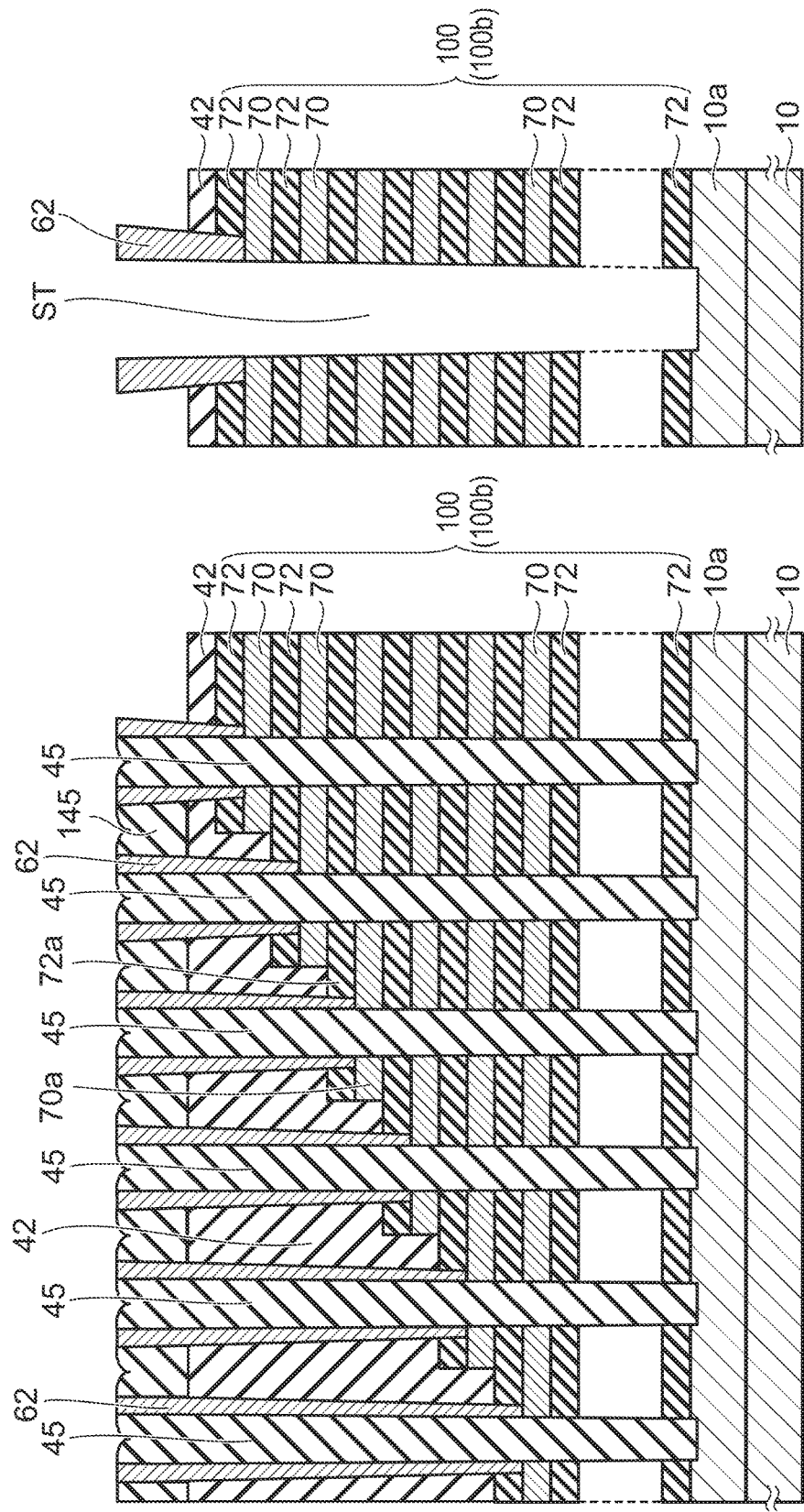

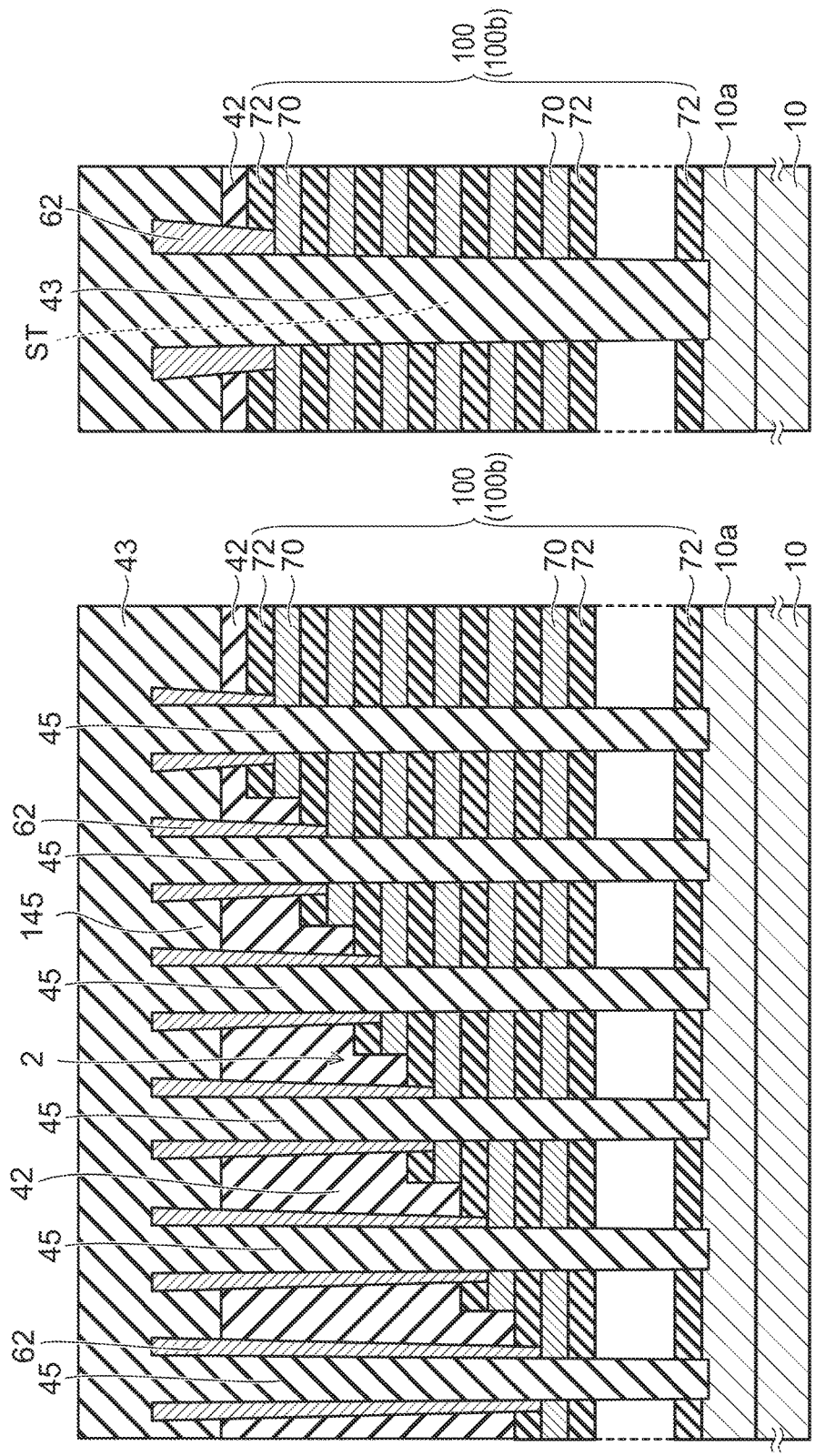

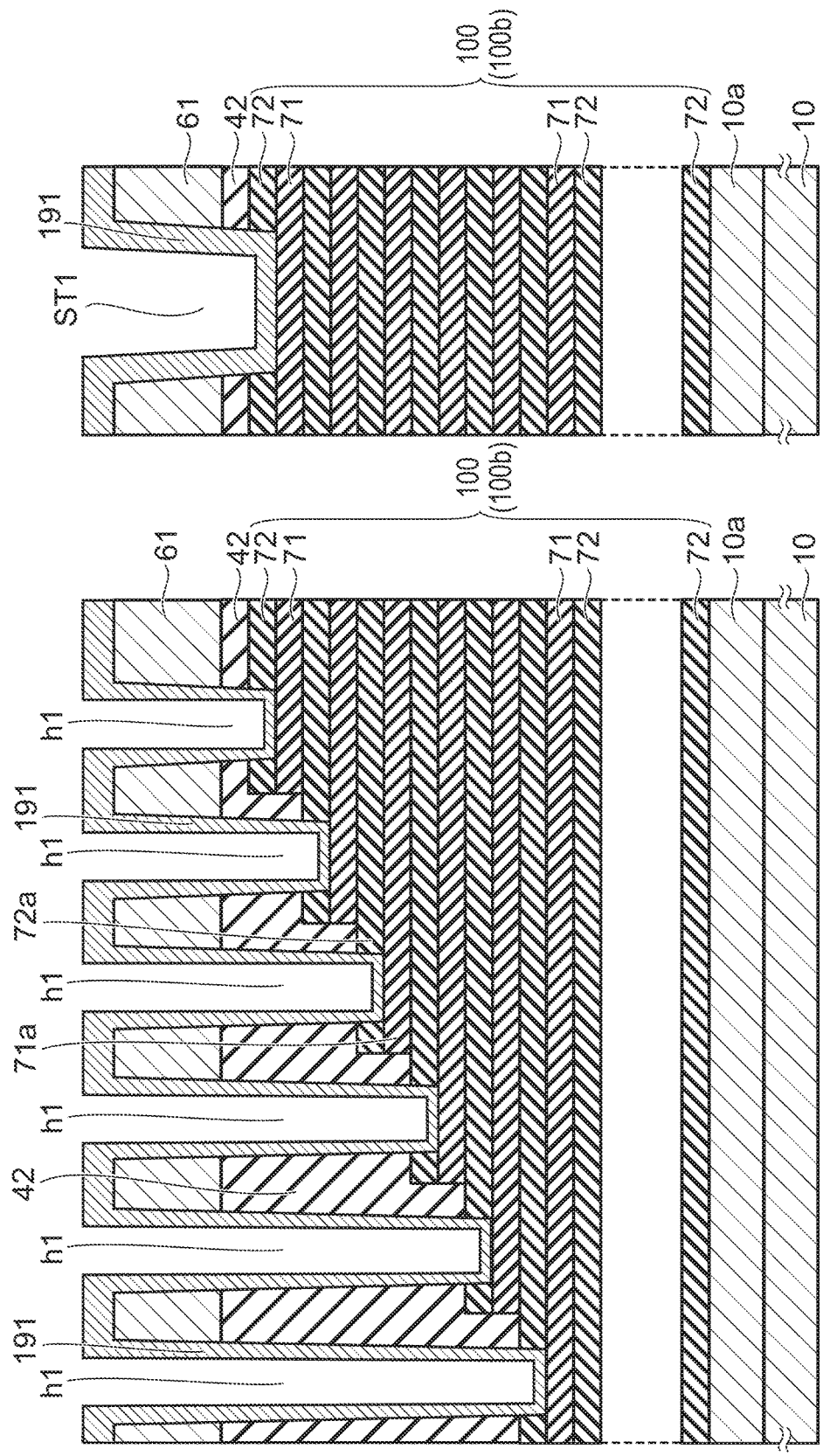

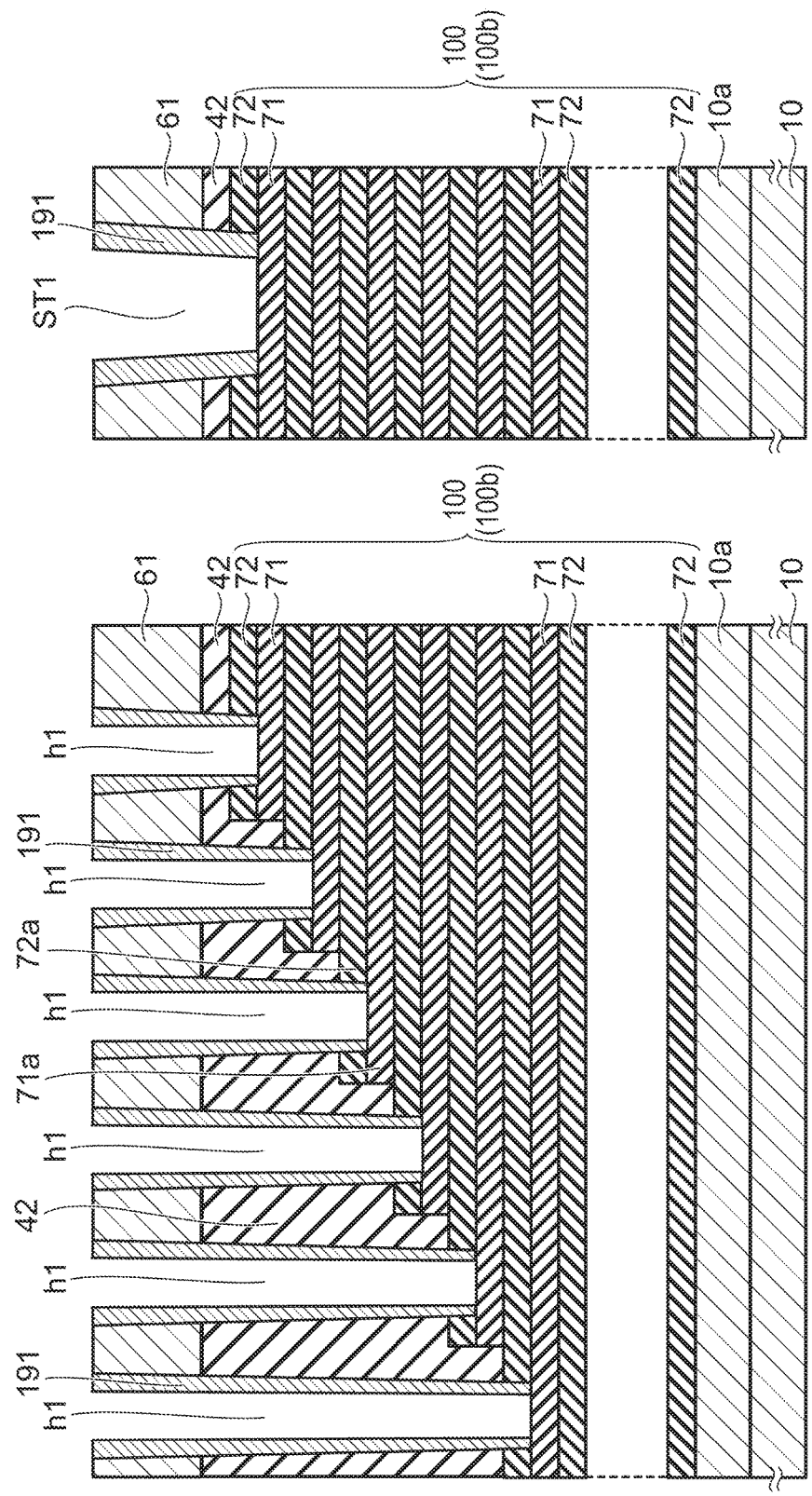

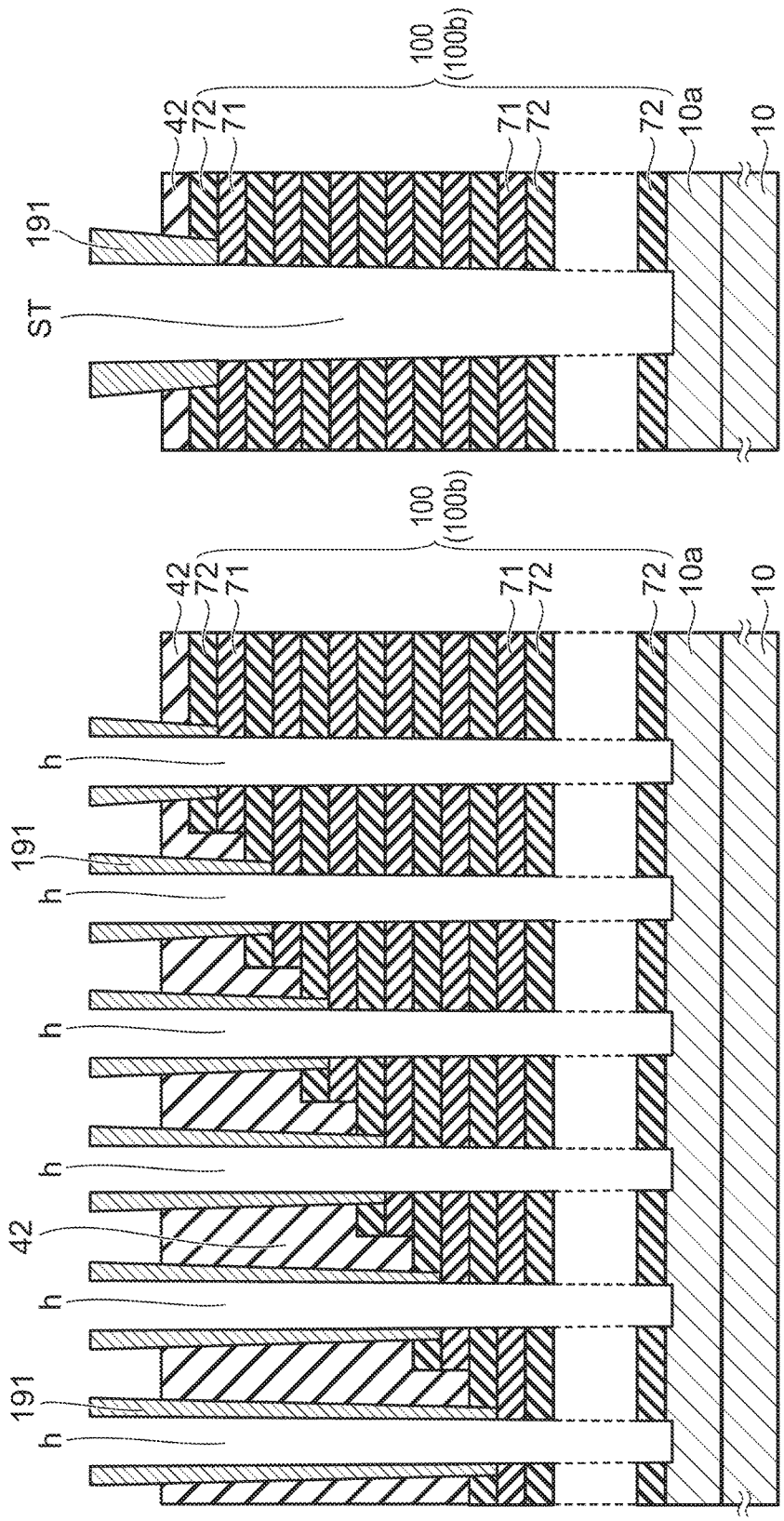

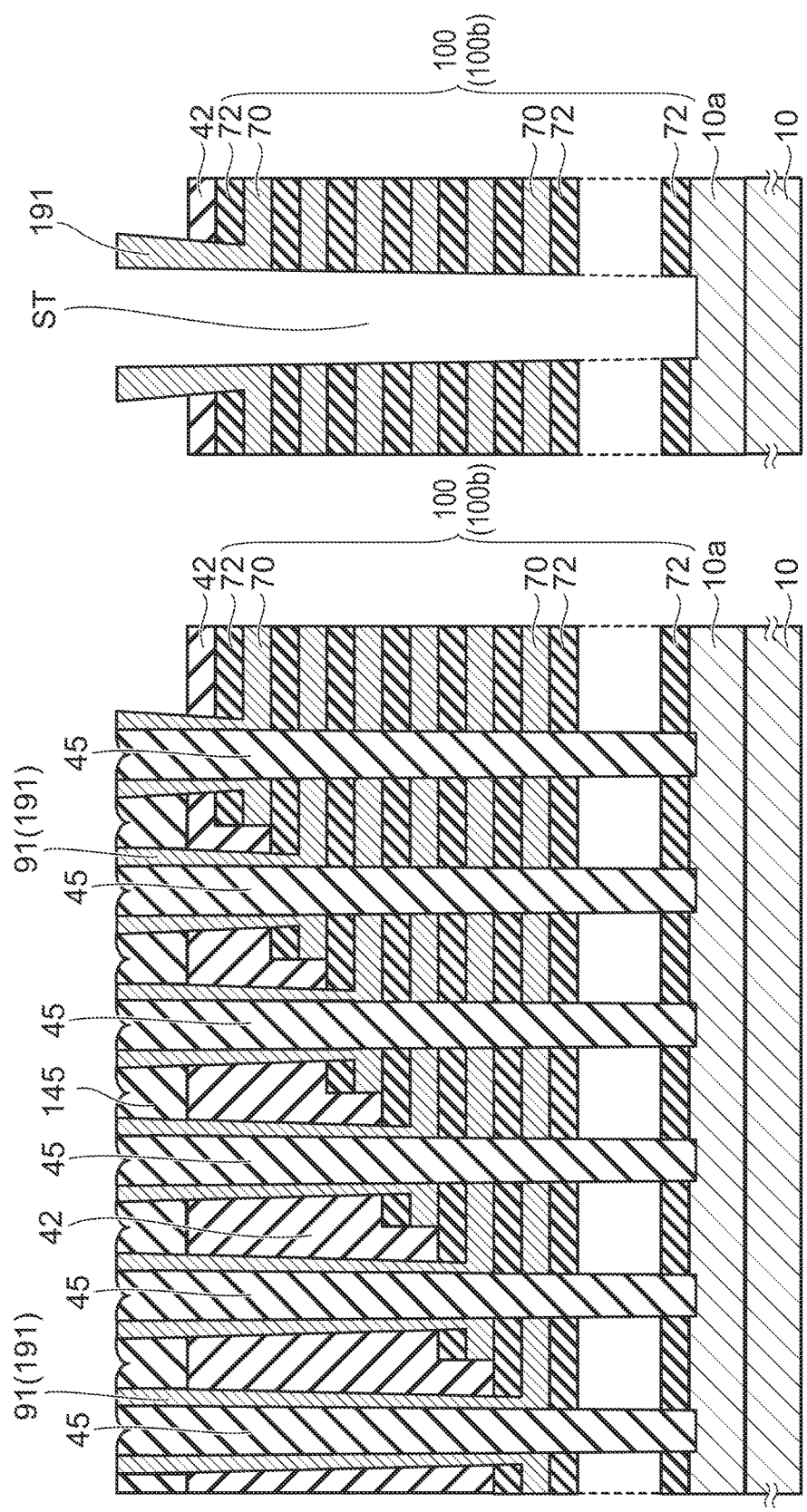

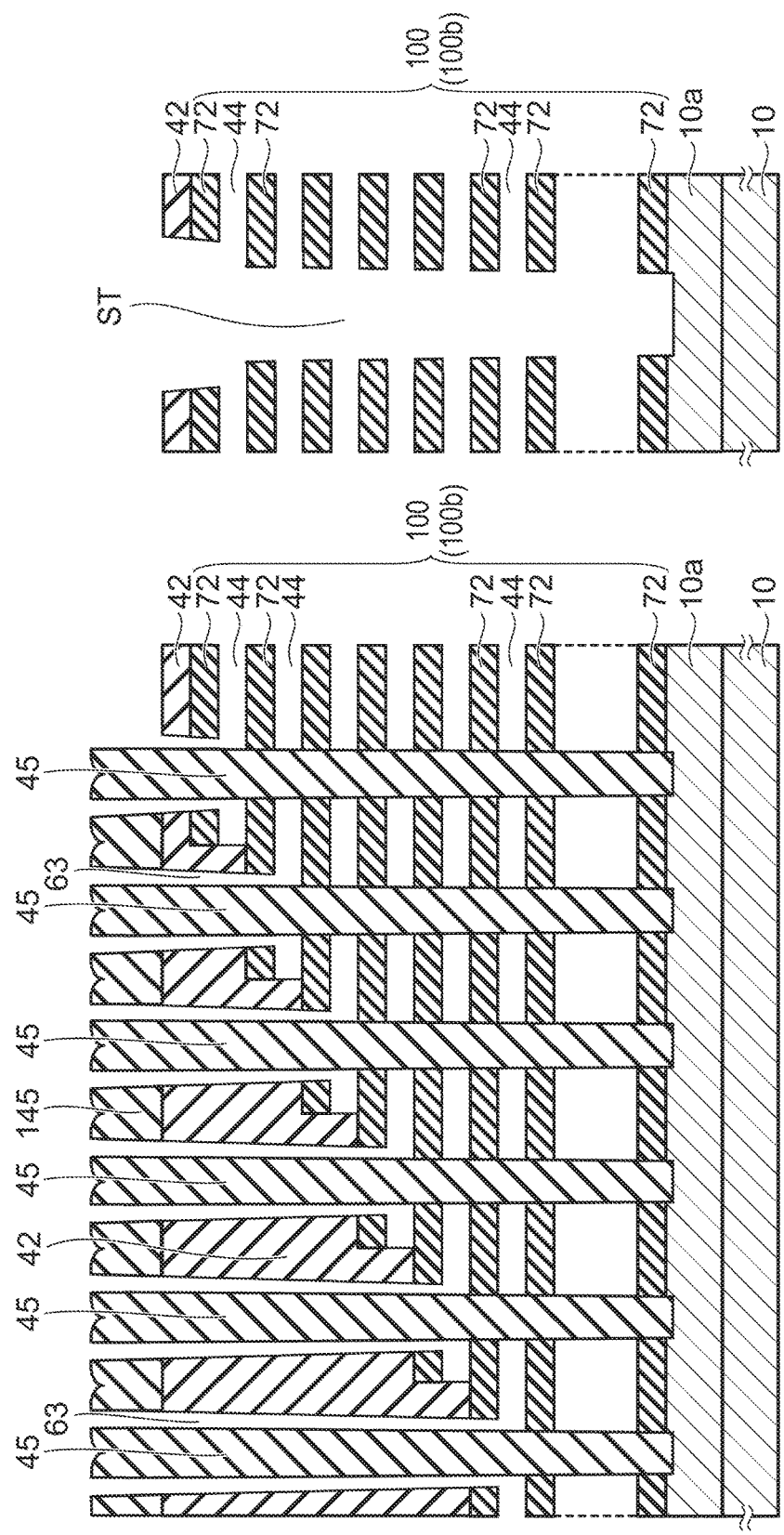

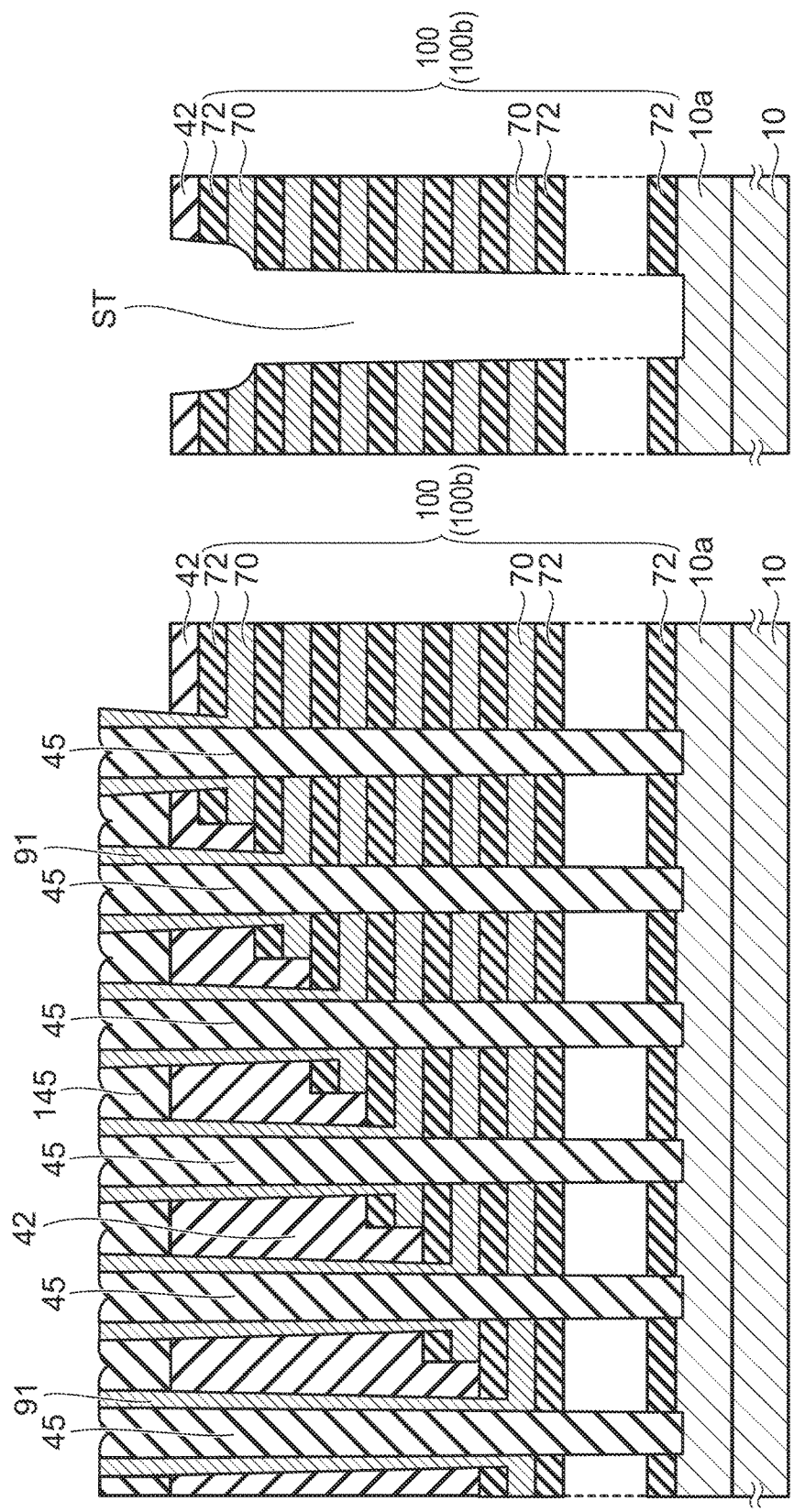

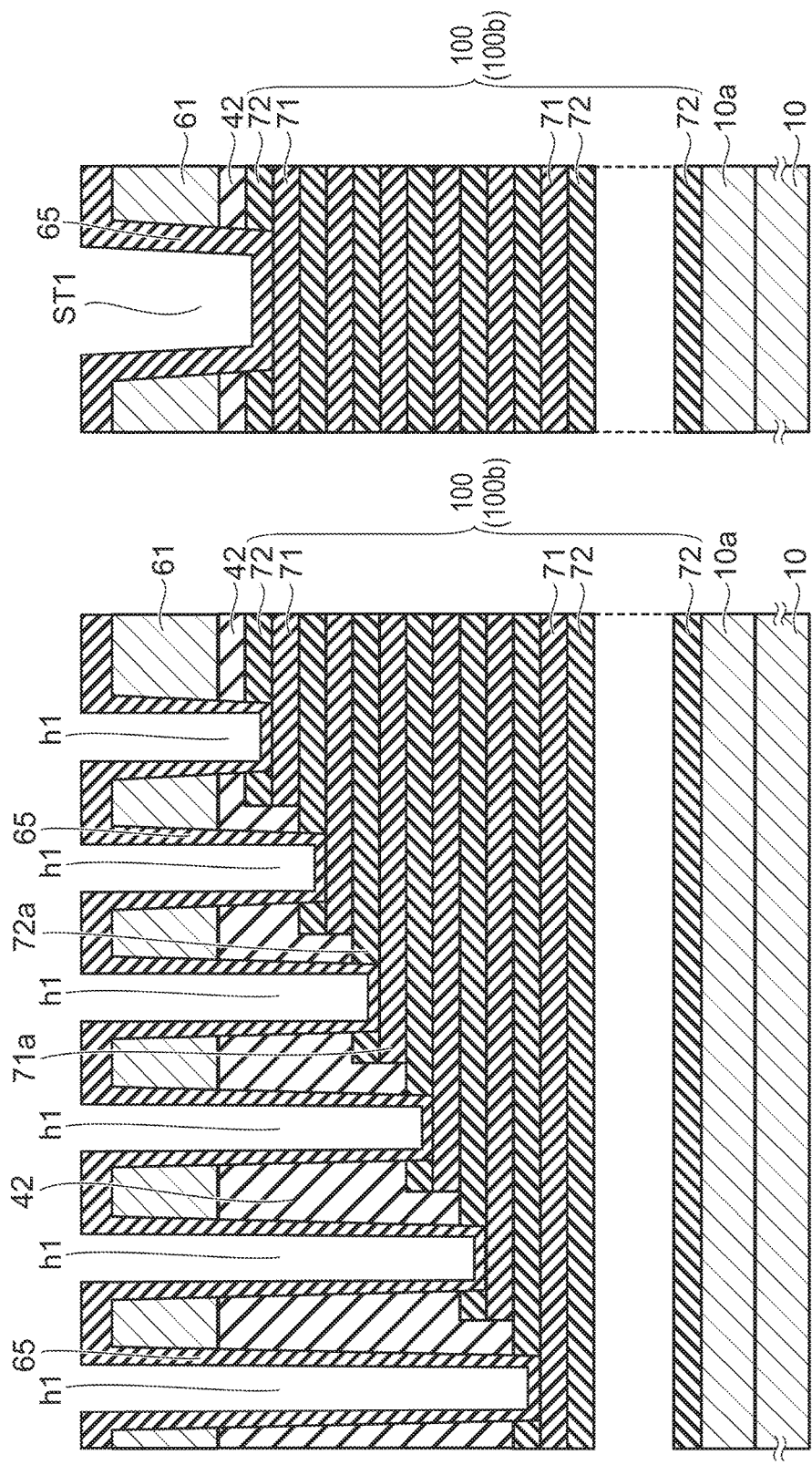

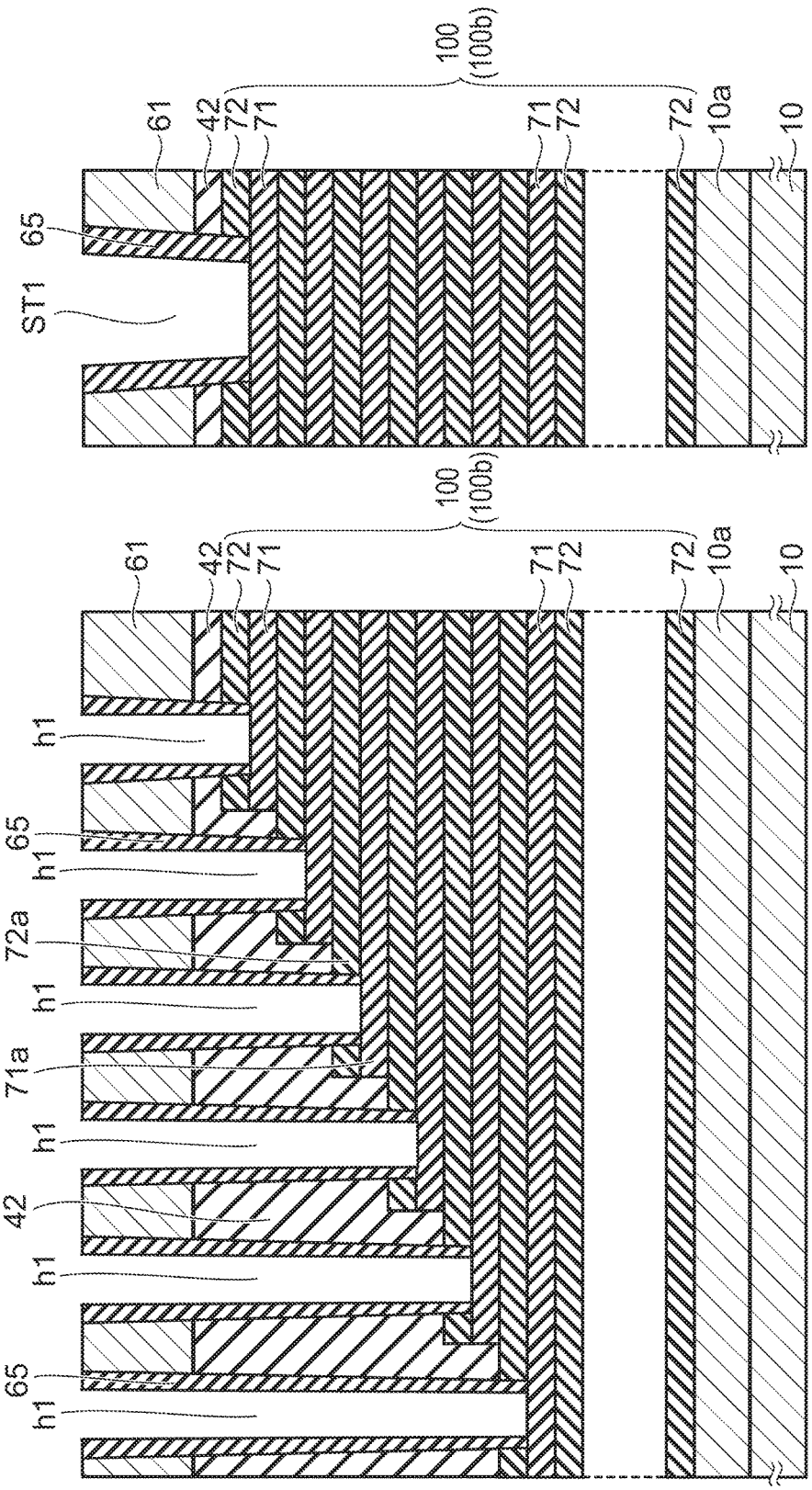

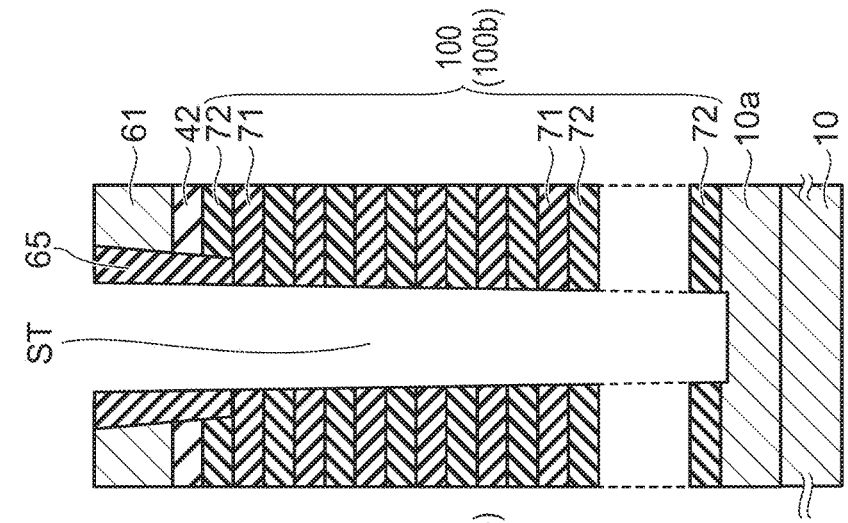
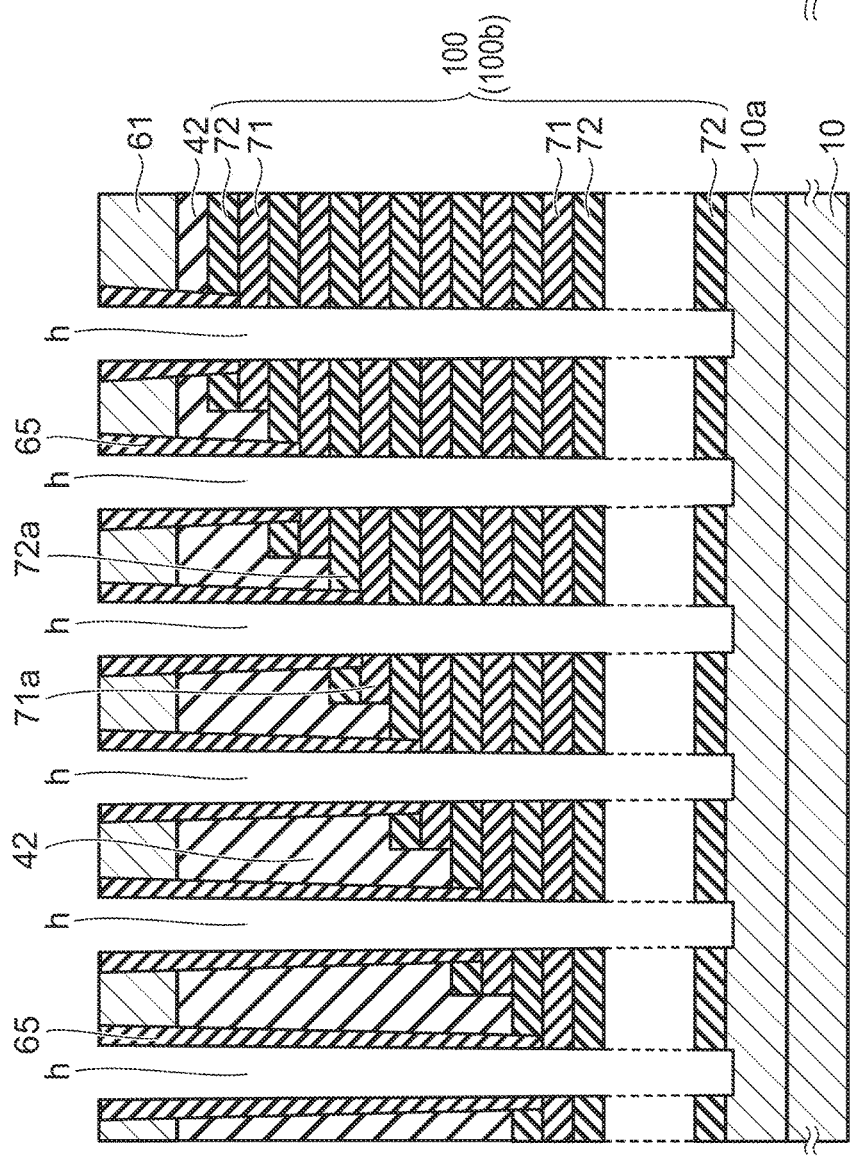
FIG. 59B
FIG. 59A

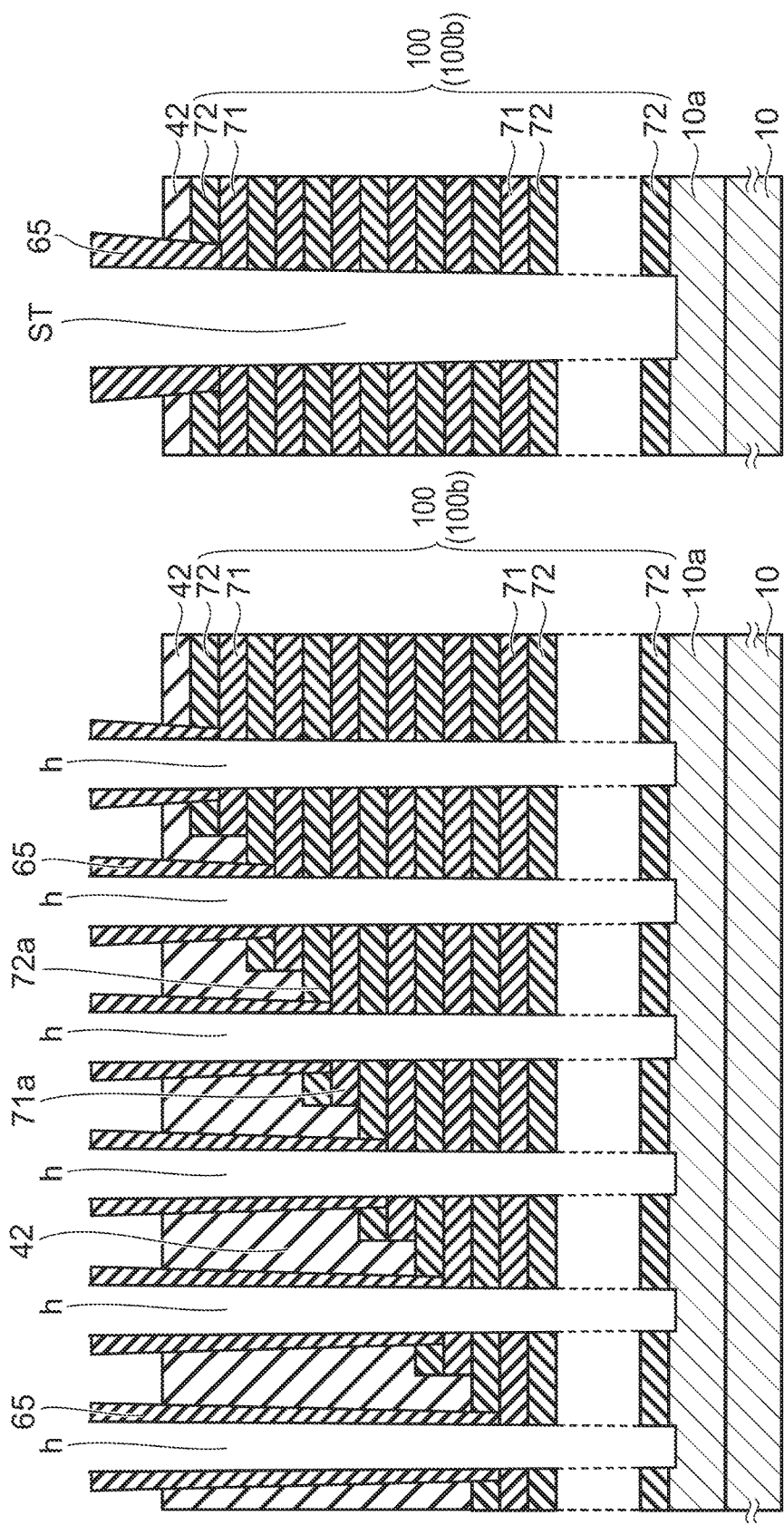

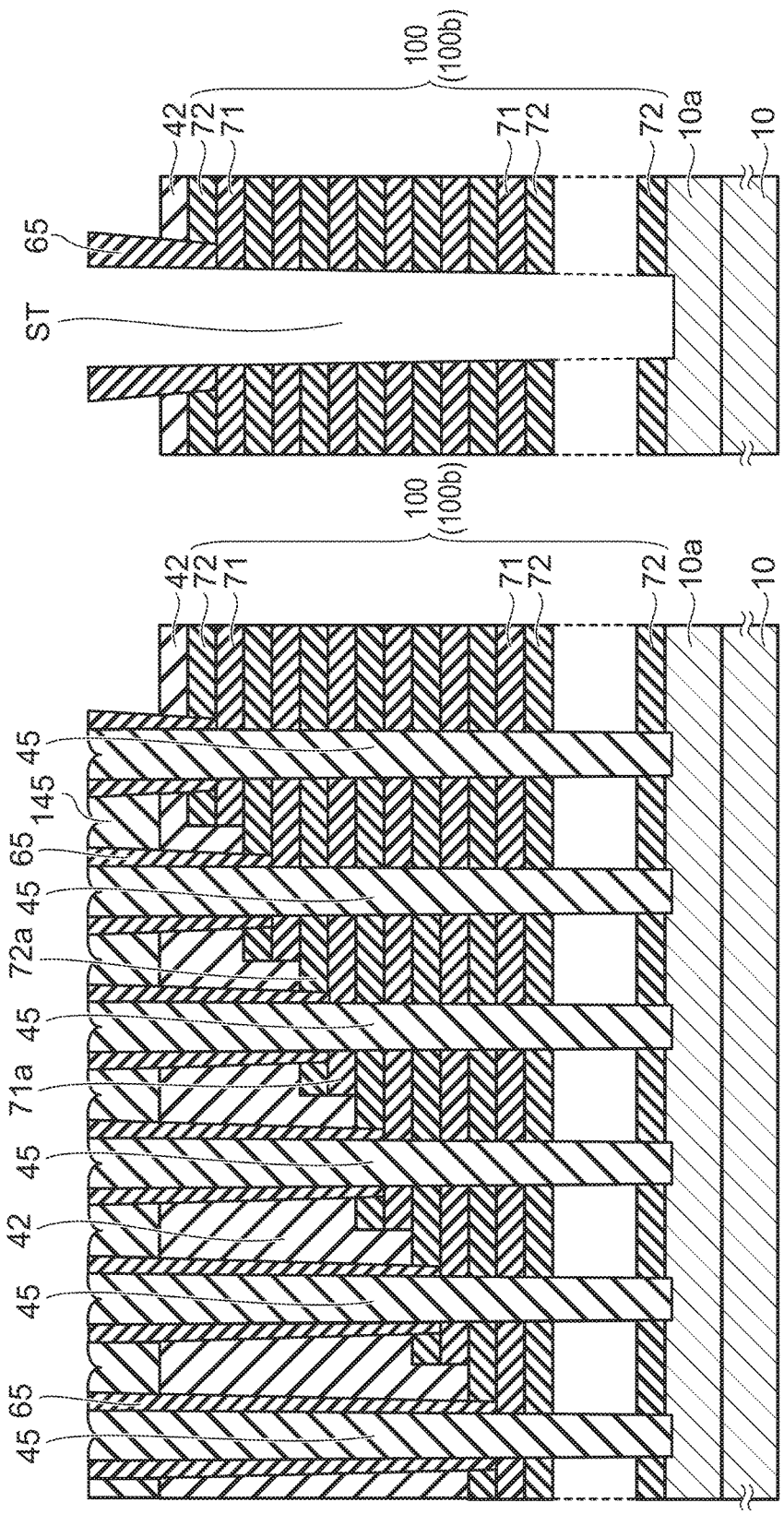

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/322,945, filed on Apr. 15, 2016; the entire contents of which are incorporated herein by reference.

FIELD

Embodiments described herein relate generally to a semiconductor device and a method for manufacturing a semiconductor device.

BACKGROUND

To connect multiple electrode layers of a three-dimensional memory device to a control circuit, a stairstep-shaped contact structure of the multiple electrode layers has been proposed. Also, a method for the three-dimensional memory device has been proposed in which a stacked body including multiple sacrificial layers is formed; and subsequently, gaps are formed by removing the sacrificial layers. The stacked body including the gaps is supported by columnar portions formed in the stacked body prior to removing the sacrificial layers.

BRIEF DESCRIPTION OF THE DRAWINGS

FIGS. 21A to 24B are schematic cross-sectional views showing a method for manufacturing the semiconductor device of the embodiment;

FIGS. 28A to 29B are schematic cross-sectional views showing a method for manufacturing the semiconductor device of the embodiment;

FIGS. 31A to 32B are schematic cross-sectional views showing a method for manufacturing the semiconductor device of the embodiment;

FIGS. 34A to 37B are schematic cross-sectional views showing a method for manufacturing the semiconductor device of the embodiment;

FIGS. 39A to 62B are schematic cross-sectional views showing a method for manufacturing the semiconductor device of the embodiment;

DETAILED DESCRIPTION

According to one embodiment, a semiconductor device includes a foundation layer, a stacked body, an insulating layer, a plurality of columnar portions, and a plurality of contact portions. The stacked body is provided above the foundation layer. The stacked body includes a plurality of electrode layers stacked with an insulator interposed. The electrode layers have a plurality of terrace portions arranged in a stairstep configuration with a difference in levels. The insulating layer is provided above the terrace portions. The columnar portions extend in a stacking direction of the stacked body through the insulating layer and through the stacked body under the insulating layer. The columnar portions are insulative. The contact portions are provided at side surfaces of the columnar portions on the terrace portions. The contact portions are connected to the terrace portions.

For example, a semiconductor memory device including a memory cell array having a three-dimensional structure is described as a semiconductor device in an embodiment.

Figure 1:
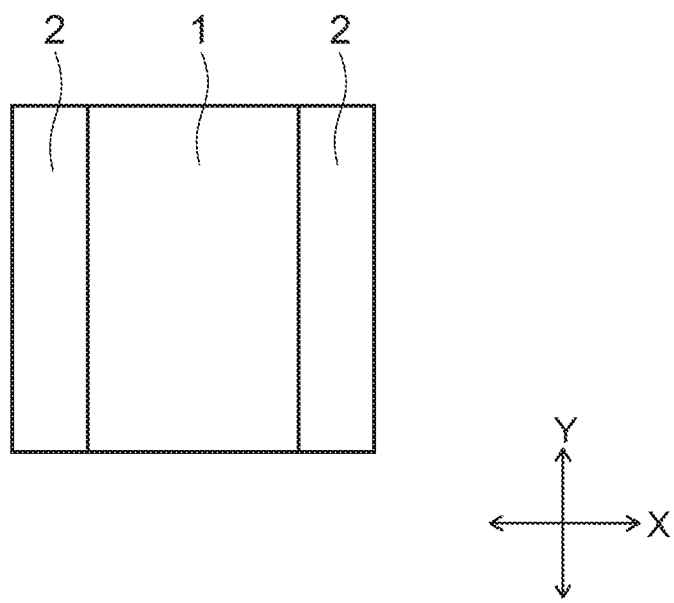
FIG. 1 is a schematic block plan view of a semiconductor device of an embodiment.

FIG. 1 is a schematic block plan view of the semiconductor device of the embodiment.

The semiconductor device of the embodiment includes a memory cell array 1, and a stairstep portion 2 that is provided in a peripheral region outside the memory cell array 1. The memory cell array 1 and the stairstep portion 2 are provided on the same substrate.

Figure 2:
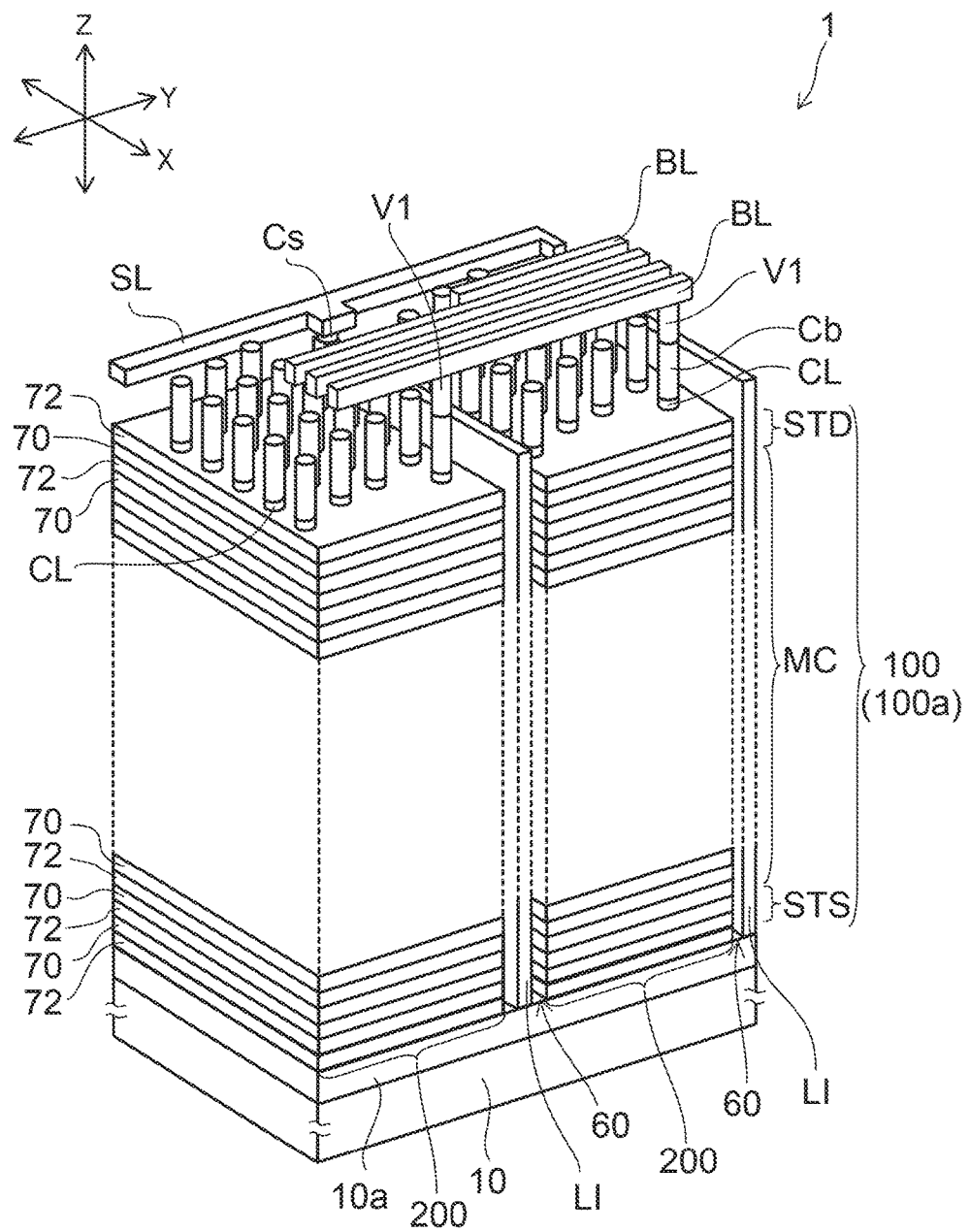
FIG. 2 is a schematic perspective view of a memory cell array of the semiconductor device of the embodiment.

FIG. 2 is a schematic perspective view of the memory cell array 1 of the embodiment.

Figure 3:
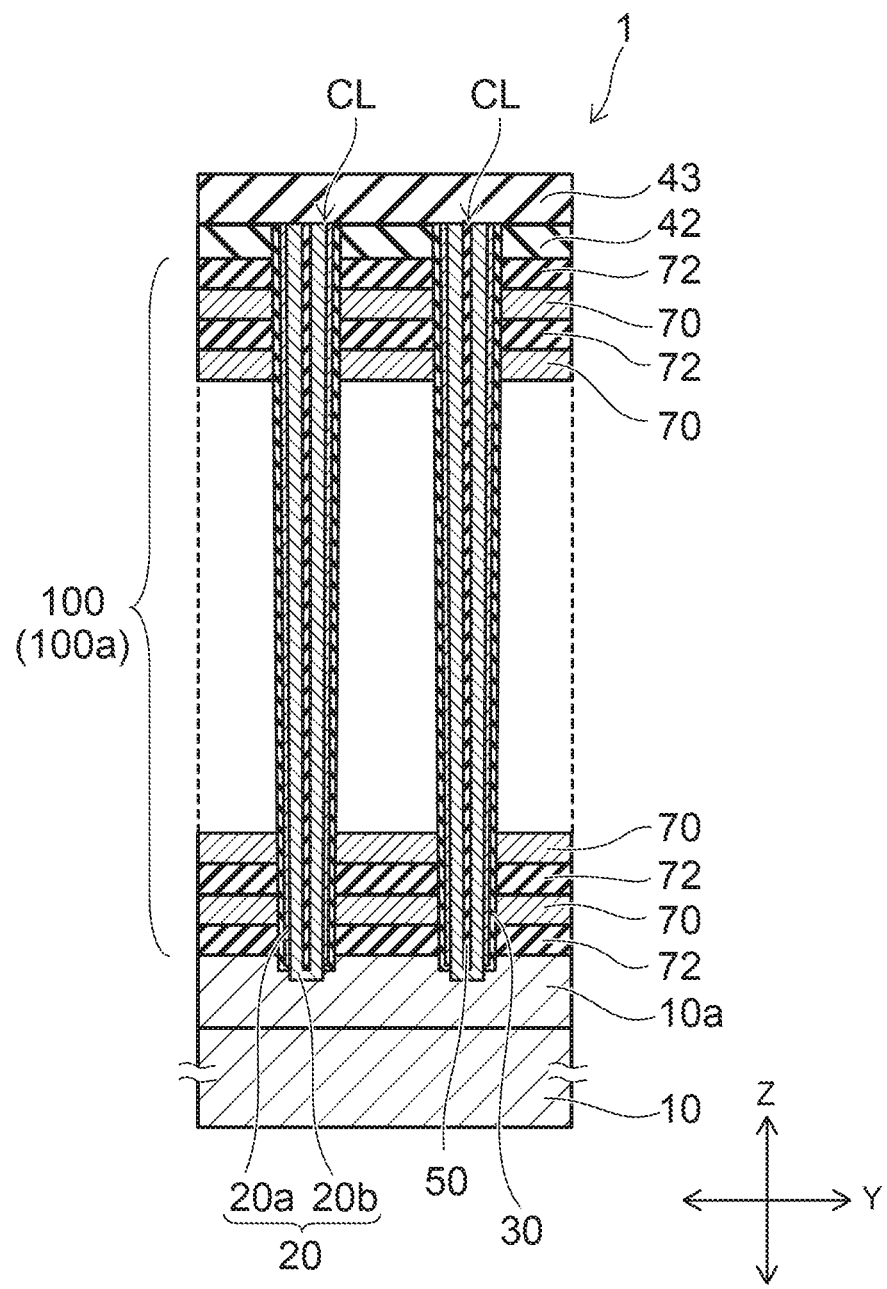
FIG. 3 is a schematic cross-sectional view of the memory cell array of the semiconductor device of the embodiment.

FIG. 3 is a schematic cross-sectional view of the memory cell array 1.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 2.

The memory cell array 1 includes a substrate 10, a stacked body 100 that is stacked on the substrate 10, multiple columnar portions CL, multiple separation portions 60, and upper layer interconnects provided above the stacked body 100. For example, bit lines BL and a source line SL are shown as the upper layer interconnects in FIG. 2.

The substrate 10 and the stacked body 100 are provided in a cell array region where the memory cell array 1 is provided, and in a stairstep region where the stairstep portion 2 is provided. The portion of the stacked body 100 provided in the cell array region is taken as a first stacked portion 100a; and the portion of the stacked body 100 provided in the stairstep region is taken as a second stacked portion 100b.

The multiple columnar portions CL are disposed in the cell array region. The columnar portions CL are formed in substantially circular columnar configurations extending through the first stacked portion 100a in the stacking direction of the first stacked portion 100a (the Z-direction).

The separation portions 60 spread in the X-direction and the stacking direction of the first stacked portion 100a (the Z-direction), and divide the first stacked portion 100a into multiple blocks (or finger portions) 200 in the Y-direction.

As shown in FIG. 2, for example, the columnar portions CL have a staggered arrangement. Or, the columnar portions CL may have a square lattice arrangement along the X-direction and the Y-direction.

The bit lines BL are provided above the first stacked portion 100a. The bit lines BL are, for example, metal films extending in the Y-direction. The bit lines BL are separated from each other in the X-direction.

The upper ends of semiconductor bodies 20 of the columnar portions CL described below are connected to the bit lines BL via contacts Cb and contacts V1 shown in FIG. 2.

The columnar portions CL are connected to one common bit line BL. The columnar portions CL that are connected to the common bit line BL include one columnar portion CL selected from each block 200 divided in the Y-direction by the separation portions 60.

As shown in FIG. 3, the first stacked portion 100a includes multiple electrode layers 70 stacked on the substrate 10. The electrode layers 70 are stacked, with insulating layers 72 interposed, in a direction (the Z-direction) perpendicular to a major surface of the substrate 10. The electrode layers 70 are metal layers, e.g., tungsten layers or molybdenum layers.

The substrate 10 is, for example, a silicon substrate; and an active region 10a is provided as a semiconductive foundation layer on the front surface side of the substrate 10. The active region 10a is, for example, a P-type silicon region.

The lowermost insulating layer 72 is provided on the front surface of the active region 10a. An insulating layer 42 is provided on the uppermost insulating layer 72; and an insulating layer 43 is provided on the insulating layer 42. The insulating layer 43 covers the upper ends of the columnar portions CL.

Figure 4A:
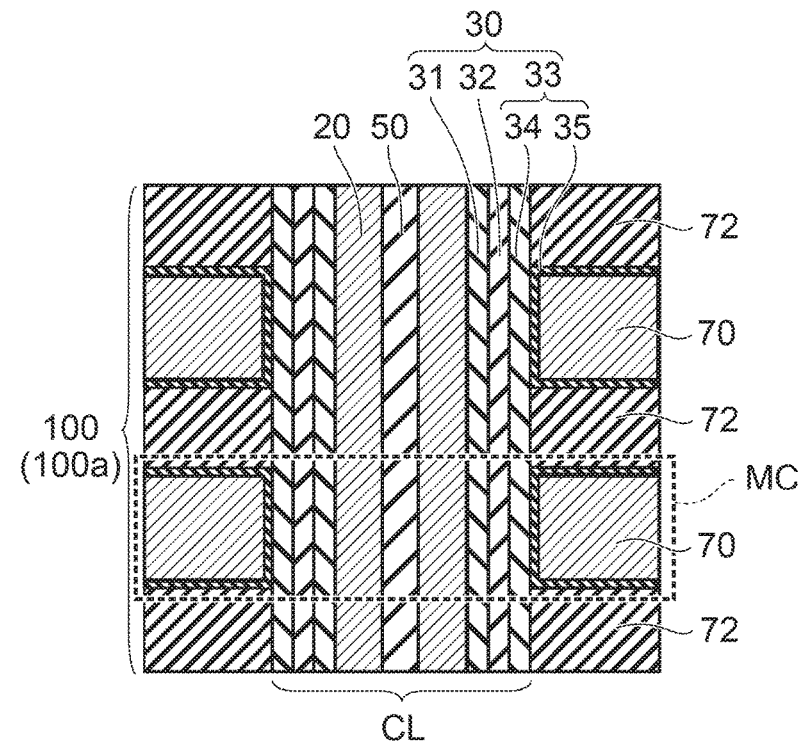
FIGS. 4A and 4B are enlarged cross-sectional views of one portion of FIG. 3.

FIG. 4A is an enlarged cross-sectional view of one portion of FIG. 3.

The columnar portion CL includes a stacked film (a memory film) 30, the semiconductor body 20, and an insulative core film 50.

The semiconductor body 20 extends to be continuous in a pipe-like configuration through the first stacked portion 100a in the stacking direction (the Z-direction). The stacked film 30 is provided between the semiconductor body 20 and the electrode layers 70, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contact Cb and the contact V1 shown in FIG. 2.

As shown in FIG. 4A, the stacked film 30 includes a tunneling insulating film 31, a charge storage film (a charge storage portion) 32, and a blocking insulating film 33. The tunneling insulating film 31, the charge storage film 32, and the blocking insulating film 33 are provided in order from the semiconductor body 20 side between the semiconductor body 20 and the electrode layers 70. The charge storage film 32 is provided between the tunneling insulating film 31 and the blocking insulating film 33.

The semiconductor body 20, the stacked film 30, and the electrode layer 70 are included in a memory cell MC. One memory cell MC is schematically illustrated by the broken line in FIG. 4A. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes a first blocking film 34 and a second blocking film 35. The first blocking film 34 is, for example, a silicon oxide film. The second blocking film 35 is a metal oxide film having a higher dielectric constant than that of the silicon oxide film. For example, an aluminum oxide film, a zirconium oxide film, or a hafnium oxide film may be examples of the metal oxide film.

The first blocking film 34 is provided between the charge storage film 32 and the second blocking film 35. The second blocking film 35 is provided between the first blocking film 34 and the electrode layer 70.

The second blocking film 35 is provided also between the electrode layer 70 and the insulating layer 72. The second blocking film 35 is formed to be continuous along the upper surface of the electrode layer 70, the lower surface of the electrode layer 70, and the side surface of the electrode layer 70 on the stacked film 30 side. The second blocking film 35 is not continuous in the stacking direction of the first stacked portion 100a and is divided.

Figure 4B:
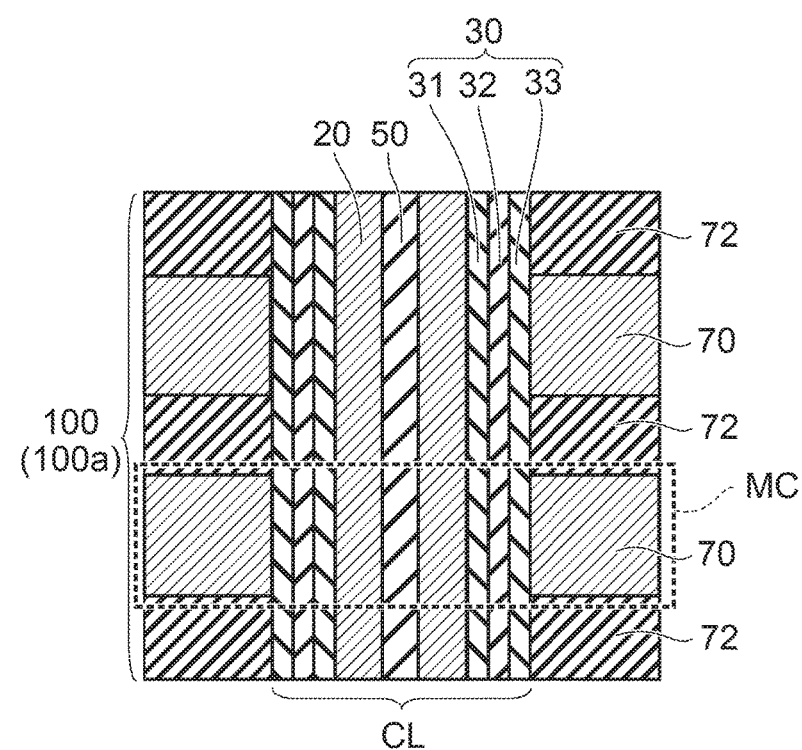

Or, the blocking insulating film 33 that includes the first blocking film 34 and the second blocking film 35 as shown in FIG. 4B may be formed to be continuous in the stacking direction of the first stacked portion 100a without forming the second blocking film 35 between the electrode layer 70 and the insulating layer 72. The blocking insulating film 33 shown in FIG. 4B may be a single-layer film or a stacked film.

A metal nitride film may be formed between the second blocking film 35 and the electrode layer 70 of the memory cell MC shown in FIG. 4A, or between the insulating layer 72 and the electrode layer 70 of the memory cell MC shown in FIG. 4B. The metal nitride film is, for example, a titanium nitride film and can function as a barrier metal, an adhesion layer, or a seed metal of the electrode layer 70.

As shown in FIG. 2, a drain-side selection transistor STD is provided at the upper layer portion of the first stacked portion 100a (the upper end portion of the columnar portion CL). A source-side selection transistor STS is provided at the lower layer portion of the first stacked portion 100a (the lower end portion of the columnar portion CL). At least the uppermost electrode layer 70 functions as a control gate of the drain-side selection transistor STD. At least the lowermost electrode layer 70 functions as a control gate of the source-side selection transistor STS.

The multiple memory cells MC are provided between the drain-side selection transistor STD and the source-side selection transistor STS. The memory cells MC, the drain-side selection transistor STD, and the source-side selection transistor STS are connected in series via the semiconductor body 20 of the columnar portion CL, and are included in one memory string. For example, the memory strings have a staggered arrangement in a planar direction parallel to the XY plane; and the memory cells MC are provided three-dimensionally in the X-direction, the Y-direction, and the Z-direction.

The structure of the stairstep region where the stairstep portion 2 is provided will now be described.

Figure 5:
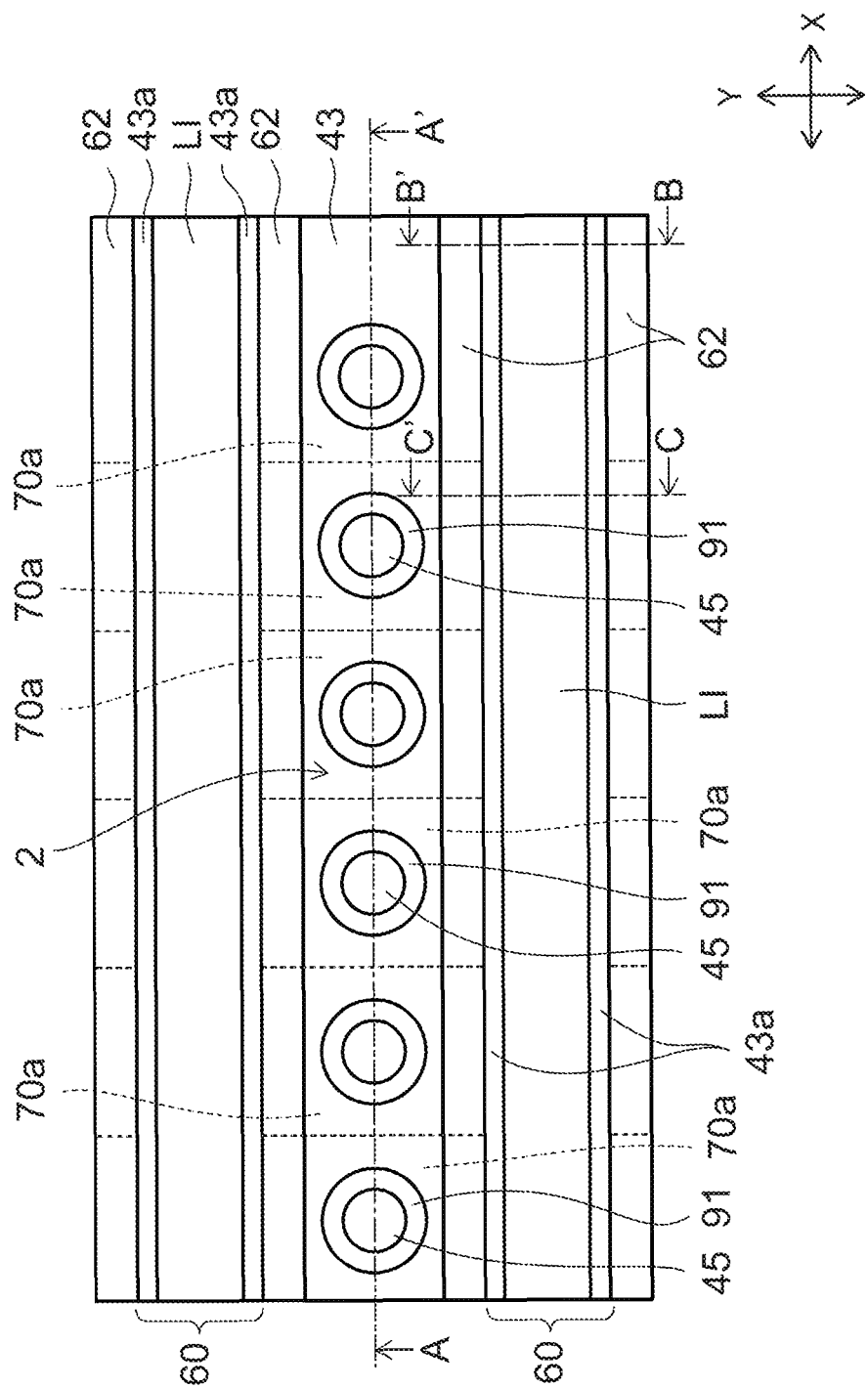
FIG. 5 is a schematic plan view of a stairstep portion of the semiconductor device of the embodiment.

FIG. 5 is a schematic plan view of the stairstep region.

The stacked body 100 and the separation portions 60 extend in the X-direction from the cell array region to the stairstep region. The separation portions 60 divide the second stacked portion 100b of the stairstep region into multiple blocks in the Y-direction.

Figure 6:
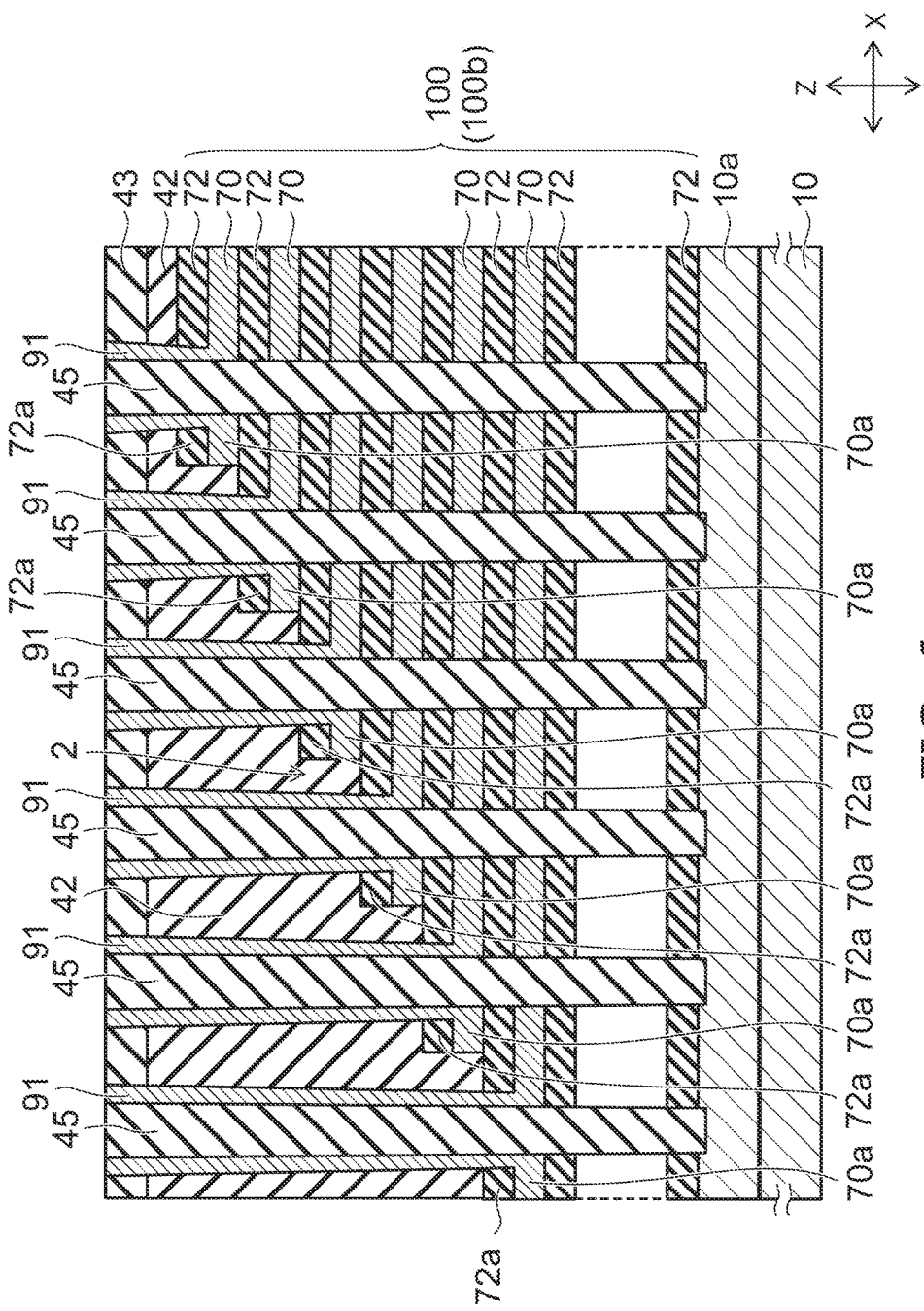
FIG. 6 is an A-A' cross-sectional view of FIG. 5.

FIG. 6 is an A-A' cross-sectional view of FIG. 5.

The electrode layers 70 of the second stacked portion 100b have multiple terrace portions 70a arranged in a stairstep configuration with differences in levels along the X-direction. The stairstep portion 2 is formed of the multiple terrace portions 70a. Another upper electrode layer 70 above the arbitrary layer having the terrace portion 70a does not overlap the terrace portions 70a.

One portion of the insulating layers 72 of the second stacked portion 100b also is patterned into a stairstep configuration; and the insulating layers 72 have terrace portions 72a arranged in a stairstep configuration with differences in levels along the X-direction. The terrace portions 72a of the insulating layers 72 are stacked on the terrace portions 70a of the electrode layers 70.

As shown in FIG. 6, the insulating layer 42 is provided on the stairstep portion 2. The insulating layer 42 fills the differences in levels of the stairstep portion 2, and eliminates or relaxes the difference in levels between the second stacked portion 100b and the first stacked portion 100a. The insulating layer 43 is provided on the insulating layer 42.

Multiple columnar portions 45 that extend in the stacking direction of the stacked body 100 (the Z-direction) are provided inside the insulating layer 43, inside the insulating layer 42, and inside the second stacked portion 100b under the insulating layer 42.

As shown in FIG. 5, at least one columnar portion 45 is disposed at one terrace portion 70a. The columnar portion 45 is an insulator having a substantially circular columnar configuration, and includes, for example, mainly silicon oxide.

As shown in FIG. 6, the columnar portions 45 pierce the insulating layer 43, the insulating layer 42, and the second stacked portion 100b and reach the active region 10a of the substrate 10. Each of the columnar portions 45 pierces the corresponding terrace portion 70a. The lengths in the Z-direction of the columnar portions 45 are substantially equal to each other.

Contact portions 91 are provided on the terrace portions 70a. The multiple contact portions 91 are provided to correspond to the number of the multiple columnar portions 45.

The contact portion 91 is provided at the side surface of the columnar portion 45 on the terrace portion 70a. The contact portion 91 is provided in a tubular configuration surrounding the columnar portion 45.

The contact portion 91 pierces the insulating layer 43, the insulating layer 42, and the terrace portion 72a of the insulating layer 72, and is connected to the terrace portion 70a of the electrode layer 70. Here, the connection includes the case where the contact portion 91 and the terrace portion 70a are continuous as one body without a boundary between the contact portion 91 and the terrace portion 70a. The contact portion 91 does not extend to the electrode layer 70 under the terrace portion 70a.

The contact portion 91 is a conductive film (a conductive portion), e.g., a metal film, formed in a tubular configuration. The contact portion 91 and the terrace portion 70a include the same metal (e.g., tungsten or molybdenum) as major components. Or, the contact portion 91 and the terrace portion 70a may be different materials.

The periphery of the contact portion 91 is surrounded with the insulating layer 43, the insulating layer 42, and the terrace portion 72a of the insulating layer 72.

Among the multiple contact portions 91, the length in the Z-direction of a contact portion 91 disposed on the upper level side is shorter than the length in the Z-direction of a contact portion 91 disposed on the lower level side. The length in the Z-direction decreases as the contact portion 91 is disposed further on the upper level side.

Figure 7:
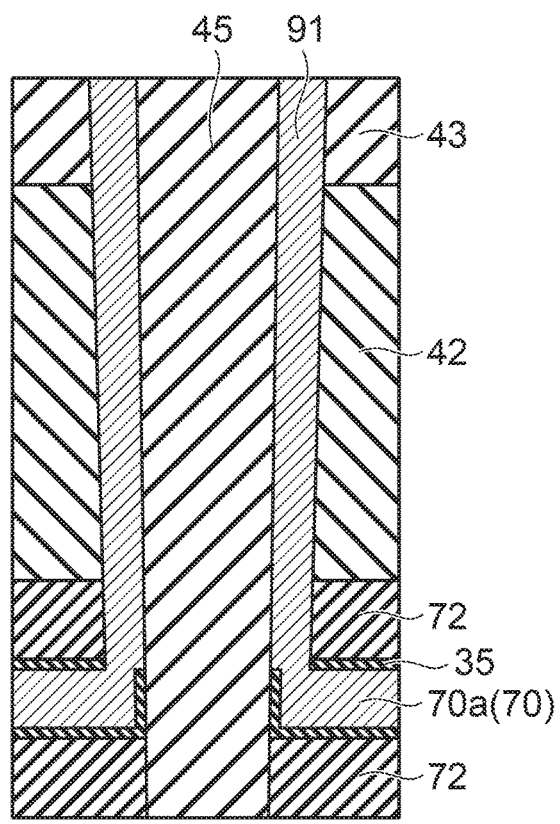
FIGS. 7 to 9 are enlarged cross-sectional views of one portion of FIG. 6.
Figure 8:
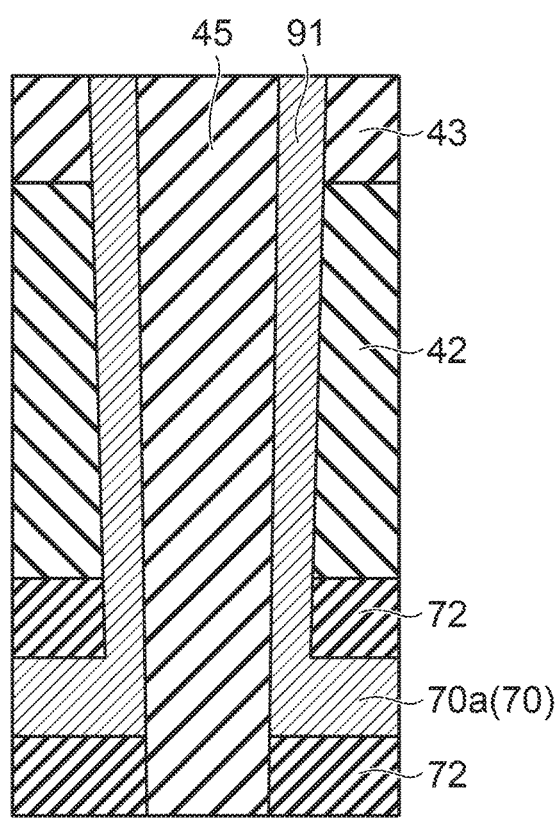
Figure 9:
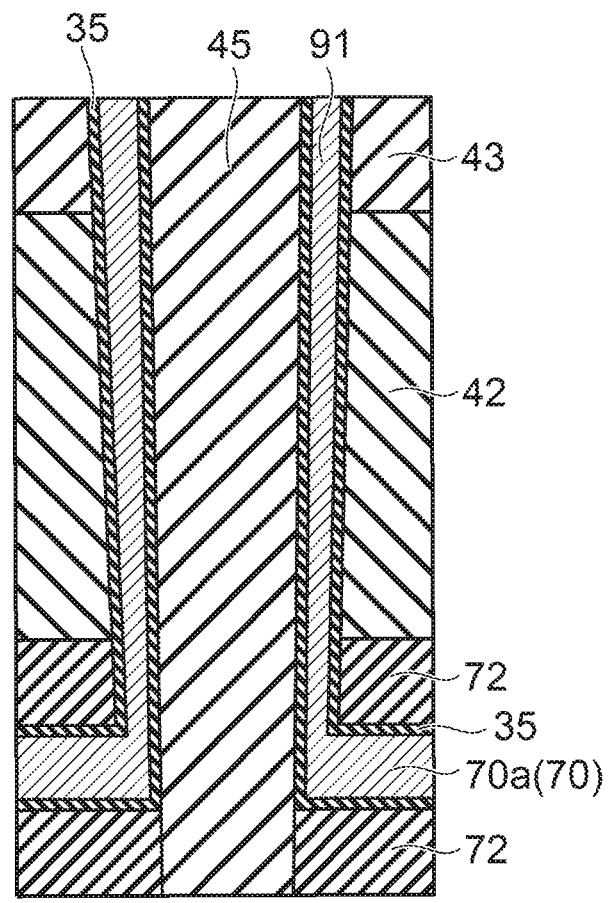

FIG. 7 to FIG. 9 are enlarged cross-sectional views of the contact portion 91 and the terrace portion 70a.

In the example shown in FIG. 7 corresponding to the memory cell MC of FIG. 4A, the second blocking film (the metal oxide film) 35 is provided between the terrace portion 70a and the insulating layer 72. Also, due to a process described below, the second blocking film 35 is provided also between the terrace portion 70a and the columnar portion 45. The second blocking film 35 is not provided at the connection portion between the contact portion 91 and the upper surface of the terrace portion 70a.

In the example shown in FIG. 8 corresponding to the memory cell MC of FIG. 4B, the second blocking film 35 is not provided at the upper surface of the terrace portion 70a, the lower surface of the terrace portion 70a, and the side surface of the terrace portion 70a on the columnar portion 45 side.

In the example shown in FIG. 9 corresponding to the memory cell MC of FIG. 4A, the second blocking film 35 is provided between the terrace portion 70a and the insulating layer 72, and between the terrace portion 70a and the columnar portion 45. Further, in the example shown in FIG. 9, the second blocking film 35 is provided also at the inner circumferential surface and outer circumferential surface of the contact portion 91 having the tubular configuration. The second blocking film 35 is provided between the contact portion 91 and the columnar portion 45, between the contact portion 91 and the insulating layer 43, and between the contact portion 91 and the insulating layer 42.

In the example shown in FIG. 9, the second blocking film 35 is formed first; and subsequently, the contact portion 91 and the terrace portion 70a of the electrode layer 70 are integrally formed of the same material on the inner side of the second blocking film 35.

Each contact portion 91 is connected to a not-shown upper layer interconnect. For example, the upper layer interconnect is electrically connected to a control circuit formed in the front surface of the substrate 10. The potential of the electrode layer 70 of each layer of the memory cell array 1 is controlled via the contact portion 91 and the terrace portion 70a.

The separation portion 60 will now be described.

Figure 10B:
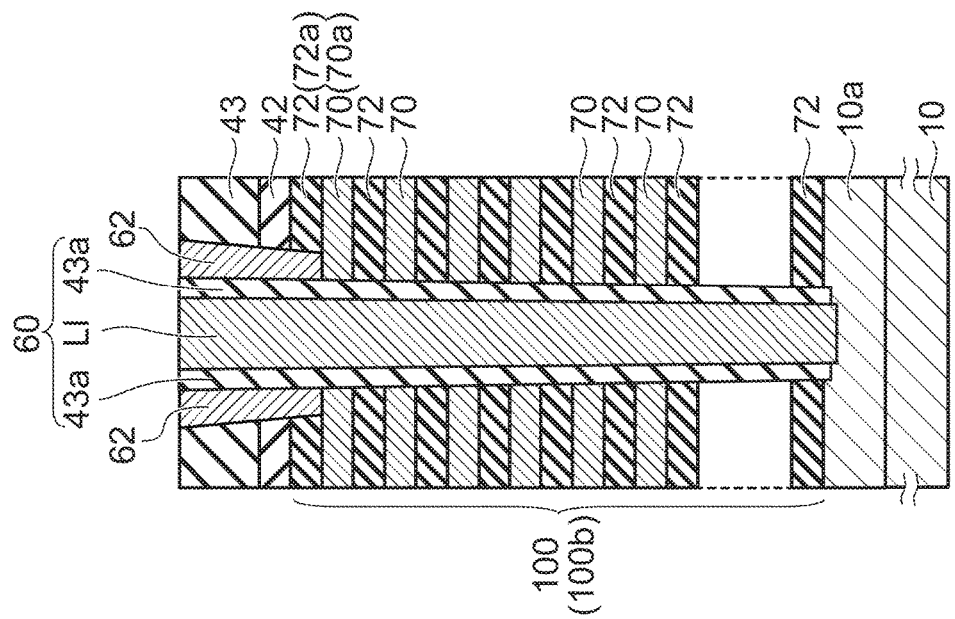
FIG. 10B is an B-B' cross-sectional view of FIG. 5.
Figure 10A:
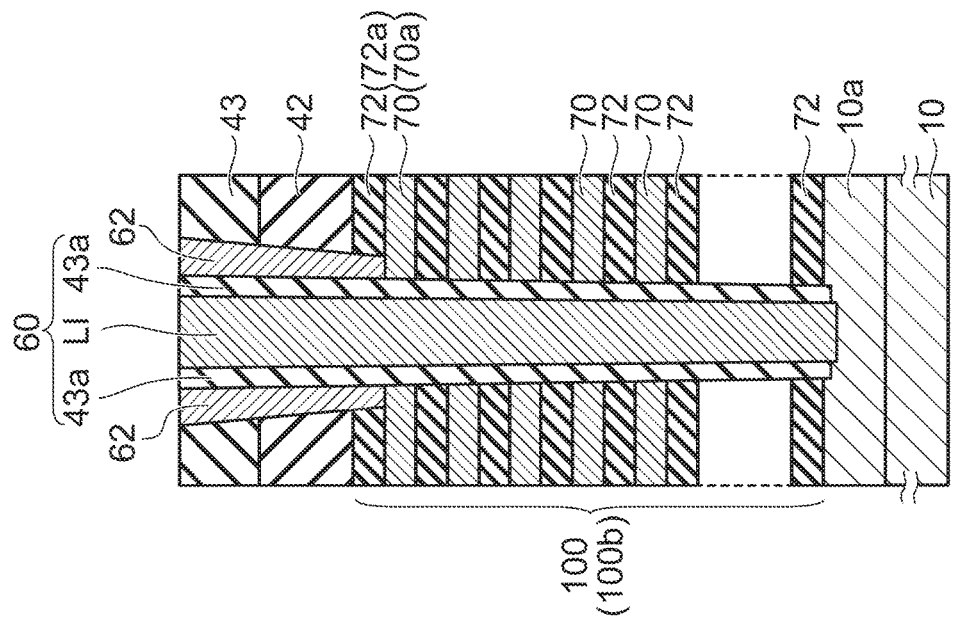
FIG. 10A is an C-C' cross-sectional view of FIG. 5.

FIG. 10A is a C-C' cross-sectional view of FIG. 5; and FIG. 10B is a B-B' cross-sectional view of FIG. 5.

The separation portion 60 includes an interconnect portion LI and an insulating film 43a. The interconnect portion LI spreads in the X-direction and the Z-direction shown in FIG. 2 and is, for example, a film including a metal. The insulating film 43a is provided on the side surface of the interconnect portion LI. The insulating film 43a is provided between the interconnect portion LI and the stacked body 100 including the electrode layers 70.

As shown in FIG. 2, the interconnect portion LI is provided also in the separation portion 60 of the memory cell array 1. Although not shown in FIG. 2, the insulating film 43a is provided between the interconnect portion LI and the first stacked portion 100a.

As shown in FIG. 10A and FIG. 10B, the insulating film 43a is provided between the insulating layer 42 and the interconnect portion LI, and between the insulating layer 43 and the interconnect portion LI.

Also, a liner film 62 is provided between the insulating film 43a and the insulating layer 43, between the insulating film 43a and the insulating layer 42, and between the insulating film 43a and the terrace portion 72a of the insulating layer 72. The lower end of the liner film 62 contacts the terrace portion 70a of the electrode layer 70.

The lower end of the interconnect portion LI contacts the active region 10a of the substrate 10. The upper end of the interconnect portion LI is connected to the source line SL via a contact Cs shown in FIG. 2. Also, as shown in FIG. 3, the lower end of the semiconductor body 20 contacts the active region 10a.

By controlling the potential applied to the lowermost electrode layer 70, an n-channel (an inversion layer) can be induced in the front surface of the active region 10a. A current can be caused to flow between the lower end of the semiconductor body 20 and the lower end of the interconnect portion LI through the n-channel.

The width in the Y-direction of the separation portion 60 is greater than the outer diameter of the contact portion 91 having the tubular configuration. The outer diameter of the contact portion 91 is larger than the diameter of the columnar portion 45.

The columnar portions 45 function as pillars that support the second stacked portion 100b including gaps 44 in the process shown in FIG. 40A described below. The contact portion 91 surrounds the periphery of the columnar portion 45 in a concentric circular configuration. The columnar portion 45 and the contact portion 91 are disposed at the same position inside one terrace portion 70a.

Compared to a structure in which the columnar portion 45 and the contact portion 91 are disposed at separate positions to be separated from each other inside one terrace portion 70a, such a structure makes it possible to reduce the surface area of the terrace portion 70a. This makes it possible to reduce the chip size.

A method for manufacturing the semiconductor device of the embodiment will now be described.

First, the processes for the first stacked portion 100a of the cell array region where the memory cell array 1 is formed will be described with reference to FIG. 11 to FIG. 19.

Figure 11:
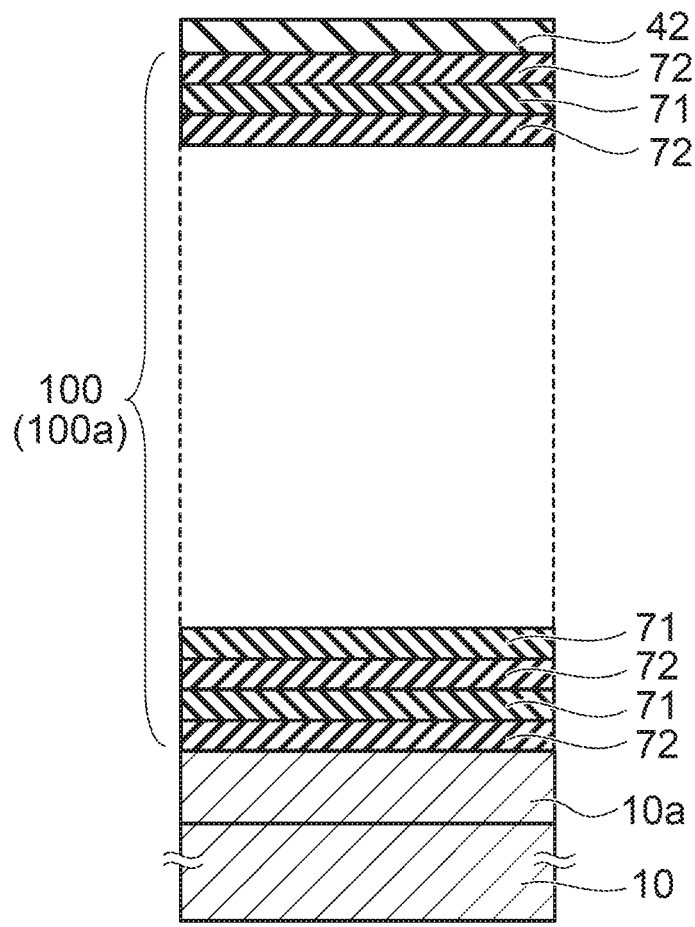
FIGS. 11 to 19 are schematic cross-sectional views showing a method for manufacturing the semiconductor device of the embodiment.

As shown in FIG. 11, the first stacked portion 100a is formed on the active region 10a of the substrate 10. The insulating layer 72 as a second layer and a sacrificial layer 71 as a first layer are stacked alternately on the active region 10a. The process of alternately stacking the insulating layer 72 and the sacrificial layer 71 is repeated; and the multiple sacrificial layers 71 and the multiple insulating layers 72 are formed on the substrate 10. The insulating layer 42 is formed on the uppermost insulating layer 72. For example, the sacrificial layers 71 are silicon nitride layers; and the insulating layers 72 are silicon oxide layers.

Figure 12:
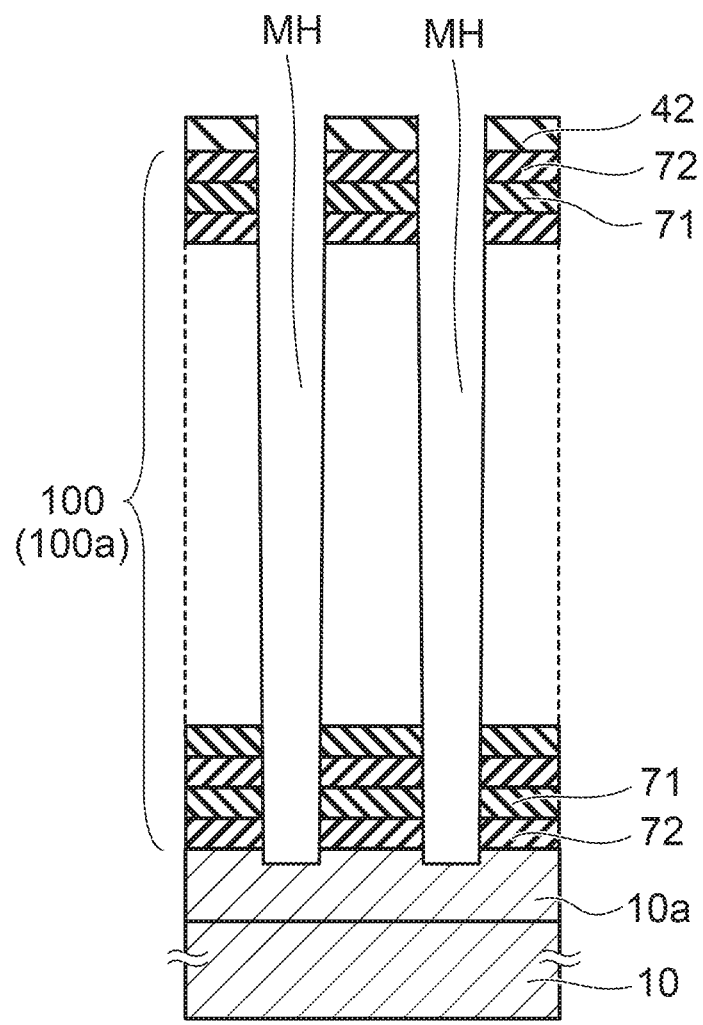

Then, as shown in FIG. 12, multiple memory holes MH are formed in the first stacked portion 100a. The memory holes MH are formed by reactive ion etching (RIE) using a not-shown mask layer. The memory holes MH pierce the insulating layer 42 and the first stacked portion 100a, and reach the active region 10a.

Figure 13:
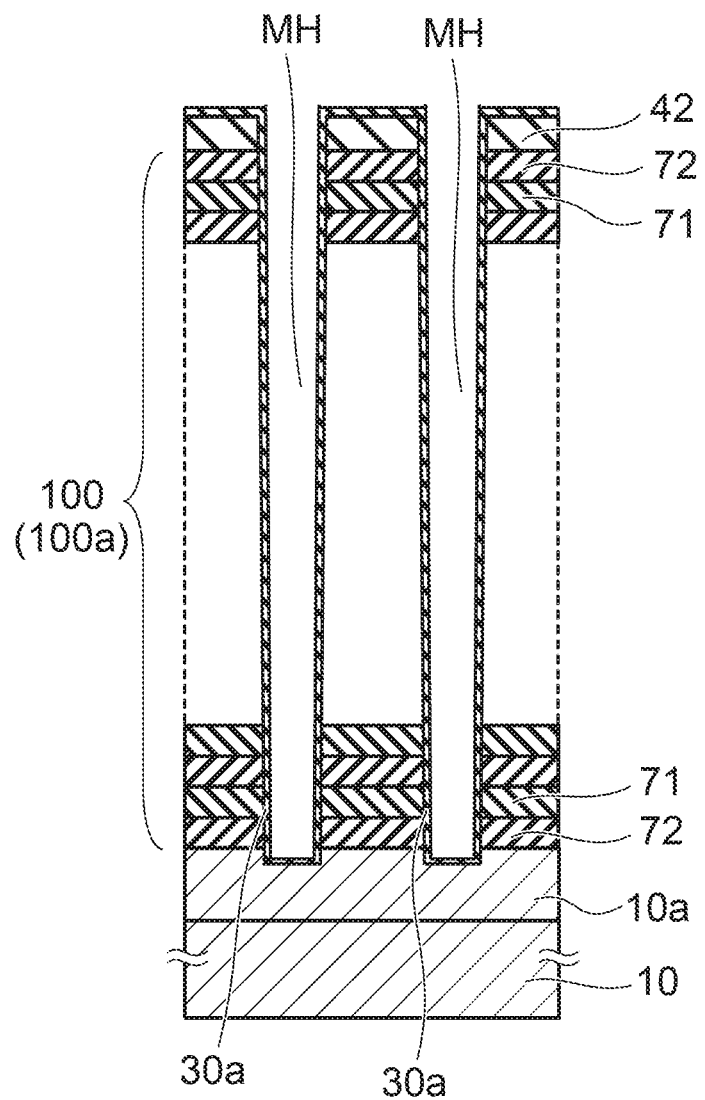

As shown in FIG. 13, a stacked film 30a is formed inside the memory holes MH. The stacked film 30a is formed conformally along the side surfaces and bottoms of the memory holes MH. The stacked film 30a includes, for example, the tunneling insulating film 31, the charge storage film 32, and the first blocking film 34 of the stacked film 30 shown in FIG. 4A. The first blocking film 34, the charge storage film 32, and the tunneling insulating film 31 are formed in order inside the memory holes MH.

Figure 14:
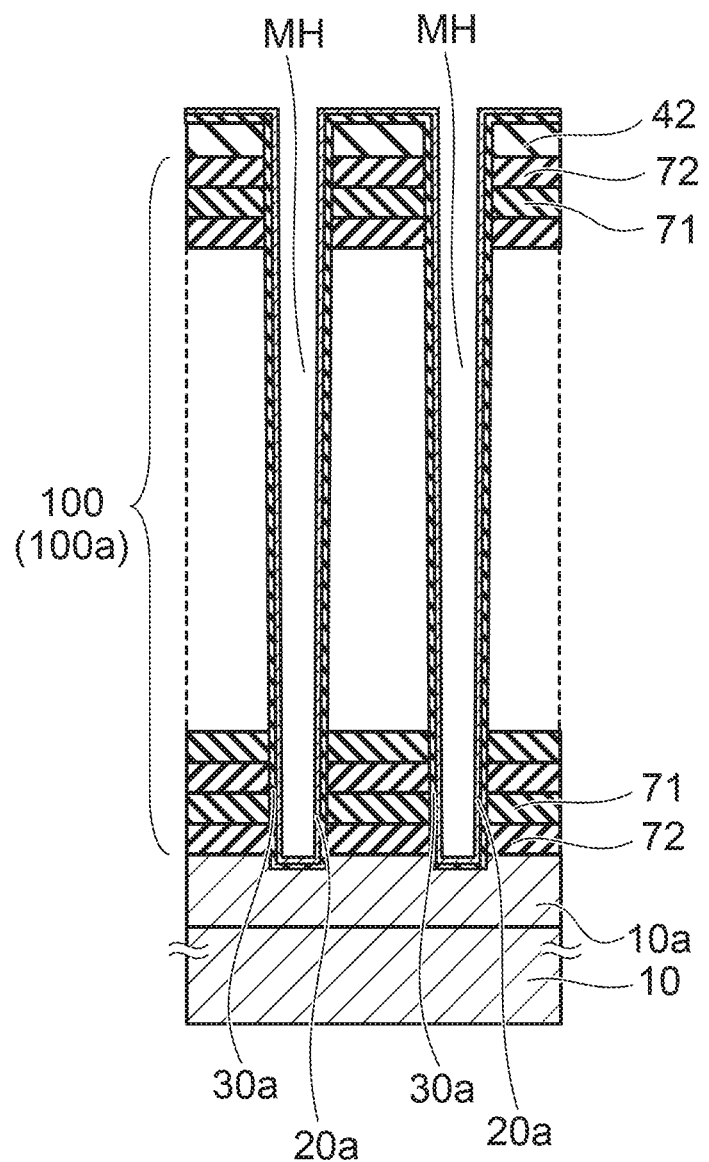

As shown in FIG. 14, cover silicon 20a is formed on the inner side of the stacked film 30a. The cover silicon 20a is formed conformally along the side surfaces and bottoms of the memory holes MH.

Figure 15:
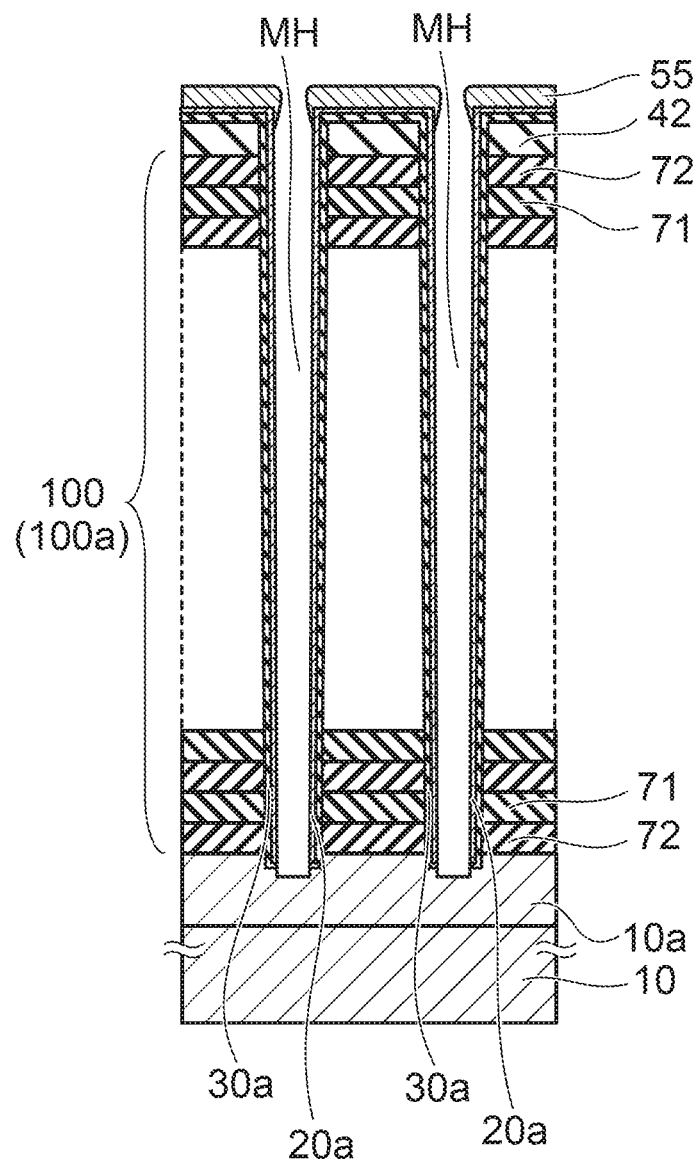

Then, as shown in FIG. 15, a mask layer 55 is formed on the insulating layer 42; and the cover silicon 20a and the stacked film 30a deposited on the bottoms of the memory holes MH are removed by RIE. In the RIE, the stacked film 30a formed on the side surfaces of the memory holes MH is covered with and protected by the cover silicon 20a, and is not damaged by the RIE.

Figure 16:
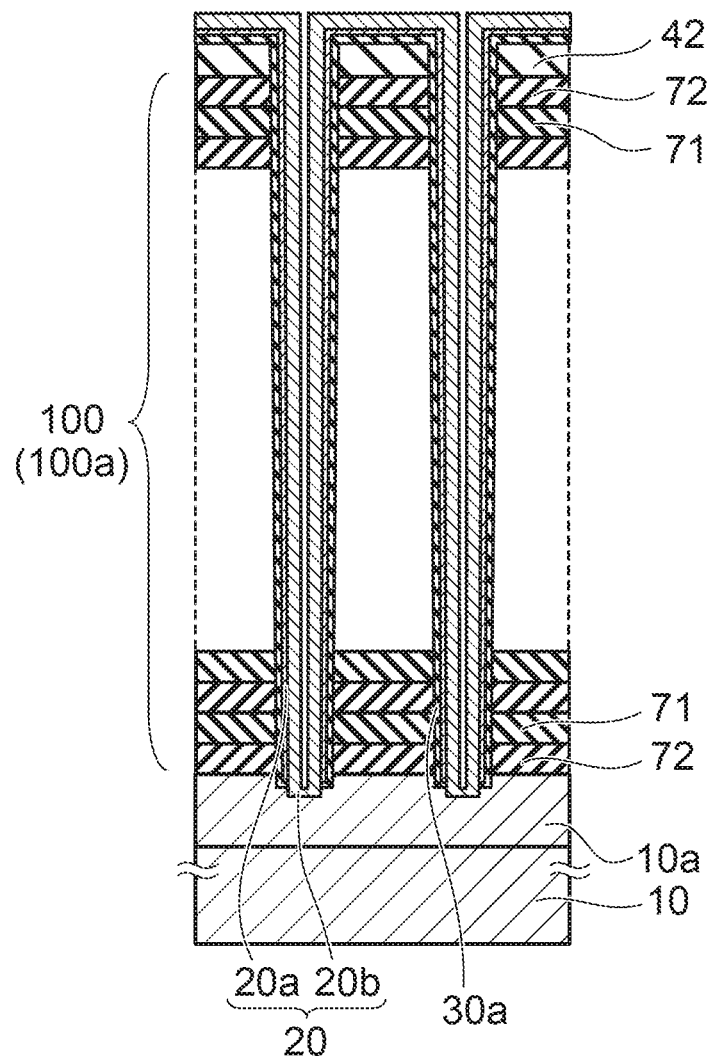

After removing the mask layer 55, a silicon body 20b is formed inside the memory holes MH as shown in FIG. 16. The silicon body 20b is formed on the side surface of the cover silicon 20a and the active region 10a at the bottoms of the memory holes MH. The lower end of the silicon body 20b contacts the active region 10a.

For example, the cover silicon 20a and the silicon body 20b are formed as amorphous silicon films, and subsequently crystallized into polycrystalline silicon films by heat treatment.

Figure 17:
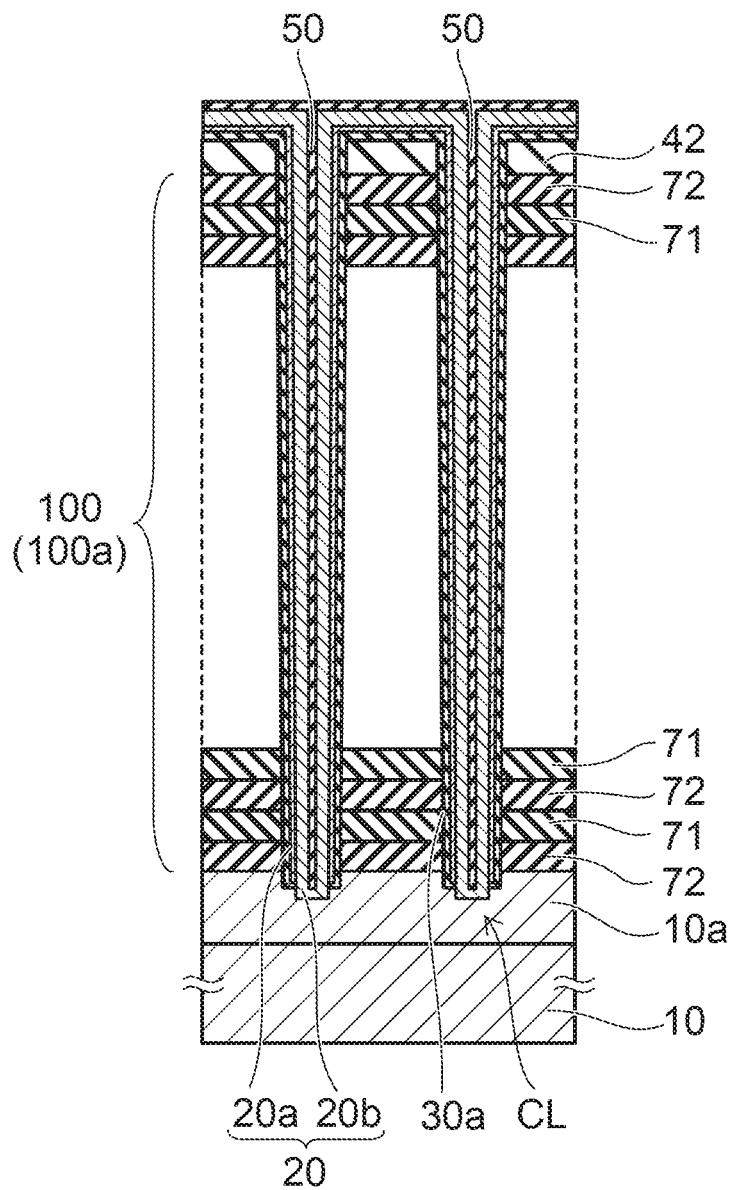

As shown in FIG. 17, the core film 50 is formed on the inner side of the silicon body 20b. The columnar portions CL including the stacked film 30a, the semiconductor body 20, and the core film 50 are formed inside the first stacked portion 100a.

The films deposited on the insulating layer 42 shown in FIG. 17 are removed by chemical mechanical polishing (CMP) or etch-back.

Figure 18:
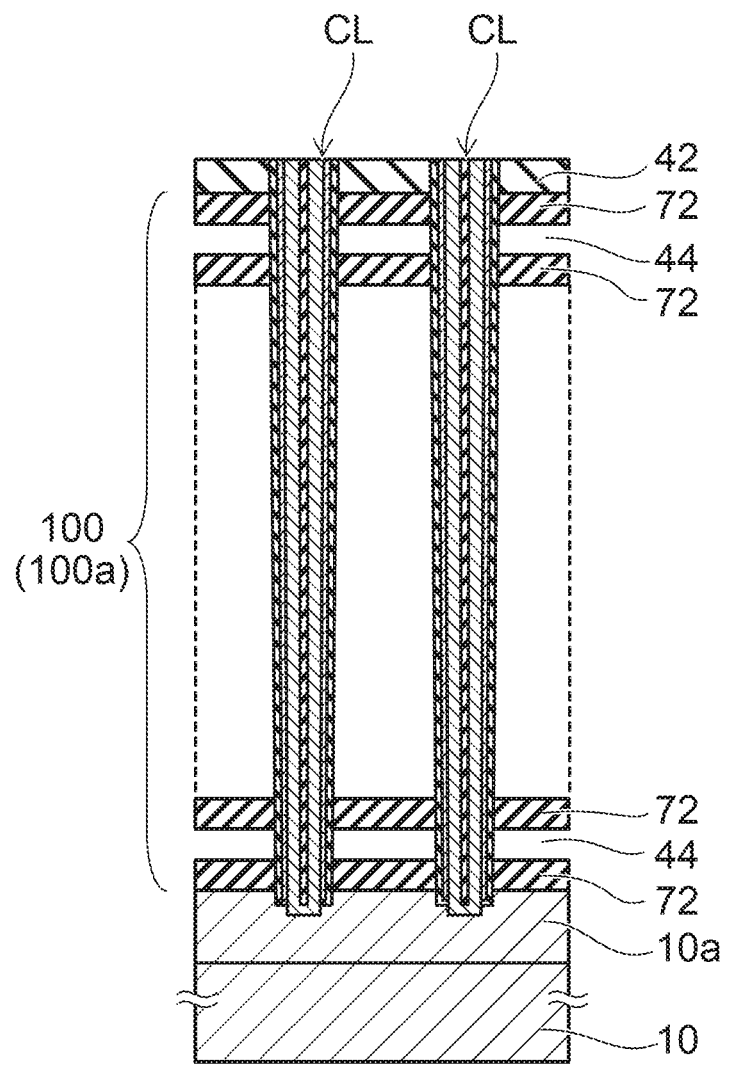

Subsequently, by etching through a slit ST formed in the stacked body 100 described below, the sacrificial layers 71 are removed; and the gaps 44 are formed between the insulating layers 72 as shown in FIG. 18.

The insulating layers 72 of the first stacked portion 100a surround the side surfaces of the columnar portions CL. The insulating layers 72 of the first stacked portion 100a are supported by the physical bond with the columnar portions CL; and the gaps 44 between the insulating layers 72 are maintained.

Figure 19:
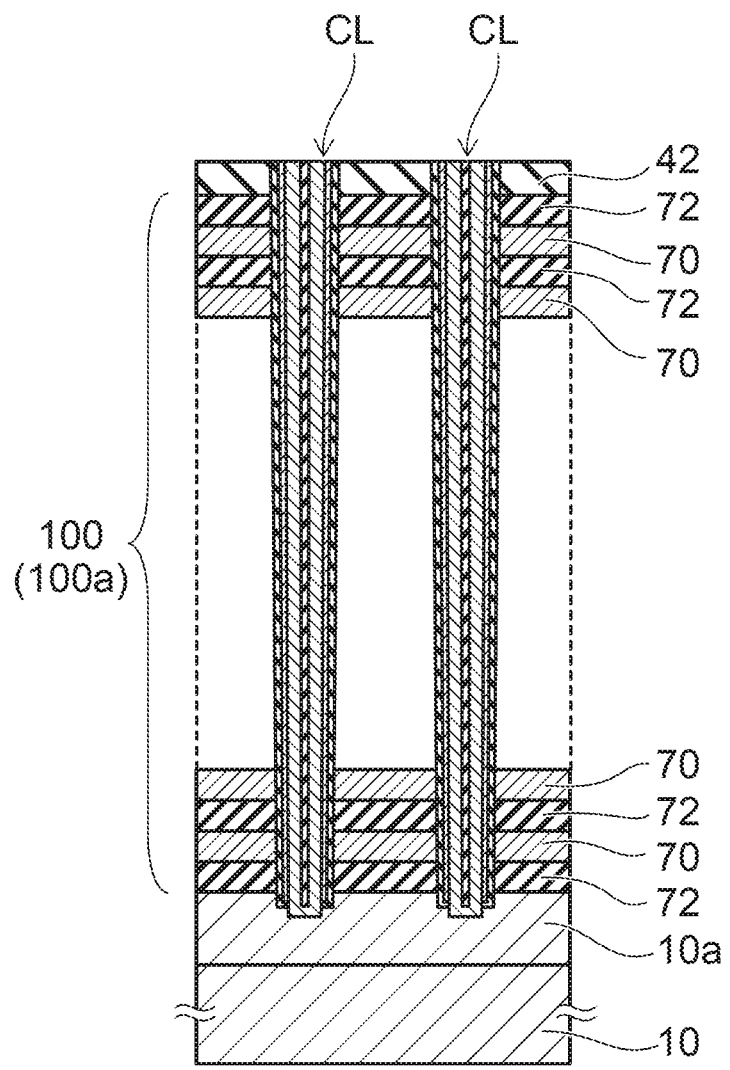

As shown in FIG. 19, the electrode layers 70 are formed in the gaps 44.

The processes for the second stacked portion 100b where the stairstep portion 2 is formed will now be described with reference to FIG. 21 to FIG. 46B.

Figure 20:
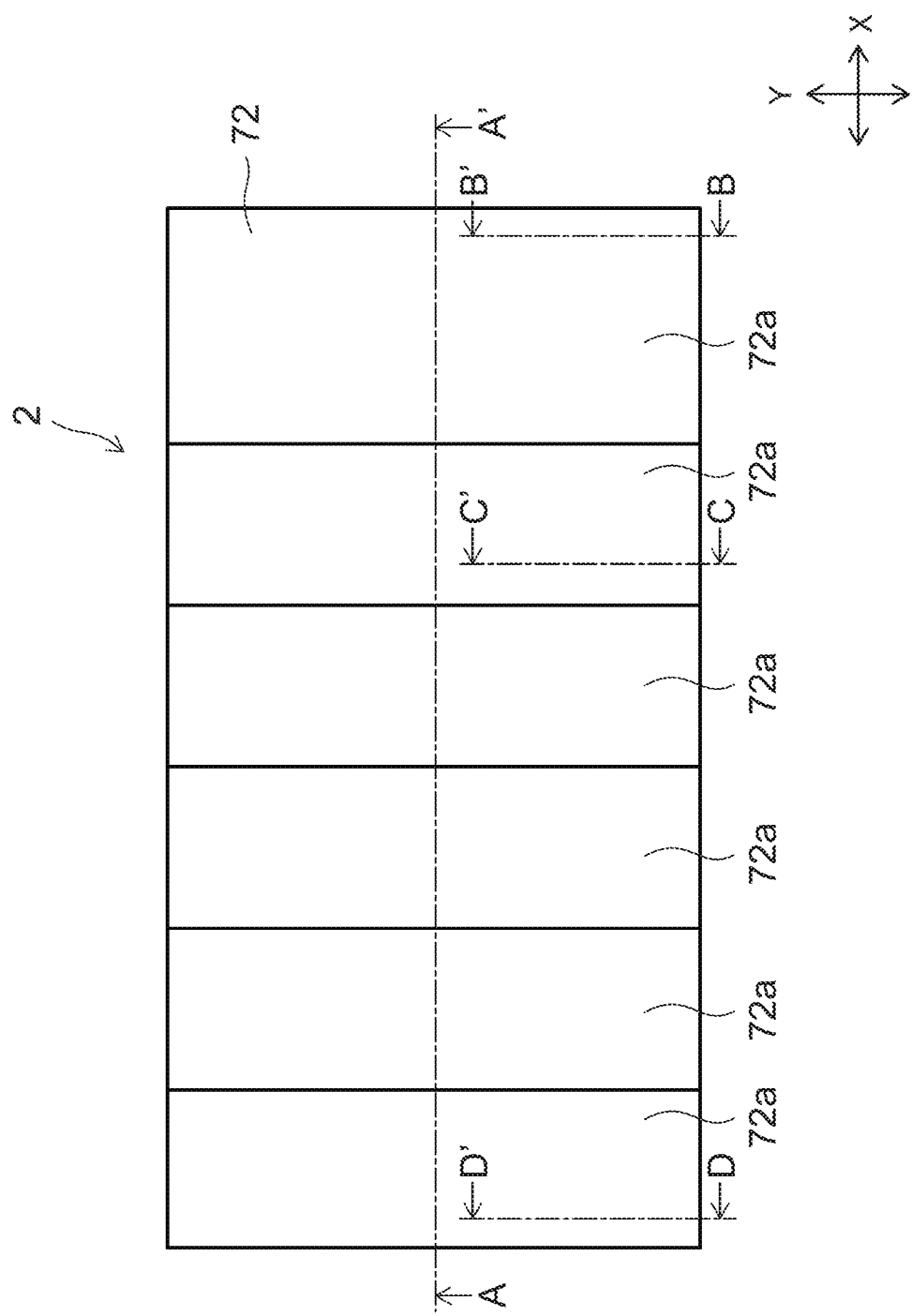
FIG. 20 is a schematic plan view showing a method for manufacturing the semiconductor device of the embodiment.

FIG. 20 is a schematic plan view of the stairstep region where the stairstep portion 2 is formed.

Figure 22B:
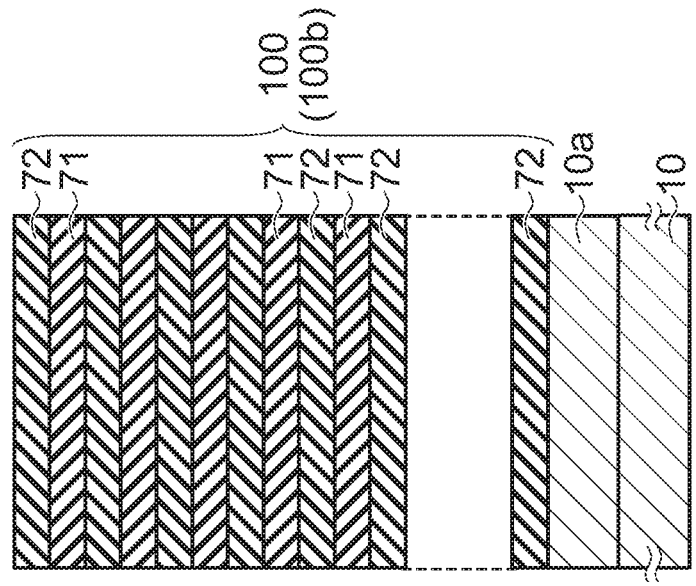
Figure 22A:
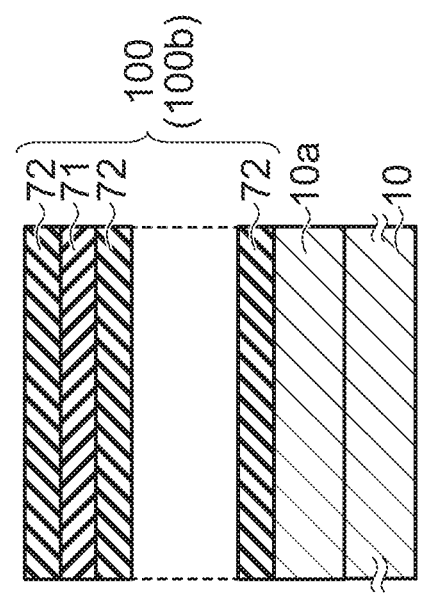

FIG. 21A is an A-A' cross-sectional view of FIG. 20.
FIG. 21B is a B-B' cross-sectional view of FIG. 20.
FIG. 22A is a D-D' cross-sectional view of FIG. 20.
FIG. 22B is a C-C' cross-sectional view of FIG. 20.

The stacked body 100 (the second stacked portion 100b) that includes the sacrificial layers 71 and the insulating layers 72 is formed also on the substrate 10 in the region where the stairstep portion 2 is formed.

The stairstep portion 2 is formed in a portion of the second stacked portion 100b. For example, the insulating layers 72 and the sacrificial layers 71 are patterned into a stairstep configuration along the X-direction by repeating RIE using a not-shown resist film as a mask and a reduction of the planar size of the resist film.

The multiple terrace portions 72a that are arranged in the X-direction with differences in levels are formed in the insulating layers 72 of the second stacked portion 100b. Multiple terrace portions 71a that are arranged in the X-direction with differences in levels are formed in the sacrificial layers 71 of the second stacked portion 100b. The terrace portions 72a of the insulating layers 72 are exposed at the outermost surface of the stairstep portion 2.

FIG. 23A is a cross-sectional view of the process continuing from FIG. 21A; and FIG. 23B is a cross-sectional view of the process continuing from FIG. 21B.

As shown in FIG. 23A, the insulating layer 42 is formed on the stairstep portion 2. The insulating layer 42 fills the differences in levels of the stairstep portion 2; and the upper surface of the insulating layer 42 is planarized. The insulating layer 42 is, for example, a silicon oxide layer.

After forming the insulating layer 42, the processes shown in FIG. 12 to FIG. 17 described above for the first stacked portion 100a of the cell array region are performed; and the multiple columnar portions CL are formed in the first stacked portion 100a.

Figures 24A, 24B:
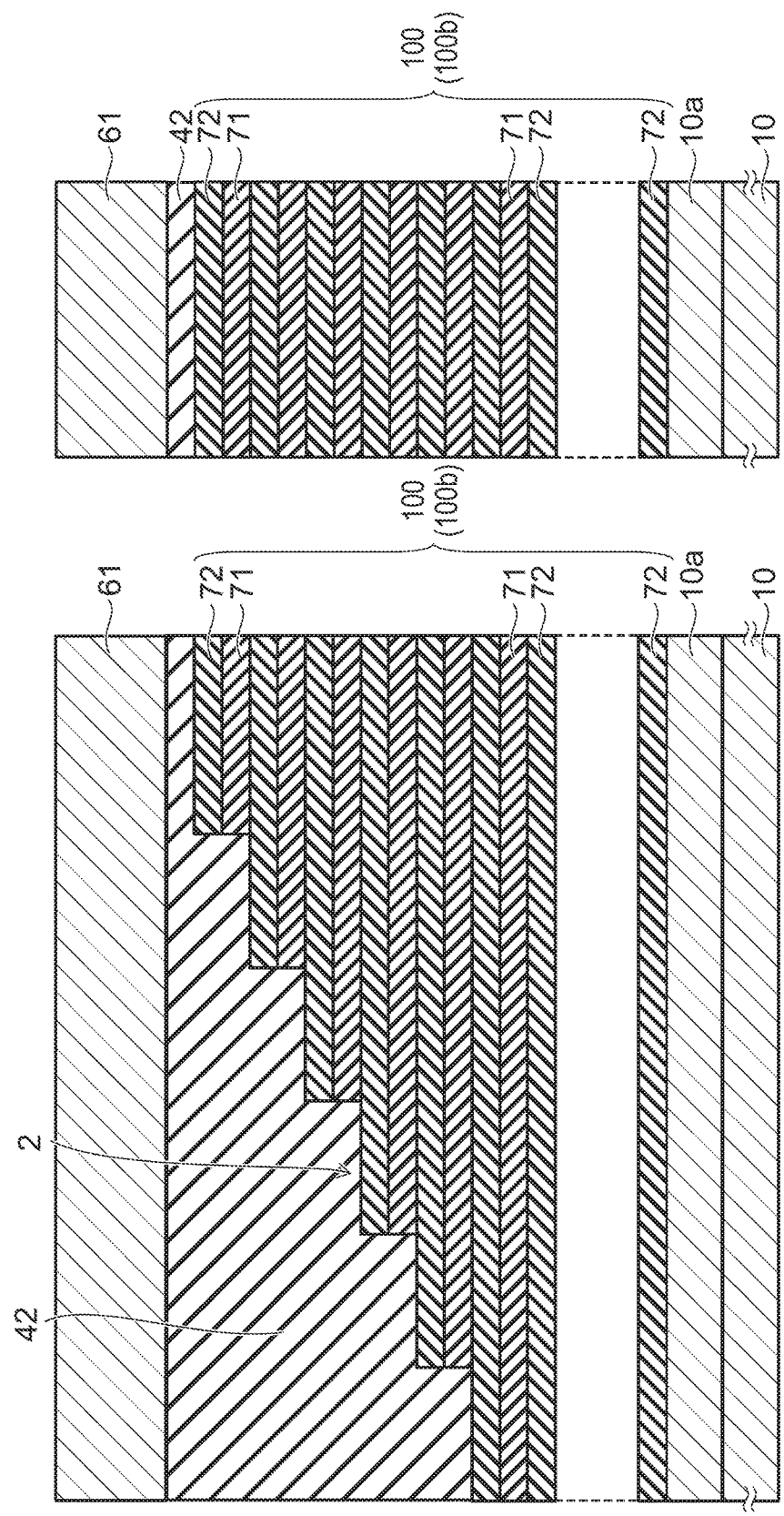

FIG. 24A is a cross-sectional view of the process continuing from FIG. 23A; and FIG. 24B is a cross-sectional view of the process continuing from FIG. 23B.

After forming the columnar portions CL, a mask layer 61 is formed on the insulating layer 42 as shown in FIG. 24A and FIG. 24B. The mask layer 61 is, for example, a carbon layer formed by chemical vapor deposition (CVD).

Figure 25:
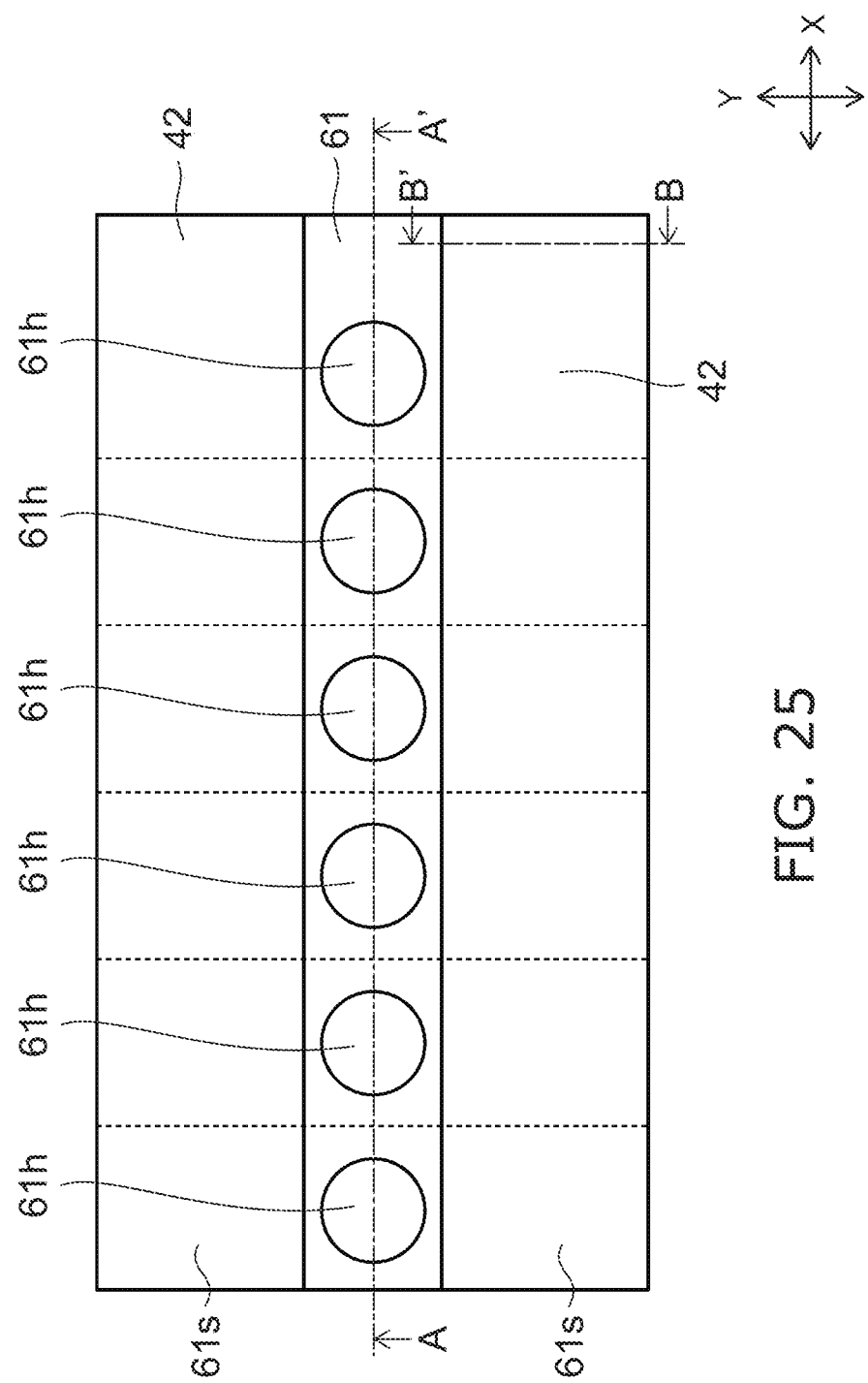
FIG. 25 is a schematic plan view showing a method for manufacturing the semiconductor device of the embodiment.
Figure 26:
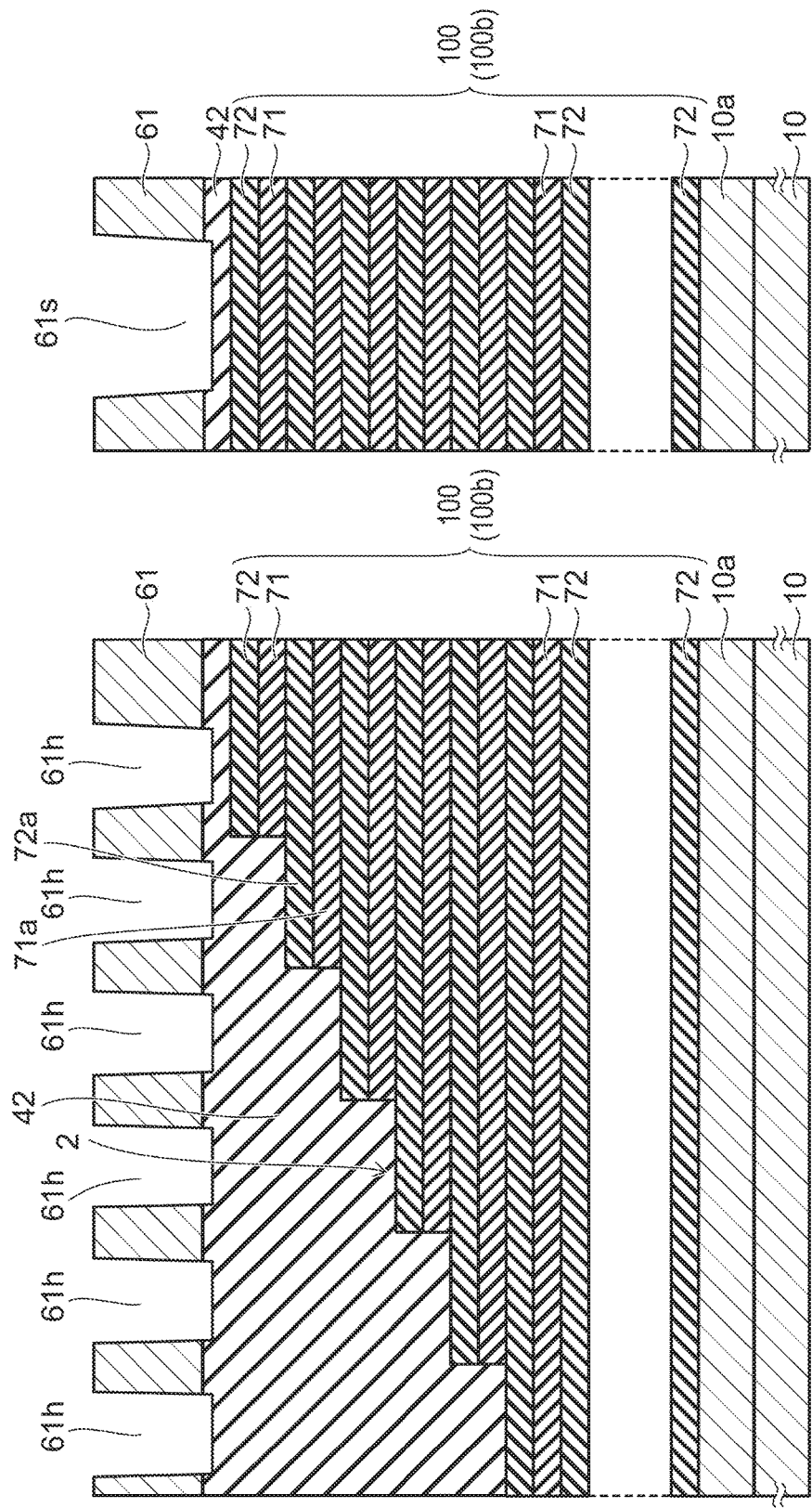
FIGS. 26A and 26B are schematic cross-sectional views showing a method for manufacturing the semiconductor device of the embodiment.

FIG. 25 is a schematic plan view of the stairstep region.
FIG. 26A is an A-A' cross-sectional view of FIG. 25.
FIG. 26B is a B-B' cross-sectional view of FIG. 25.

As shown in FIG. 25 and FIG. 26A, multiple holes 61h are formed in the mask layer 61. Also, as shown in FIG. 25 and FIG. 26B, multiple slits 61s are formed in the mask layer 61. The holes 61h and the slits 61s pierce the mask layer 61 and reach the insulating layer 42.

A not-shown resist film is formed on the mask layer 61; and holes and slits are formed in the resist film by exposure and developing of the resist film. By the etching using the resist film as a mask, the holes 61h and the slits 61s are formed simultaneously in the mask layer 61.

Figure 27:
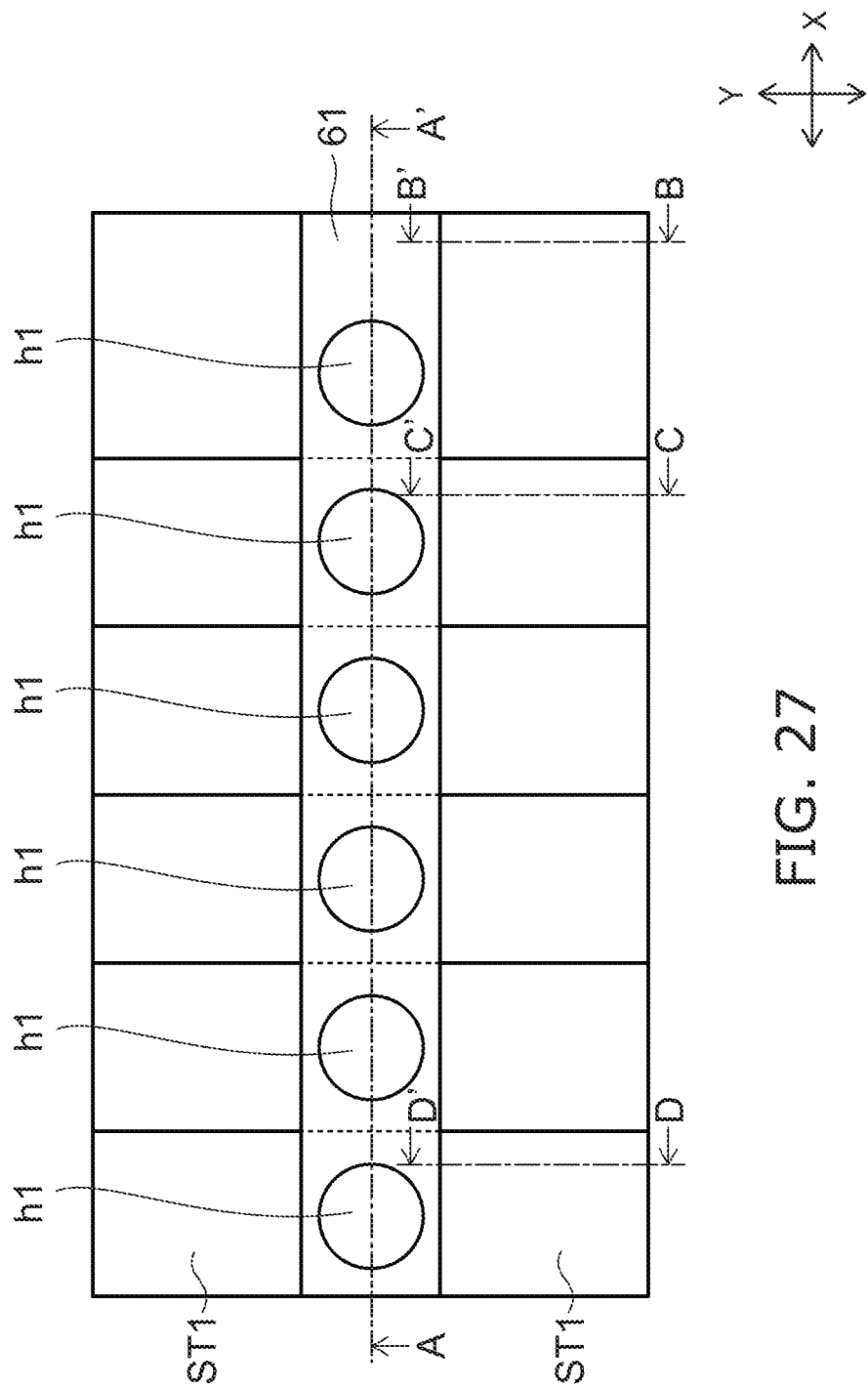
FIG. 27 is a schematic plan view showing a method for manufacturing the semiconductor device of the embodiment.

Multiple holes h1 shown in FIG. 27 and FIG. 28A and multiple slits ST1 shown in FIG. 27, FIG. 28B, FIG. 29A, and FIG. 29B are formed by etching using the mask layer 61 in which the holes 61h and the slits 61s are formed. The multiple holes h1 and the multiple slits ST1 are formed simultaneously.

Figure 29A:
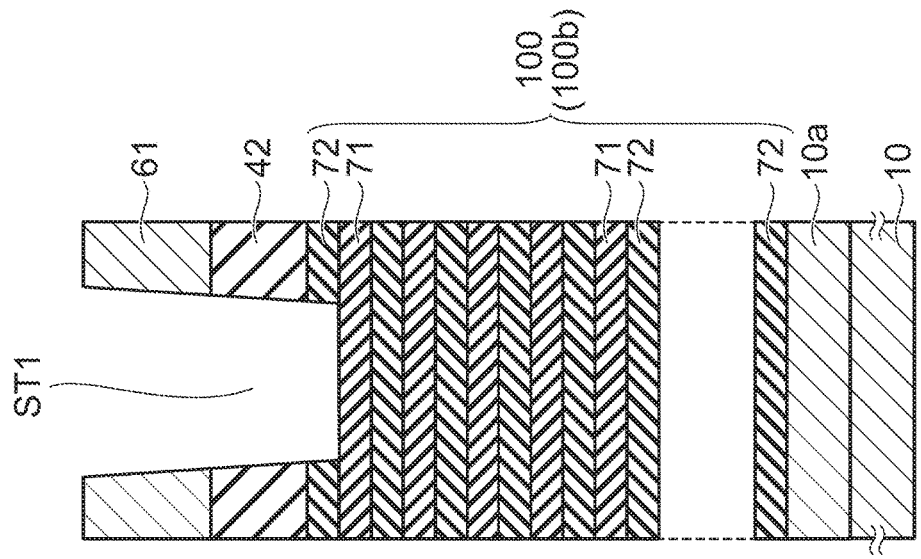
Figure 29B:
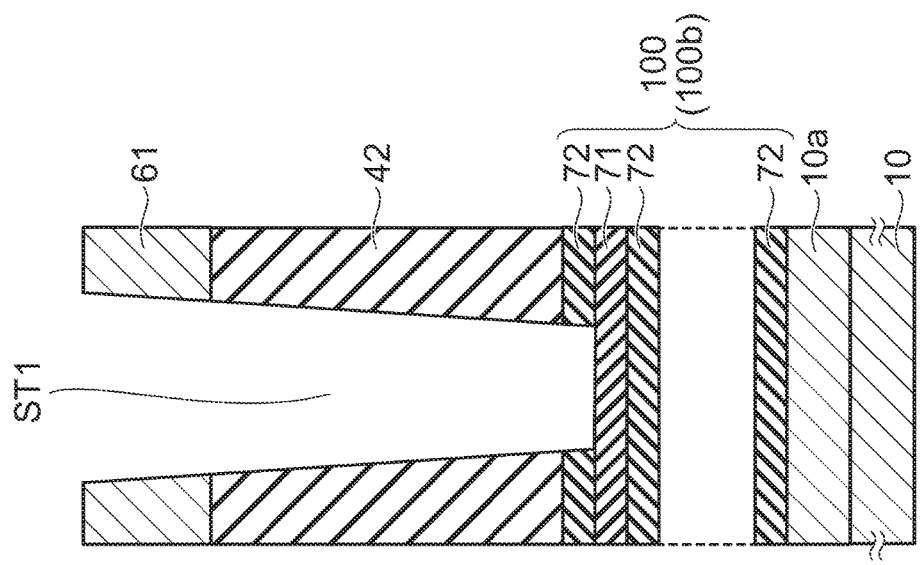

FIG. 27 is a schematic plan view of the stairstep region.
FIG. 28A is an A-A' cross-sectional view of FIG. 27.
FIG. 28B is a B-B' cross-sectional view of FIG. 27.
FIG. 29A is a D-D' cross-sectional view of FIG. 27.
FIG. 29B is a C-C' cross-sectional view of FIG. 27.

As shown in FIG. 28A, the holes h1 pierce the insulating layer 42 and extend in the stacking direction of the stacked body 100 through the insulating layer 42. The holes h1 further pierce the terrace portions 72a of the insulating layers 72 and reach the terrace portions 71a of the sacrificial layers 71.

For example, the insulating layer 42 and the terrace portions 72a which both are silicon oxide layers are etched by RIE. At this time, the terrace portions 71a which are silicon nitride layers are used as etching stoppers.

The holes h1 are shallower for the holes h1 that reach the terrace portions 71a further on the upper level side; and the holes h1 are deeper for the holes h1 that reach the terrace portions 71a further on the lower level side.

As shown in FIG. 27, the slits ST1 extend in the X-direction and are formed in the first stacked portion 100a of the cell array region as well. Similarly to the cross section shown in FIG. 28B, the slits ST of the cell array region pierce the insulating layer 42 and the uppermost insulating layer 72 and reach the uppermost sacrificial layer 71.

As shown in FIG. 28B, FIG. 29A, and FIG. 29B, the bottoms of the slits ST1 are formed along the differences in levels of the stairstep portion 2. The slits ST1 are shallower as the slits ST1 are further on the upper level side of the stairstep portion 2; and the slits ST1 are deeper as the slits ST1 are further on the lower level side of the stairstep portion 2.

Figure 30:
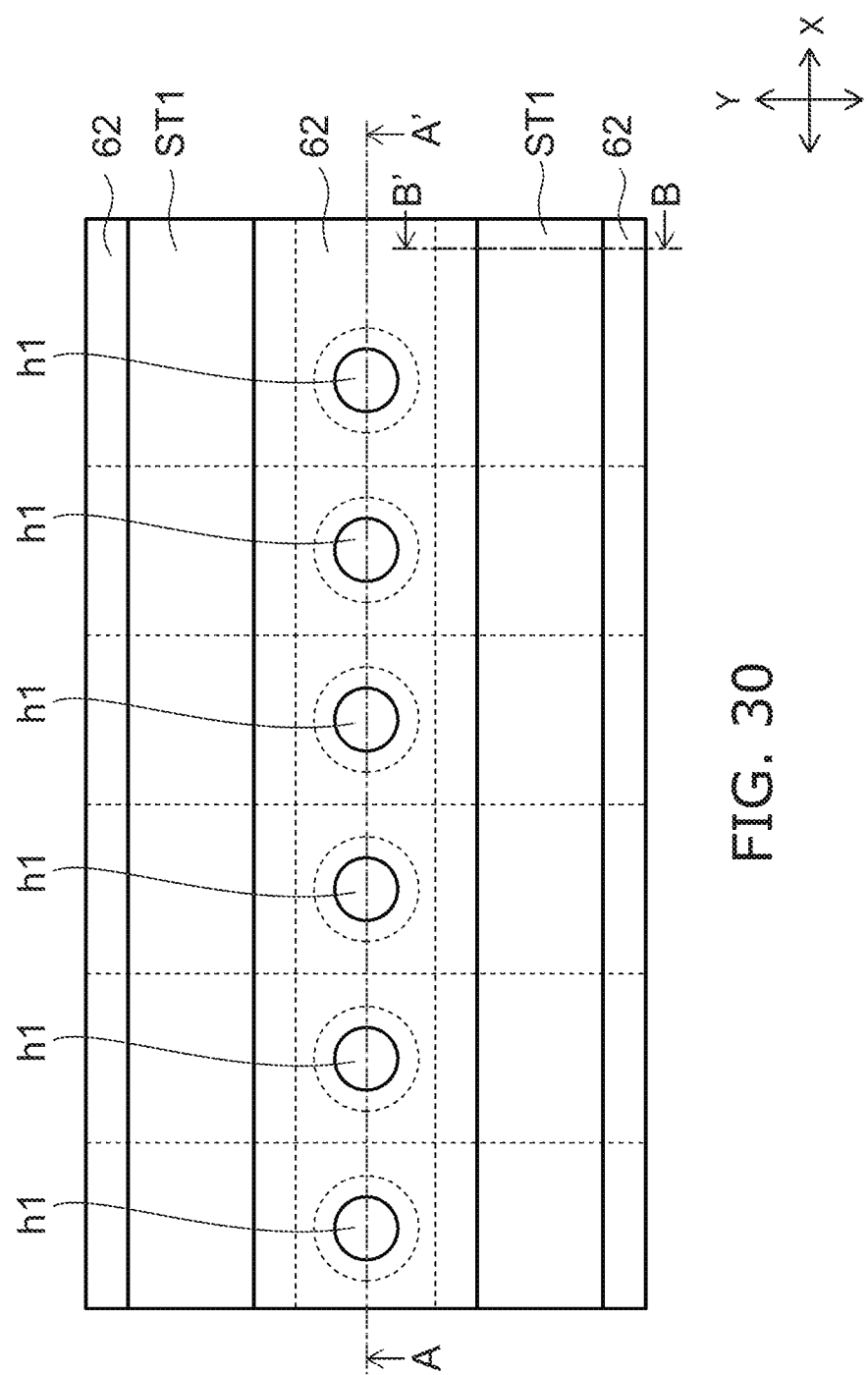
FIG. 30 is a schematic plan view showing a method for manufacturing the semiconductor device of the embodiment.
Figures 31A, 31B:
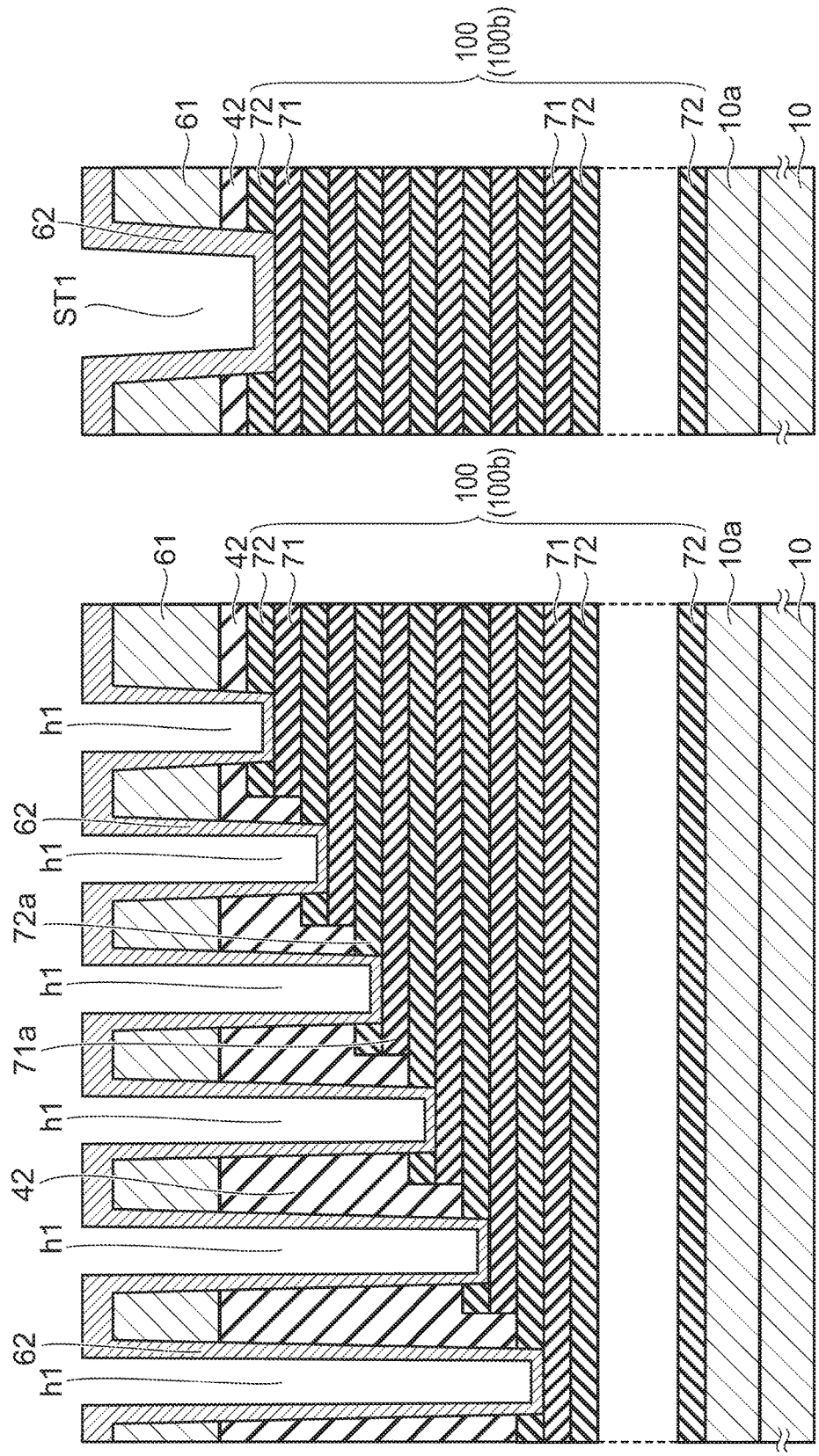

As shown in FIG. 30, FIG. 31A, and FIG. 31B, the liner film 62 is formed inside the holes h1 and inside the slits ST1.

FIG. 30 is a schematic plan view of the stairstep region.
FIG. 31A is an A-A' cross-sectional view of FIG. 30.
FIG. 31B is a B-B' cross-sectional view of FIG. 30.

For example, a silicon film is formed by CVD as the liner film 62. As shown in FIG. 31A, the liner film 62 is formed conformally along the side surfaces and bottoms of the holes h1. As shown in FIG. 31B, the liner film 62 is formed conformally along the side surfaces and bottoms of the slits ST1. Also, the liner film 62 is formed on the upper surface of the mask layer 61.

Spaces remain on the inner side of the liner film 62 inside the holes h1 and on the inner side of the liner film 62 inside the slits ST1.

FIG. 32A is a schematic cross-sectional view of the process continuing from FIG. 31A.

FIG. 32B is a schematic cross-sectional view of the process continuing from FIG. 31B.

For example, etch-back of the liner film 62 is performed by RIE; and the liner film 62 on the bottoms of the holes h1 and the bottoms of the slits ST1 is removed as shown in FIG. 32A and FIG. 32B. The liner film 62 on the mask layer 61 also is removed.

The terrace portions 71a of the sacrificial layers 71 are exposed at the bottoms of the holes h1 and the bottoms of the slits ST1. The liner film 62 remains on the side surfaces of the holes h1 and the side surfaces of the slits ST1.

Then, the second stacked portion 100b under the holes h1 and the second stacked portion 100b under the slits ST1 are etched by RIE using the mask layer 61 and the liner film 62 as a mask.

Figure 33:
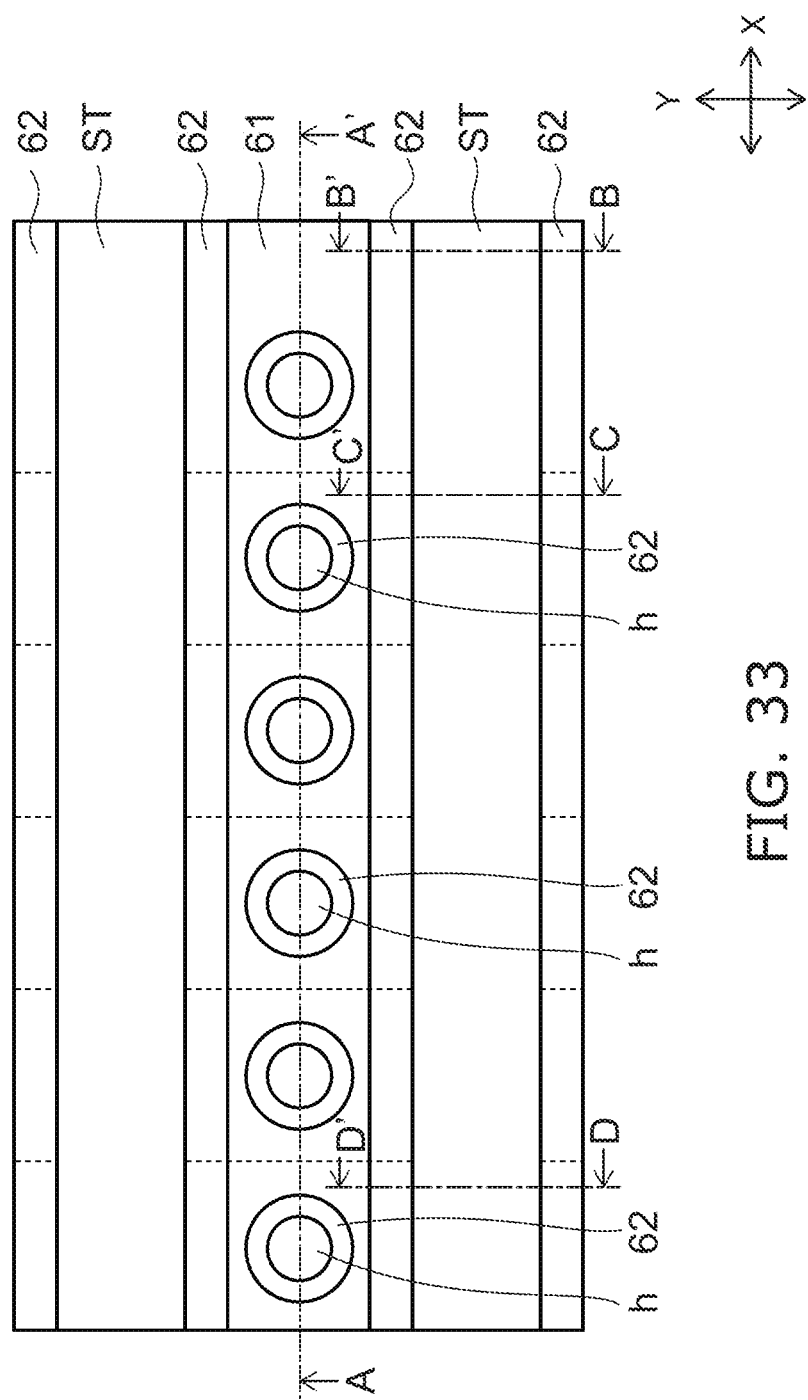
FIG. 33 is a schematic plan view showing a method for manufacturing the semiconductor device of the embodiment.
Figure 35A:
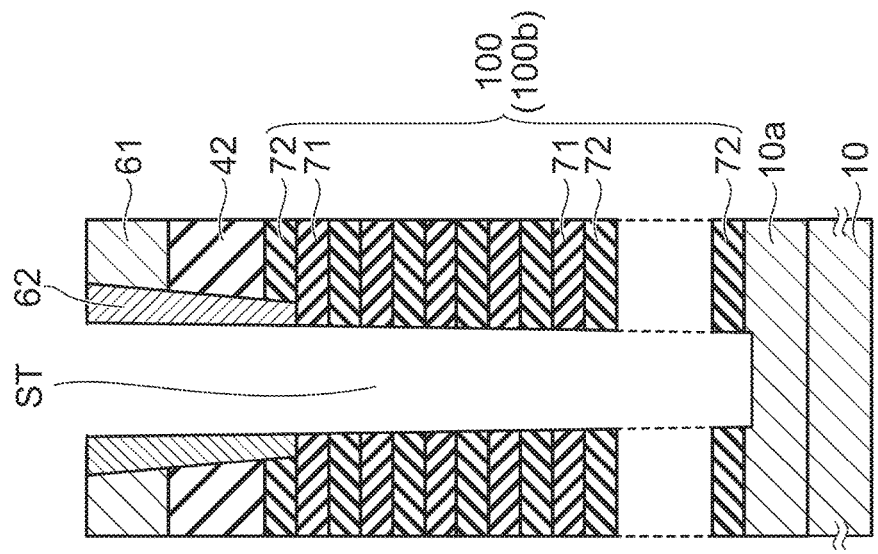
Figure 35B:
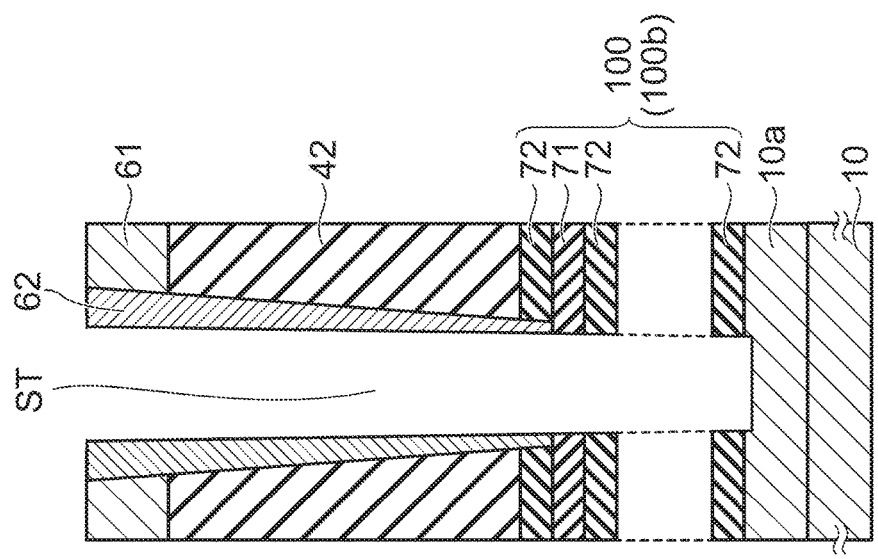

FIG. 33 is a schematic plan view of the stairstep region.
FIG. 34A is an A-A' cross-sectional view of FIG. 33.
FIG. 34B is a B-B' cross-sectional view of FIG. 33.
FIG. 35A is a D-D' cross-sectional view of FIG. 33.
FIG. 35B is a C-C' cross-sectional view of FIG. 33.

Multiple holes h are formed as shown in FIG. 33 and FIG. 34A. The multiple slits ST are formed as shown in FIG. 33, FIG. 34B, FIG. 35A, and FIG. 35B.

As shown in FIG. 34A, the holes h extend in the stacking direction on the inner side of the liner film 62 and through the second stacked portion 100b and reach the active region 10a of the substrate 10. The depths of the multiple holes h are substantially the same.

As shown in FIG. 33 and FIG. 34A, the liner film 62 surrounds, in tubular configurations, the peripheries of the holes h above the terrace portions 71a of the sacrificial layers 71.

As shown in FIG. 34B, FIG. 35A, and FIG. 35B, the slits ST extend in the stacking direction on the inner side of the liner film 62 and through the second stacked portion 100b, and reach the active region 10a of the substrate 10. The slits ST extend in the X-direction shown in FIG. 33 and have the same depth. The slits ST are formed also in the first stacked portion 100a of the cell array region. The cross section of the portion of the cell array region where the slits ST are formed corresponds to the cross section of FIG. 34B.

A diameter $\Phi_{HR}$ of the holes h is smaller than a diameter $\Phi_{CC}$ of the holes h1 in the state prior to the liner film 62 being formed. A width $L_{ST}$ of the slits ST is greater than the diameter $\Phi_{HR}$ of the holes h and the diameter $\Phi_{CC}$ of the holes h1.

FIG. 36A is a schematic cross-sectional view of the process continuing from FIG. 34A.

FIG. 36B is a schematic cross-sectional view of the process continuing from FIG. 34B.

After forming the holes h and the slits ST, the mask layer 61 is removed by, for example, ashing. As shown in FIG. 36A and FIG. 36B, the side surface and upper end of the liner film 62 higher than the insulating layer 42 are exposed.

FIG. 37A is a schematic cross-sectional view of the process continuing from FIG. 36A.

FIG. 37B is a schematic cross-sectional view of the process continuing from FIG. 36B.

Then, as shown in FIG. 37A and FIG. 37B, an insulating film 145 is formed on the insulating layer 42, inside the holes h, and inside the slits ST. For example, a silicon oxide film is formed by CVD as the insulating film 145.

As shown in FIG. 37A, the insulating film 145 is filled completely into the holes h; and the columnar portions 45 are formed inside the holes h.

As shown in FIG. 37B, the insulating film 145 is formed conformally along the side surfaces and bottoms of the slits ST.

The following relationship exists between the width $L_{ST}$ of the slits ST, the diameter $\Phi_{HR}$ of the holes h, and the film thickness $T_{liner}$ of the insulating film 145.

$$\Phi_{HR} \leq 2 \times T_{liner}$$

$$2 \times T_{liner} < L_{ST}$$

Accordingly, the interiors of the holes h are filled with the insulating film 145; the slits ST are not filled with the insulating film 145; and spaces remain on the inner side of the insulating film 145 inside the slits ST.

As shown in FIG. 37A, the insulating film 145 covers the side surface and upper end of the portion of the liner film 62 higher than the insulating layer 42 formed at the peripheries of the columnar portions 45. The insulating film 145 is filled without a space between the liner film 62 formed at the peripheries of the columnar portions 45 on the insulating layer 42.

As shown in FIG. 37B, the insulating film 145 conformally covers the side surface and upper end of the portion of the liner film 62 higher than the insulating layer 42 formed with the slit ST interposed.

Then, isotropic etching of the insulating film 145 is performed.

Figure 38:
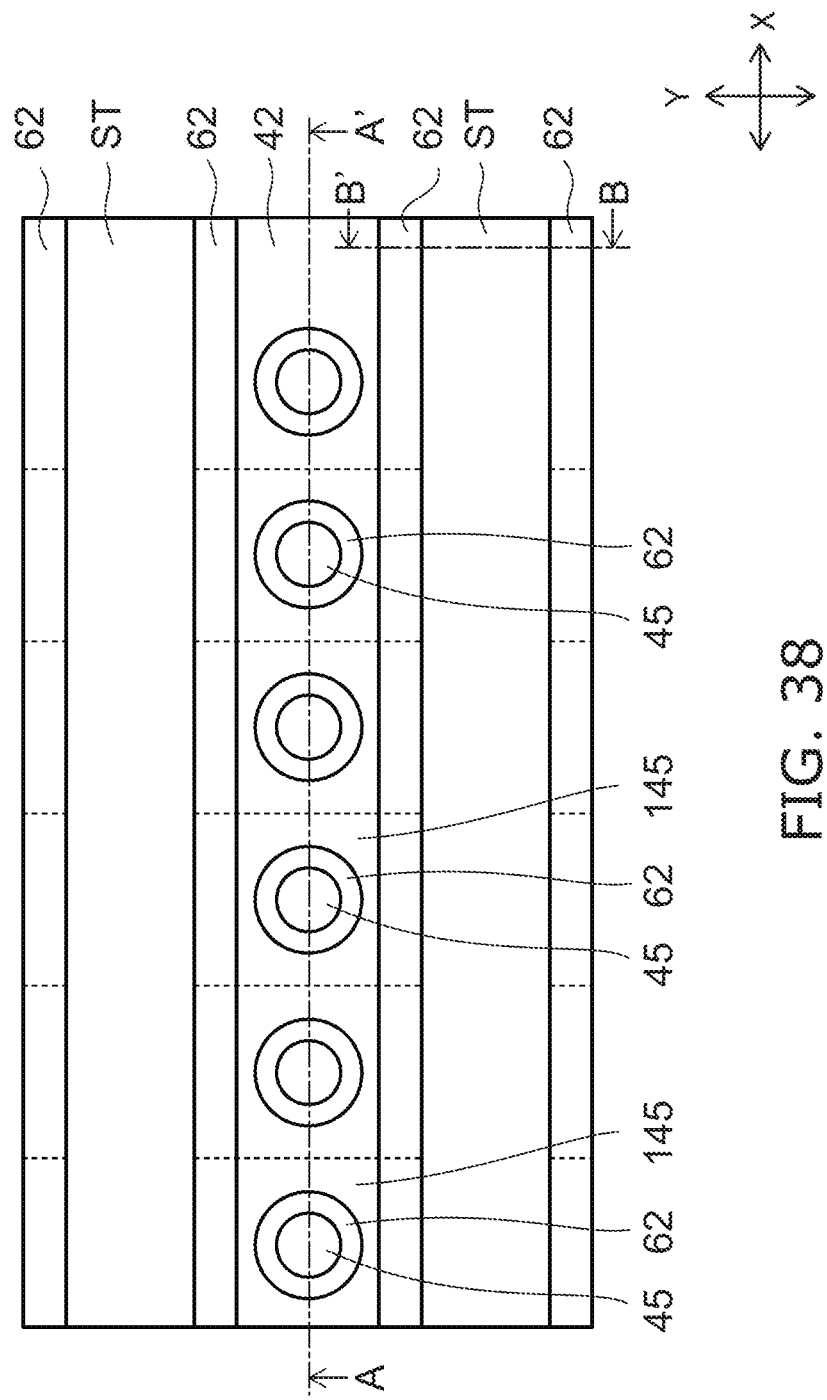
FIG. 38 is a schematic plan view showing a method for manufacturing the semiconductor device of the embodiment.

FIG. 38 is a schematic plan view of the stairstep region after the isotropic etching of the insulating film 145.

Figures 39A, 39B:
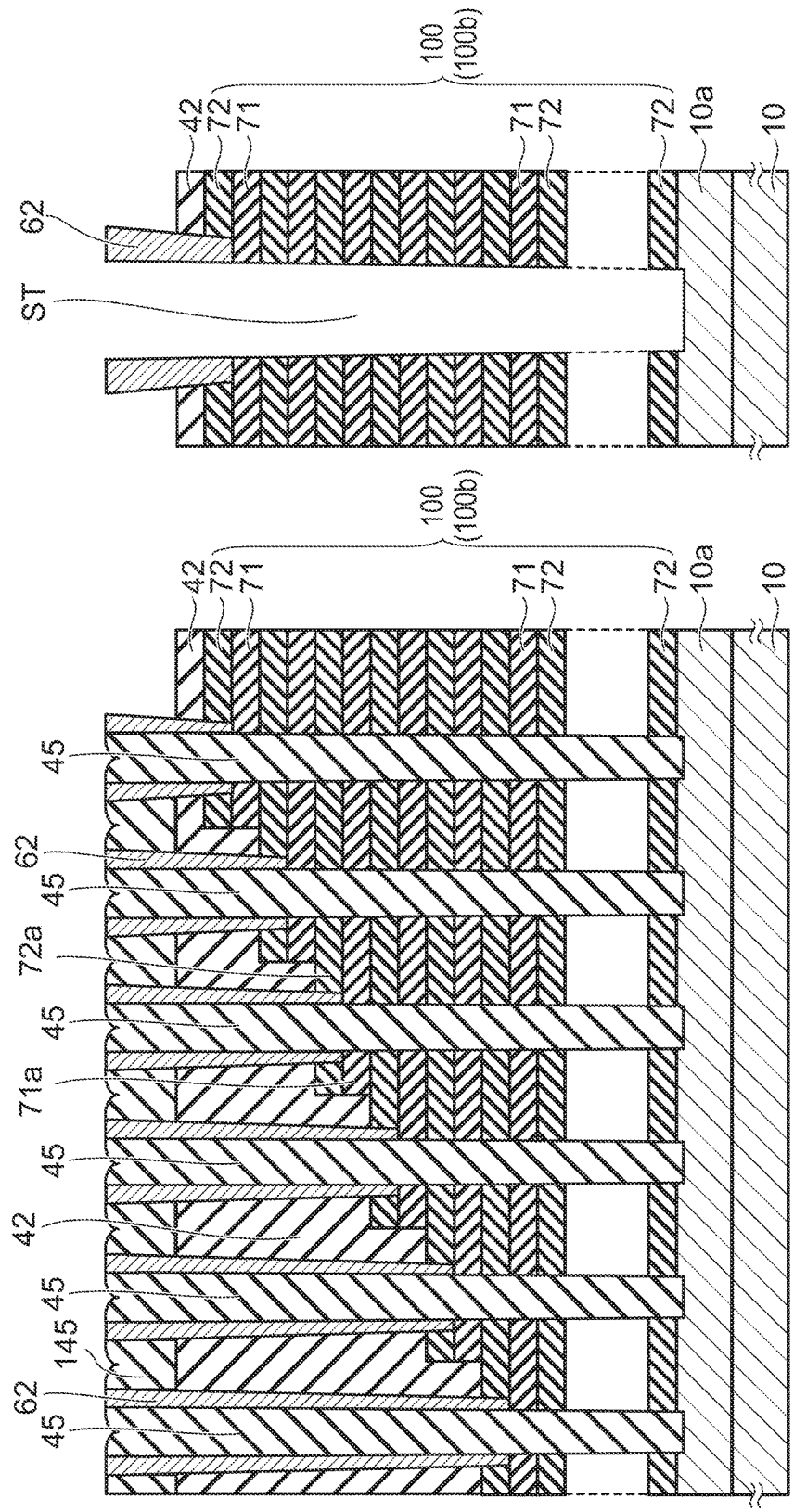

FIG. 39A is an A-A' cross-sectional view of FIG. 38.
FIG. 39B is a B-B' cross-sectional view of FIG. 38.

As shown in FIG. 39B, the insulating film 145 inside the slits ST is removed; and the sacrificial layers 71 are exposed at the side surfaces of the slits ST.

Then, the sacrificial layers 71 are removed by supplying an etchant or an etching gas to the slits ST. For example, the sacrificial layers 71 which are silicon nitride layers are removed using an etchant including phosphoric acid.

Figures 40A, 40B:
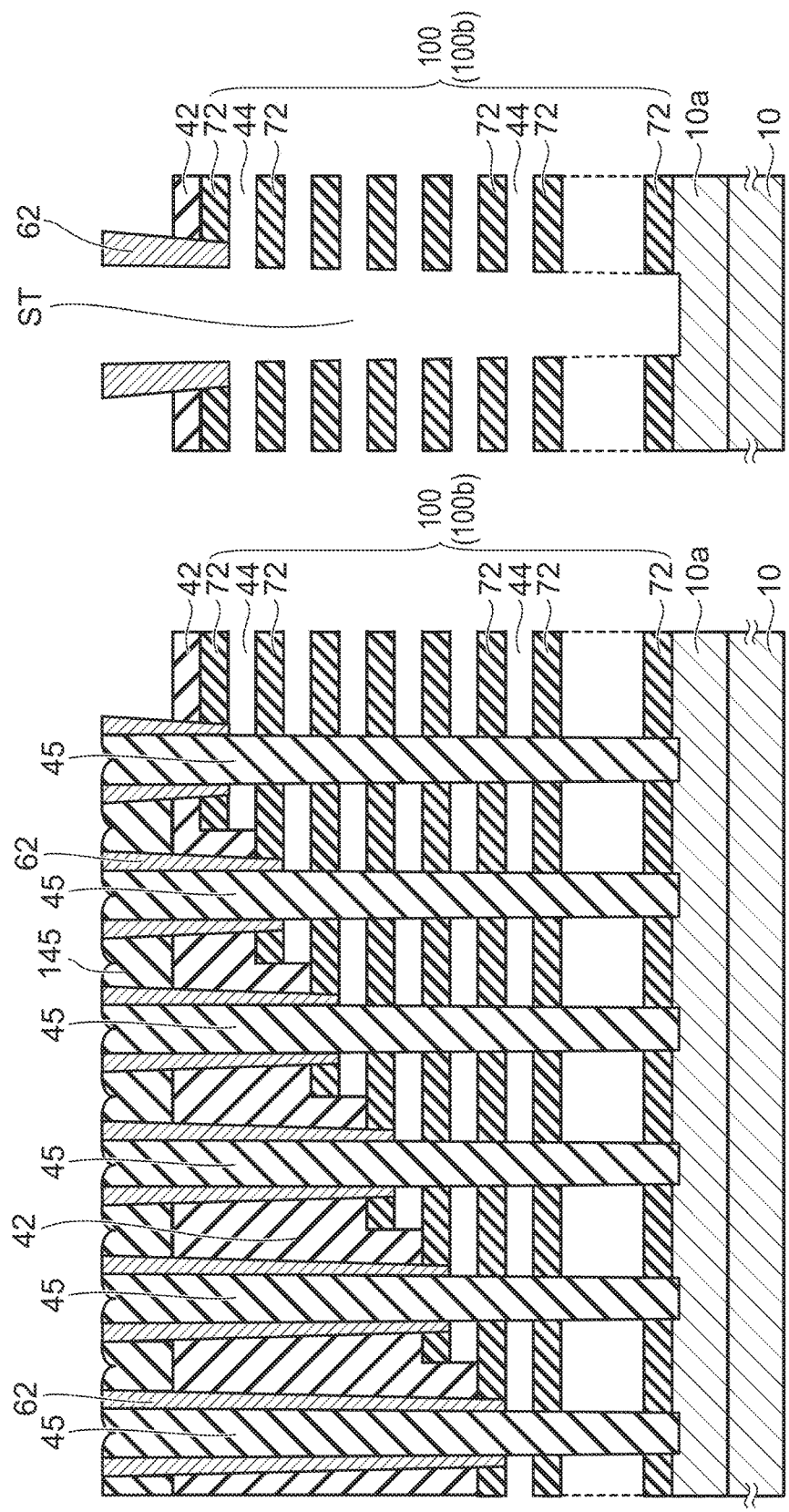

FIG. 40A is a schematic cross-sectional view of the process continuing from FIG. 39A.

FIG. 40B is a schematic cross-sectional view of the process continuing from FIG. 39B.

The sacrificial layers 71 are removed; and as shown in FIG. 40A and FIG. 40B, the gaps 44 are formed between the insulating layers 72 adjacent to each other above and below. At this time, in the cell array region as well, the gaps 44 are formed between the insulating layers 72 as shown in FIG. 18 described above by etching of the sacrificial layers 71 through the slits ST.

The insulating layers 72 of the second stacked portion 100b surround the side surfaces of the columnar portions 45. The insulating layers 72 of the second stacked portion 100b are supported by the physical bond with the columnar portions 45; and the gaps 44 between the insulating layers 72 are maintained.

FIG. 41A is a schematic cross-sectional view of the process continuing from FIG. 40A.

FIG. 41B is a schematic cross-sectional view of the process continuing from FIG. 40B.

As shown in FIG. 41A and FIG. 41B, the electrode layers 70 are formed in the gaps 44. As shown in FIG. 19, the electrode layers 70 are formed in the gaps 44 of the cell array region as well.

For example, tungsten layers or molybdenum layers are formed by CVD as the electrode layers 70. The source gas and the reducing gas are supplied to the gaps 44 through the slits ST.

As shown in FIG. 7, there are also cases where the second blocking film (the metal oxide film) 35 is formed on the inner wall of the gap 44 prior to forming the electrode layer 70. The electrode layer 70 is formed on the inner side of the second blocking film 35.

Or, as shown in FIG. 8, the electrode layer 70 may be formed inside the gap 44 without having the second blocking film 35 interposed.

A metal nitride film may be formed between the second blocking film 35 and the electrode layer 70, or between the insulating layer 72 and the electrode layer 70.

The sacrificial layers 71 that have the terrace portions 71a are replaced with the electrode layers 70 that have the terrace portions 70a. As shown in FIG. 41A, the electrode layers 70 have the terrace portions 70a arranged in a stairstep configuration having differences in levels.

The electrode layers 70 formed on the side surfaces of the slits ST are removed by, for example, dry etching.

FIG. 42A is a schematic cross-sectional view of the process continuing from FIG. 41A.

FIG. 42B is a schematic cross-sectional view of the process continuing from FIG. 41B.

As shown in FIG. 42A, the insulating layer 43 is formed on the insulating layer 42. The insulating layer 43 covers the liner film 62, the columnar portions 45, and the insulating film 145 between the liner film 62. In this drawing and subsequent drawings, the insulating layers on the insulating layer 42 including the insulating film 145 as well are shown collectively as the insulating layer 43.

The insulating layer 43 is, for example, a silicon oxide layer formed by CVD or coating.

As shown in FIG. 42B, the insulating layer 43 is filled into the slits ST. The insulating layer 43 covers the liner film 62 at the sides of the slits ST.

Figure 43:
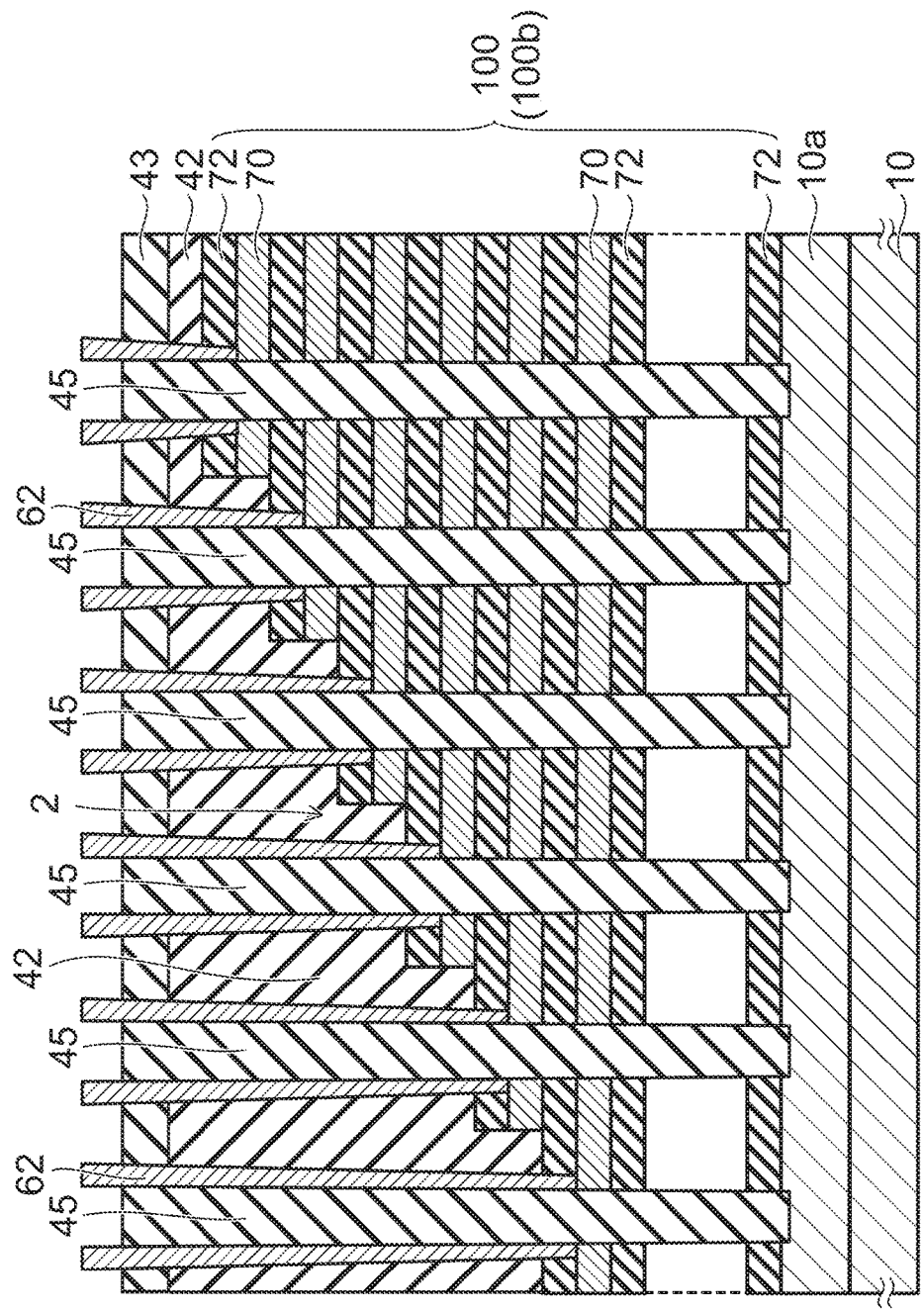

FIG. 43 is a schematic cross-sectional view of the process continuing from FIG. 42A.

The insulating layer 43 on the stairstep portion 2 is etched in the state in which the insulating layer 43 on the slits ST and the insulating layer 43 at the slit ST vicinity are covered with a not-shown resist film. The upper ends of the columnar portions 45 of the same type of silicon oxide as the insulating layer 43 also are recessed. As shown in FIG. 43, the upper portion of the liner film 62 at the peripheries of the columnar portions 45 is exposed.

Figure 44:
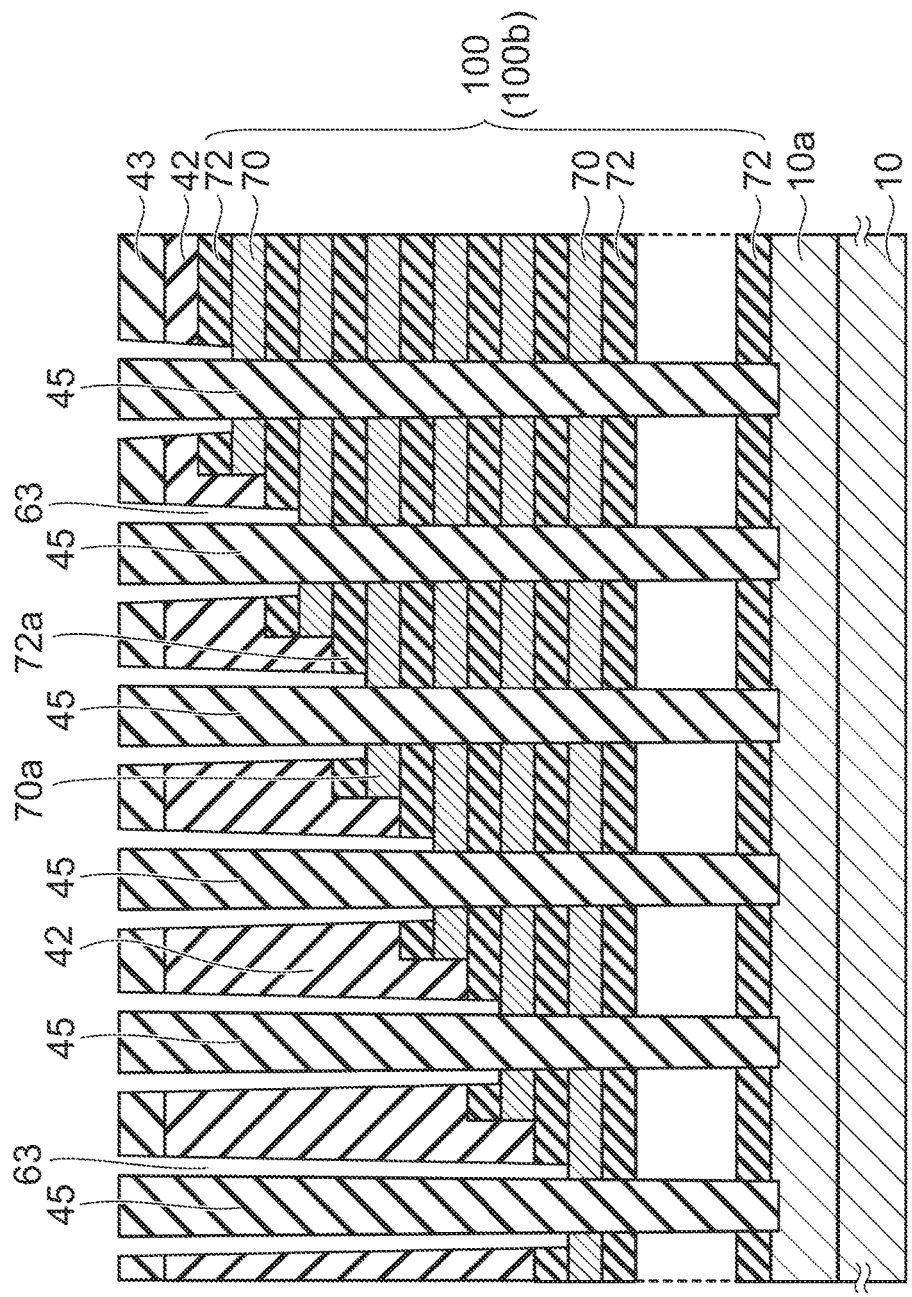

FIG. 44 is a schematic cross-sectional view of the process continuing from FIG. 43.

Then, the liner film 62 is removed by etching. For example, the liner film 62 which is a silicon film is removed using an alkaline-based etchant. The liner film 62 is removed; and as shown in FIG. 44, spaces 63 are formed around the columnar portions 45. The spaces 63 surround, in tubular configurations, the peripheries of the columnar portions 45 above the terrace portions 70a. The terrace portions 70a are exposed at the bottoms of the spaces 63.

Or, in the case where the second blocking films 35 are formed in the gaps 44 between the insulating layers 72 prior to forming the electrode layers 70, the second blocking film 35 are exposed at the bottoms of the spaces 63.

Figure 45:
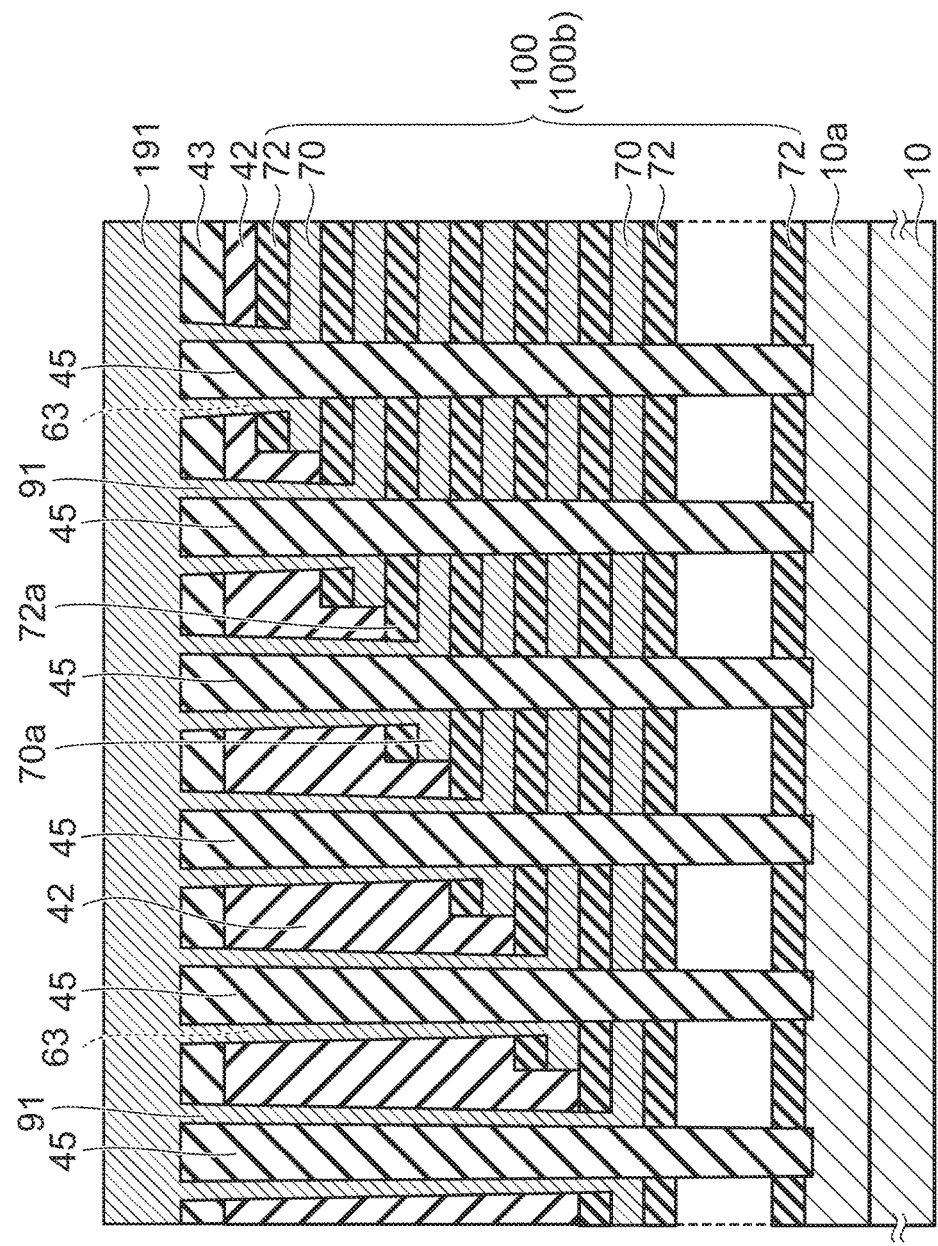

FIG. 45 is a schematic cross-sectional view of the process continuing from FIG. 44.

As shown in FIG. 45, the contact portions 91 connected to the terrace portions 70a of the electrode layers 70 are formed by forming a conductive film 191 on the insulating layer 43 and in the spaces 63. For example, a tungsten film or a molybdenum film is formed by CVD as the conductive film 191.

In the case where the second blocking films 35 are formed in the gaps 44 between the insulating layers 72, the second blocking films 35 at the bottoms of the spaces 63 are removed by etching prior to forming the conductive film 191. Subsequently, the conductive film 191 is formed in the spaces 63; and as shown in FIG. 7, the contact portions 91 connected to the terrace portions 70a are formed.

FIG. 8 shows the connection portion between the contact portion 91 and the terrace portion 70a formed by processes in which the second blocking film 35 is not formed in the gap 44 between the insulating layers 72.

For example, the conductive film 191 formed on the insulating layer 43 is removed by etch-back by RIE. The conductive film 191 on the insulating layer 43 is removed; and the multiple contact portions 91 are divided as shown in FIG. 46A.

Figures 46A, 46B:
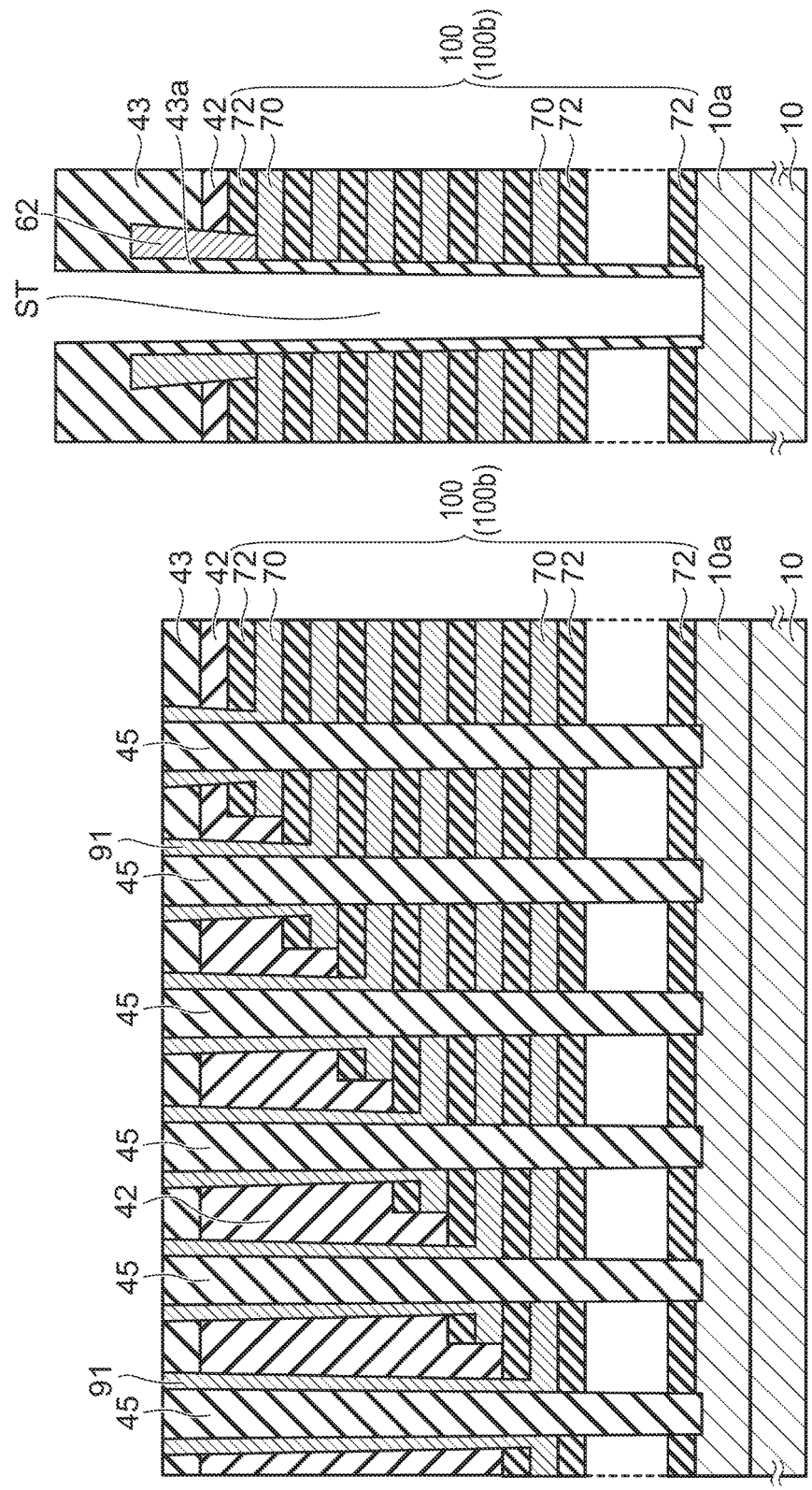

A portion of the insulating layer 43 filled into the slits ST in the process shown in FIG. 42B is removed; and as shown in FIG. 46B, a portion of the insulating layer 43 remains as the insulating film 43a on the side surfaces of the slits ST. Subsequently, the interconnect portion LI shown in FIG. 10B is formed inside the slits ST.

Or, after removing the entire insulating layer 43 filled into the slits ST, an insulating film may be formed on the side surfaces of the slits ST; and the interconnect portion LI may be formed on the inner side of the insulating film.

According to the embodiment, because the columnar portion 45 and the contact portion 91 overlap in concentric circular configurations, the lithography for forming the hole pattern corresponding to the columnar portions 45 and the contact portions 91 can be only one lithography.

Also, the memory holes MH in the cell array region and the holes h in the stairstep region can be formed by separate processes to have the size, density, and processes suited to each; and it becomes possible to reduce the degree of difficulty of the processes of forming the memory holes MH and the holes h with high precision.

The liner film 62 may be exposed to the multiple etching processes in the processes shown in FIG. 30 to FIG. 43. In the embodiment recited above, such a liner film 62 does not remain; and the conductive film formed after removing the liner film 62 is used as the contact portions 91. Therefore, the low-resistance contact portions 91 can be formed with low foreign matter and low damage due to etching.

Another method for forming the columnar portions 45 and the contact portions 91 will now be described.

The processes up to the processes shown in FIG. 20 to FIG. 29B are performed similarly to the embodiment recited above; and the holes h1 and the slits ST1 are formed as shown in FIG. 47A and FIG. 47B.

FIG. 47A is a schematic cross-sectional view corresponding to the process of FIG. 31A; and FIG. 47B is a schematic cross-sectional view corresponding to the process of FIG. 31B.

As shown in FIG. 47A and FIG. 47B, the liner film 191 is formed inside the holes h1 and inside the slits ST1.

The liner film 191 is a conductive film. For example, a tungsten film or a molybdenum film is formed by CVD as the liner film 191. The liner film 191 is formed conformally along the side surfaces and bottoms of the holes h1. The liner film 191 is formed conformally along the side surfaces and bottoms of the slits ST1. Also, the liner film 191 is formed on the upper surface of the mask layer 61.

Spaces remain on the inner side of the liner film 191 inside the holes h1 and on the inner side of the liner film 191 inside the slits ST1.

FIG. 48A to FIG. 54A are schematic cross-sectional views corresponding to FIG. 47A; and FIG. 48B to FIG. 54B are schematic cross-sectional views corresponding to FIG. 47B.

For example, etch-back of the liner film 191 is performed by RIE; and the liner film 191 on the bottoms of the holes h1 and the bottoms of the slits ST1 is removed as shown in FIG. 48A and FIG. 48B. The liner film 191 on the mask layer 61 also is removed.

The terrace portions 71a of the sacrificial layers 71 are exposed at the bottoms of the holes h1 and the bottoms of the slits ST1. The liner film 191 remains on the side surfaces of the holes h1 and the side surfaces of the slits ST1.

Then, the second stacked portion 100b under the holes h1 and the second stacked portion 100b under the slits ST1 are etched by RIE using the mask layer 61 and the liner film 191 as a mask.

Figures 49A, 49B:
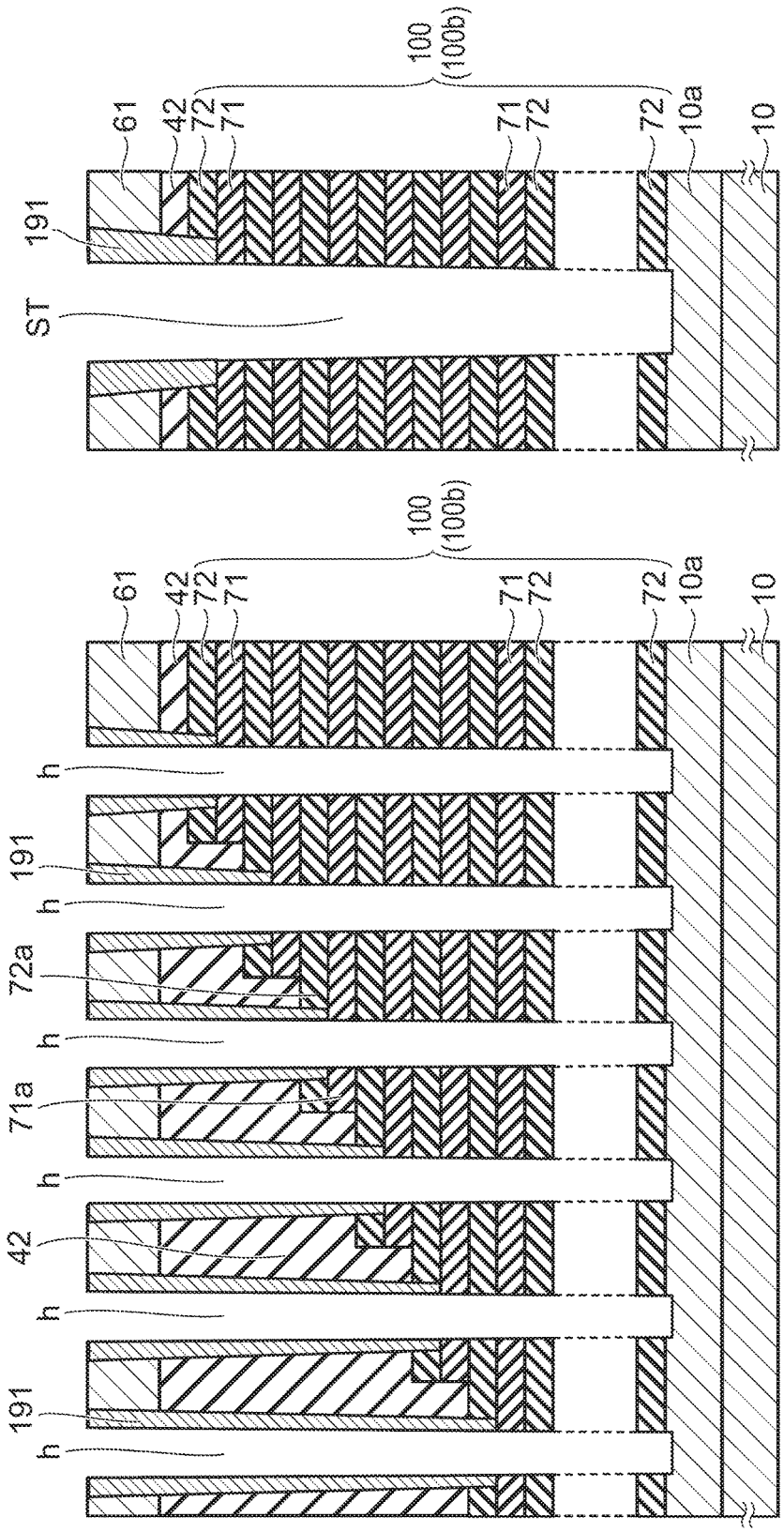

The holes h and the slits ST are formed as shown in FIG. 49A and FIG. 49B.

The holes h and the slits ST extend in the stacking direction on the inner side of the liner film 191 and through the second stacked portion 100b, and reach the active region 10a of the substrate 10. The depths of the multiple holes h are substantially the same. The liner film 191 surrounds, in tubular configurations, the periphery of the holes h higher than the terrace portions 71a of the sacrificial layers 71.

The diameter $\Phi_{HR}$ of the holes h is smaller than the diameter $\Phi_{CC}$ of the holes h1 in the state prior to forming the liner film 191. The width $L_{ST}$ of the slits ST is greater than the diameter $\Phi_{HR}$ of the holes h and the diameter $\Phi_{CC}$ of the holes h1.

After forming the holes h and the slits ST, for example, the mask layer 61 is removed by ashing. As shown in FIG. 50A and FIG. 50B, the side surface and upper end of the liner film 191 higher than the insulating layer 42 are exposed.

Figures 51A, 51B:
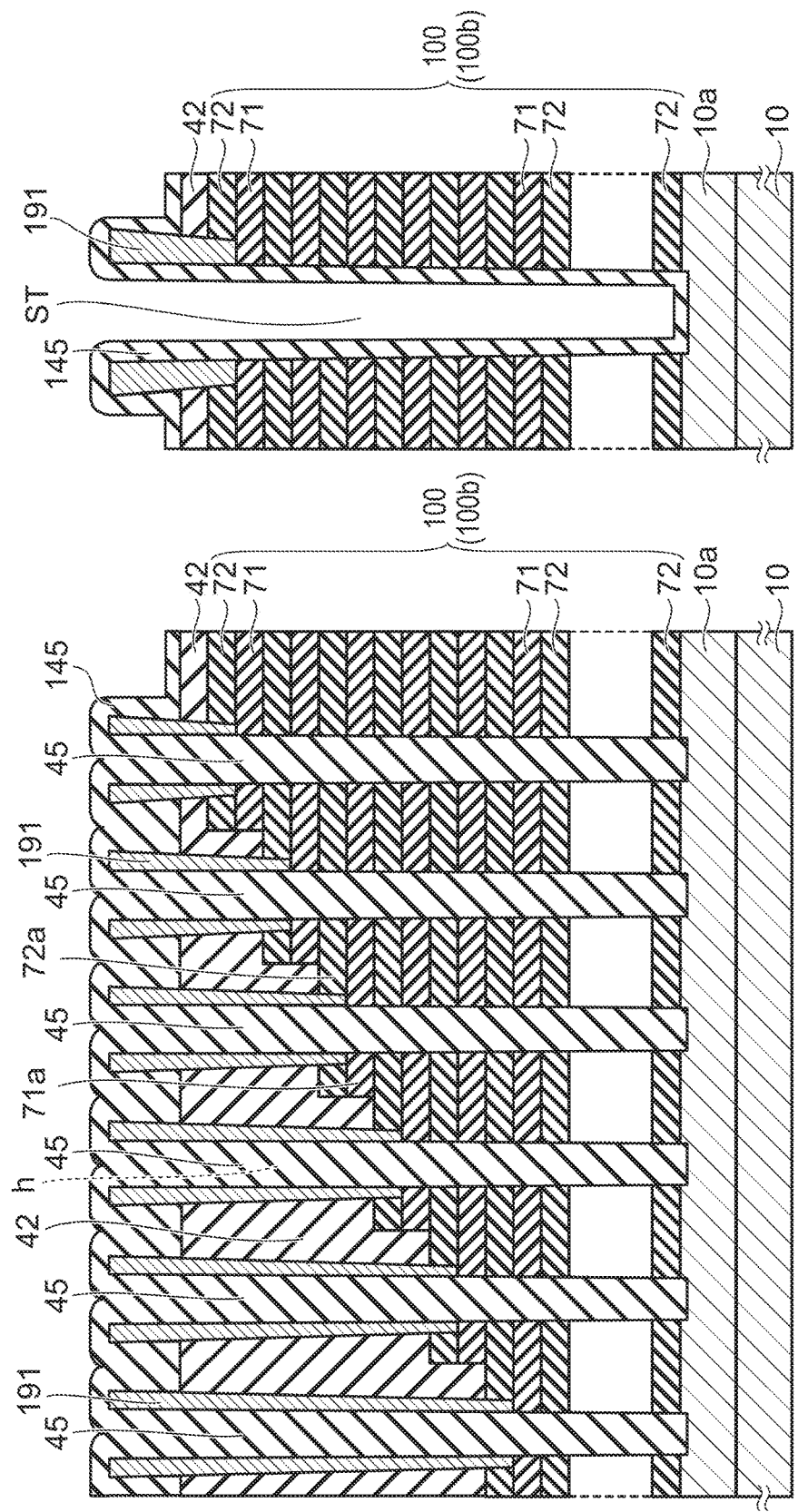

Then, as shown in FIG. 51A and FIG. 51B, the insulating film 145 is formed on the insulating layer 42, inside the holes h, and inside the slits ST. The insulating film 145 is filled completely into the holes h; and the columnar portions 45 are formed inside the holes h. The insulating film 145 is formed conformally along the side surfaces and bottoms of the slits ST. The slits ST are not filled with the insulating film 145; and spaces remain inside the slits ST and on the inner side of the insulating film 145.

The insulating film 145 covers the side surface and upper end of the portion of the liner film 191 higher than the insulating layer 42 formed at the peripheries of the columnar portions 45. The insulating film 145 is filled without a space between the liner film 191 formed at the peripheries of the columnar portions 45 on the insulating layer 42. The insulating film 145 conformally covers the side surface and upper end of the portion of the liner film 191 higher than the insulating layer 42 formed at the sides of the slits ST.

Figures 52A, 52B:
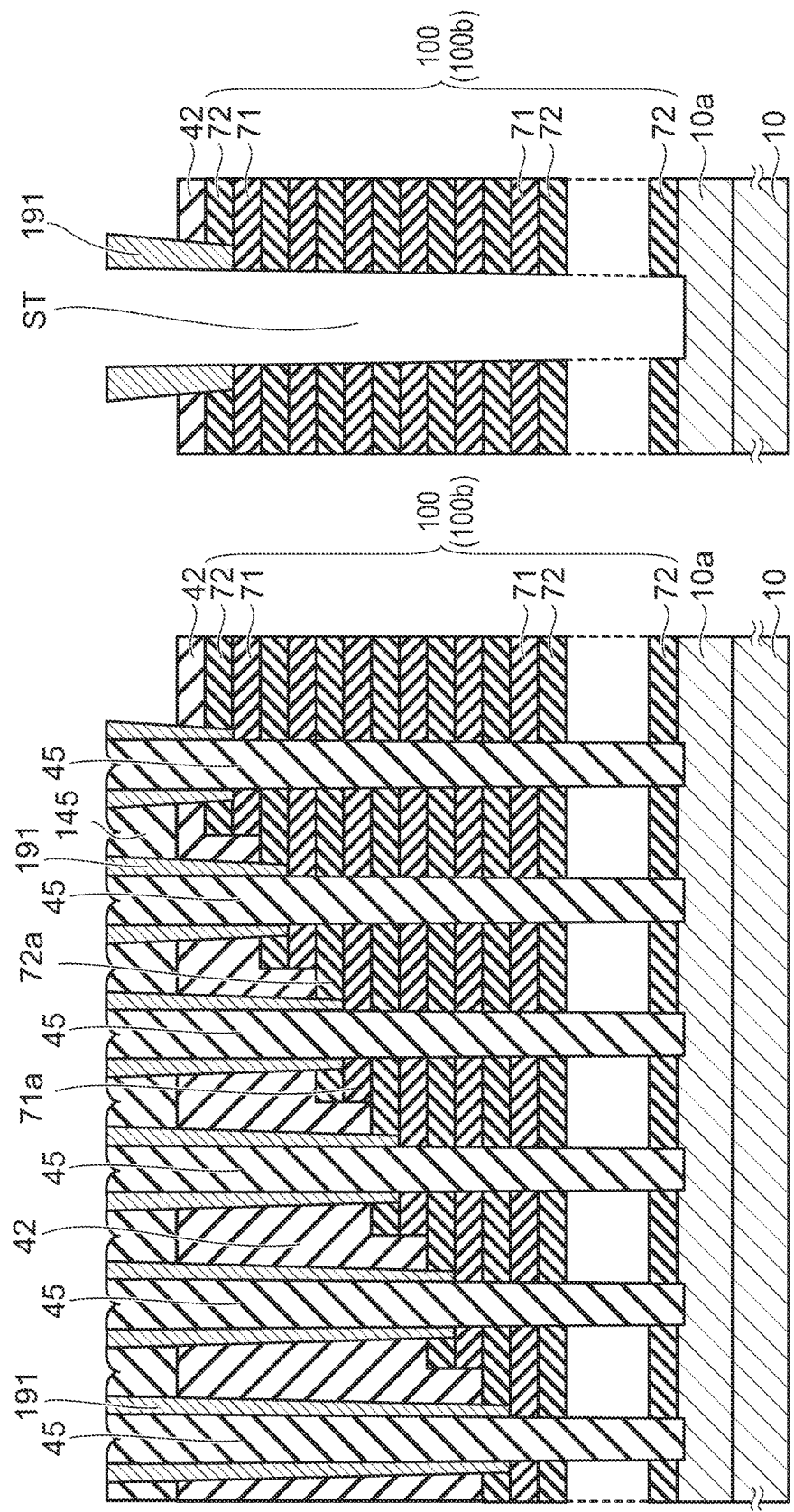

Then, isotropic etching of the insulating film 145 is performed. As shown in FIG. 52B, the insulating film 145 that is inside the slits ST is removed; and the sacrificial layers 71 are exposed at the side surfaces of the slits ST. The columnar portions 45 remain as shown in FIG. 52A.

Then, the sacrificial layers 71 are removed by supplying an etchant or an etching gas to the slits ST. For example, the sacrificial layers 71 which are silicon nitride layers are removed using an etchant including phosphoric acid.

Figures 53A, 53B:
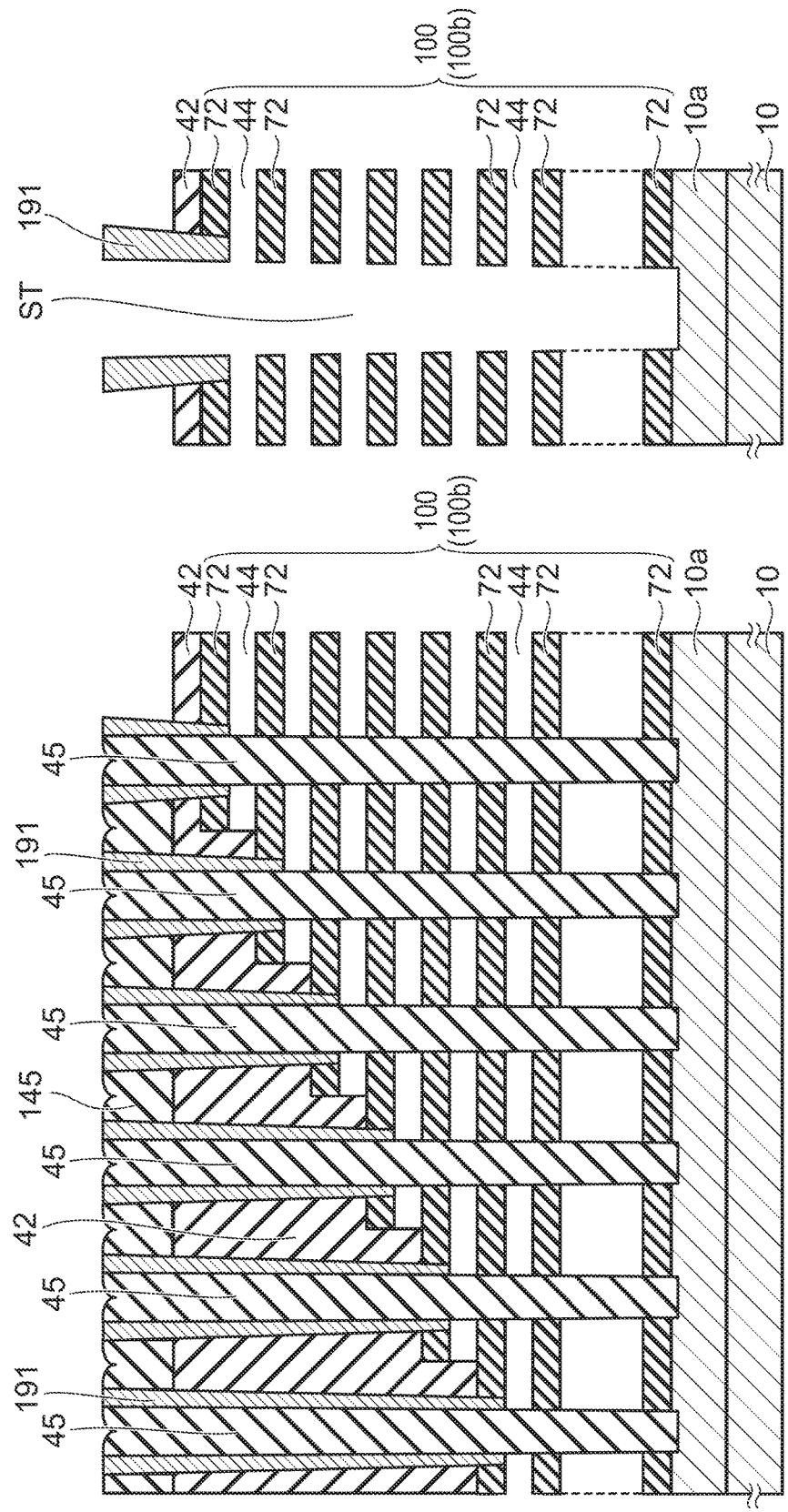

The sacrificial layers 71 are removed; and as shown in FIG. 53A and FIG. 53B, the gaps 44 are formed between the insulating layers 72 adjacent to each other above and below.

As shown in FIG. 54A and FIG. 54B, the electrode layers 70 are formed in the gaps 44. The sacrificial layers 71 having the terrace portions 71a are replaced with the electrode layers 70 having the terrace portions 70a.

The liner film 191 surrounding the periphery of the columnar portions 45 above the terrace portions 71a of the sacrificial layers 71 remains as the contact portions 91 connected to the terrace portions 70a of the electrode layers 70. A process that replaces the liner film 191 with conductive films for the contact portions is unnecessary.

The electrode layers 70 formed at the side surfaces of the slits ST are removed by, for example, dry etching. Subsequently, the insulating film 43a described above is formed at the side surfaces of the slits ST; and the interconnect portion LI is formed on the inner side of the insulating film 43a.

Still another method for forming the columnar portions 45 and the contact portions 91 will now be described.

The processes up to the processes shown in FIG. 20 to FIG. 40B are performed similarly to the embodiment recited above. Namely, the gaps 44 are formed between the insulating layers 72 as shown in FIG. 40A and FIG. 40B.

Subsequently, the liner film 62 is removed. For example, the liner film 62 which is a silicon film is removed using an alkaline-based etchant supplied through the slits ST and the gaps 44.

The liner film 62 is removed; and as shown in FIG. 55A corresponding to the cross section of FIG. 40A, the spaces 63 are formed around the columnar portions 45. The spaces 63 communicate with the gaps 44.

The liner film 62 formed at the sides of the slits ST also is removed as shown in FIG. 55B corresponding to the cross section of FIG. 40B.

A conductive material is formed in the gaps 44 and the spaces 63; and the electrode layers 70 and the contact portions 91 are formed as shown in FIG. 56A of the cross section corresponding to FIG. 55A.

The electrode layers 70 and the contact portions 91 are formed simultaneously of the same conductive material. For example, tungsten or molybdenum is formed by CVD as the conductive material. As shown in FIG. 8, the contact portions 91 and the electrode layers 70 are connected (continuous) as one body.

Or, in the case where the memory cell MC shown in FIG. 4A is formed, the second blocking film 35 is formed as shown in FIG. 9 on the inner wall of the gap 44 and the inner wall of the space 63 prior to forming the conductive material. The electrode layer 70 and the contact portion 91 are formed as one body on the inner side of the second blocking film 35.

The liner film 62 that may be exposed to multiple etching processes is replaced with the contact portions 91. Therefore, the low-resistance contact portions 91 can be formed with low foreign matter and low damage due to etching.

Also, in the example recited above in which the liner film 191 of a tungsten film or a molybdenum film is used, the liner film 191 may be removed; and the contact portions 91 of tungsten films or molybdenum films may be formed. In such a case as well, the low-resistance contact portions 91 are obtained with low foreign matter and low damage due to etching.

In the case where the liner film is replaced with the contact portions 91, it is sufficient for the liner film to be of a material different from the columnar portions 45, the insulating layer 42, and the insulating layers 72.

An example in which a silicon nitride film that is the same material as the sacrificial layers 71 is used as the liner film will now be described with reference to FIG. 57A to FIG. 62B.

FIG. 57A, FIG. 58A, FIG. 59A, FIG. 60A, FIG. 61A, and FIG. 62A are cross-sectional views respectively corresponding to the cross sections of FIG. 31A, FIG. 32A, FIG. 34A, FIG. 36A, FIG. 37A, and FIG. 39A.

FIG. 57B, FIG. 58B, FIG. 59B, FIG. 60B, FIG. 61B, and FIG. 62B are cross-sectional views respectively corresponding to the cross sections of FIG. 31B, FIG. 32B, FIG. 34B, FIG. 36B, FIG. 37B, and FIG. 39B.

The processes up to the processes that form the holes h1 and the slits ST1 are performed similarly to the embodiment recited above. Subsequently, as shown in FIG. 57A and FIG. 57B, a liner film 65 of a silicon nitride film is formed inside the holes h1 and inside the slits ST1.

The liner film 65 is formed conformally along the side surfaces and bottoms of the holes h1. The liner film 65 is formed conformally along the side surfaces and bottoms of the slits ST1. Also, the liner film 65 is formed on the upper surface of the mask layer 61.

Spaces remain on the inner side of the liner film 65 inside the holes h1 and on the inner side of the liner film 65 inside the slits ST1.

For example, etch-back of the liner film 65 is performed by RIE; and as shown in FIG. 58A and FIG. 58B, the liner film 65 on the bottoms of the holes h1 and the bottoms of the slits ST1 is removed. The liner film 65 on the mask layer 61 also is removed.

The terrace portions 71a of the sacrificial layers 71 are exposed at the bottoms of the holes h1 and the bottoms of the slits ST1. The liner film 65 remains on the side surfaces of the holes h1 and the side surfaces of the slits ST1.

Then, the second stacked portion 100b under the holes h1 and the second stacked portion 100b under the slits ST1 are etched by RIE. As shown in FIG. 59A and FIG. 59B, the holes h and the slits ST are formed in the stairstep region.

The upper end of the liner film 65 of the same material as the sacrificial layers 71 also is recessed when etching the sacrificial layers 71 of the second stacked portion 100b. By setting the thickness of the mask layer 61 to be thick, the recessed position of the upper end of the liner film 65 can be set to be inside the mask layer 61.

As shown in FIG. 59A, the holes h extend in the stacking direction on the inner side of the liner film 65 and through the second stacked portion 100b and reach the active region 10a of the substrate 10. The depths of the holes h are substantially the same. The liner film 65 surrounds, in tubular configurations, the periphery of the holes h higher than the terrace portions 71a of the sacrificial layers 71.

The diameter $\Phi_{HR}$ of the holes h is smaller than the diameter $\Phi_{CC}$ of the holes h1 in the state prior to forming the liner film 65. The width $L_{ST}$ of the slits ST is greater than the diameter $\Phi_{HR}$ of the holes h and the diameter $\Phi_{CC}$ of the holes h1.

After forming the holes h and the slits ST, the mask layer 61 is removed by, for example, ashing. As shown in FIG. 60A and FIG. 60B, the side surface and upper end of the liner film 65 that are higher than the insulating layer 42 are exposed.

Figures 61A, 61B:
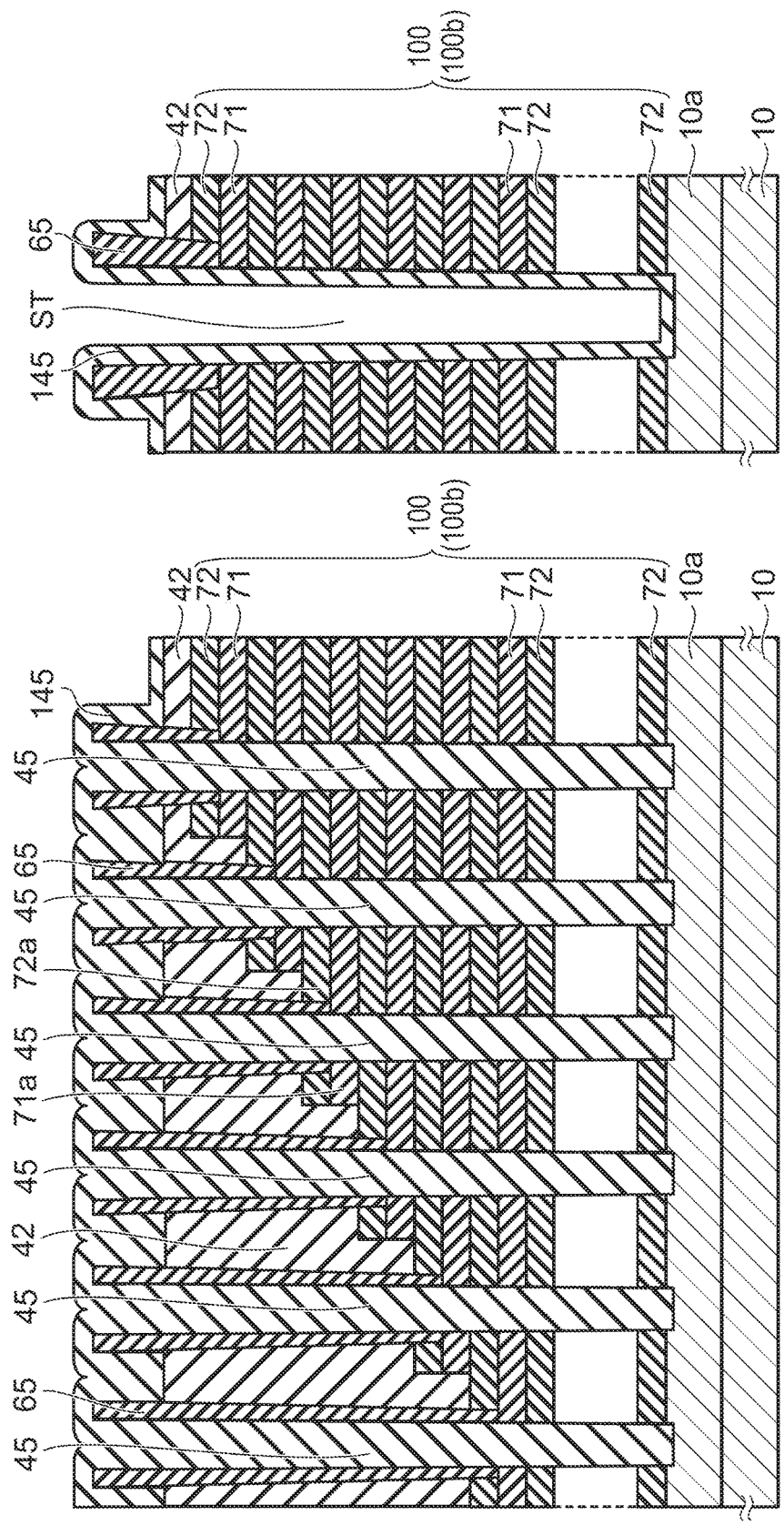

Then, as shown in FIG. 61A and FIG. 61B, the insulating film 145 is formed on the insulating layer 42, inside the holes h, and inside the slits ST. For example, a silicon oxide film is formed by CVD as the insulating film 145.

The insulating film 145 is filled completely into the holes h; and the columnar portions 45 are formed inside the holes h. The insulating film 145 is formed conformally along the side surfaces and bottoms of the slits ST. The slits ST are not filled with the insulating film 145; and spaces remain on the inner side of the insulating film 145 inside the slits ST.

The insulating film 145 covers the side surface and upper end of the portion of the liner film 65 higher than the insulating layer 42 formed at the peripheries of the columnar portions 45. The insulating film 145 is filled without a space between the liner film 65 formed at the peripheries of the columnar portions 45 on the insulating layer 42. The insulating film 145 conformally covers the side surface and upper end of the portion of the liner film 65 higher than the insulating layer 42 formed at the sides of the slits ST.

Then, isotropic etching of the insulating film 145 is performed. As shown in FIG. 62B, the insulating film 145 inside the slits ST is removed; and the sacrificial layers 71 are exposed at the side surfaces of the slits ST. The columnar portions 45 remain as shown in FIG. 62A.

Then, the sacrificial layers 71 and the liner film 65 are removed by supplying, for example, an etchant including phosphoric acid to the slits ST.

The sacrificial layers 71 and the liner film 65 are removed; and the gaps 44 and the spaces 63 are formed simultaneously as shown in FIG. 55A and FIG. 55B.

Then, as shown in FIG. 56A and FIG. 56B, the electrode layers 70 and the contact portions 91 are formed in the gaps 44 and the spaces 63.

The electrode layers 70 and the contact portions 91 are formed simultaneously of the same conductive material. For example, tungsten or molybdenum is formed by CVD as the conductive material. As shown in FIG. 8, the contact portions 91 and the electrode layers 70 are connected (continuous) as one body.

Or, in the case where the memory cell MC shown in FIG. 4A is formed, the second blocking films 35 are formed as shown in FIG. 9 on the inner walls of the gaps 44 and the inner walls of the spaces 63 prior to forming the conductive material. The electrode layers 70 and the contact portions 91 are formed as one body on the inner sides of the second blocking films 35.

The liner film 65 that may be exposed to multiple etching processes is replaced with the contact portions 91. Therefore, the low-resistance contact portions 91 can be formed with low foreign matter and low damage due to etching.

In the embodiment described above, the insulating layers 72 may be removed by etching through the slits ST prior to plugging the slits ST. For example, the insulating layers 72 which are silicon oxide layers can be removed using an etchant including hydrofluoric acid.

Figure 63:
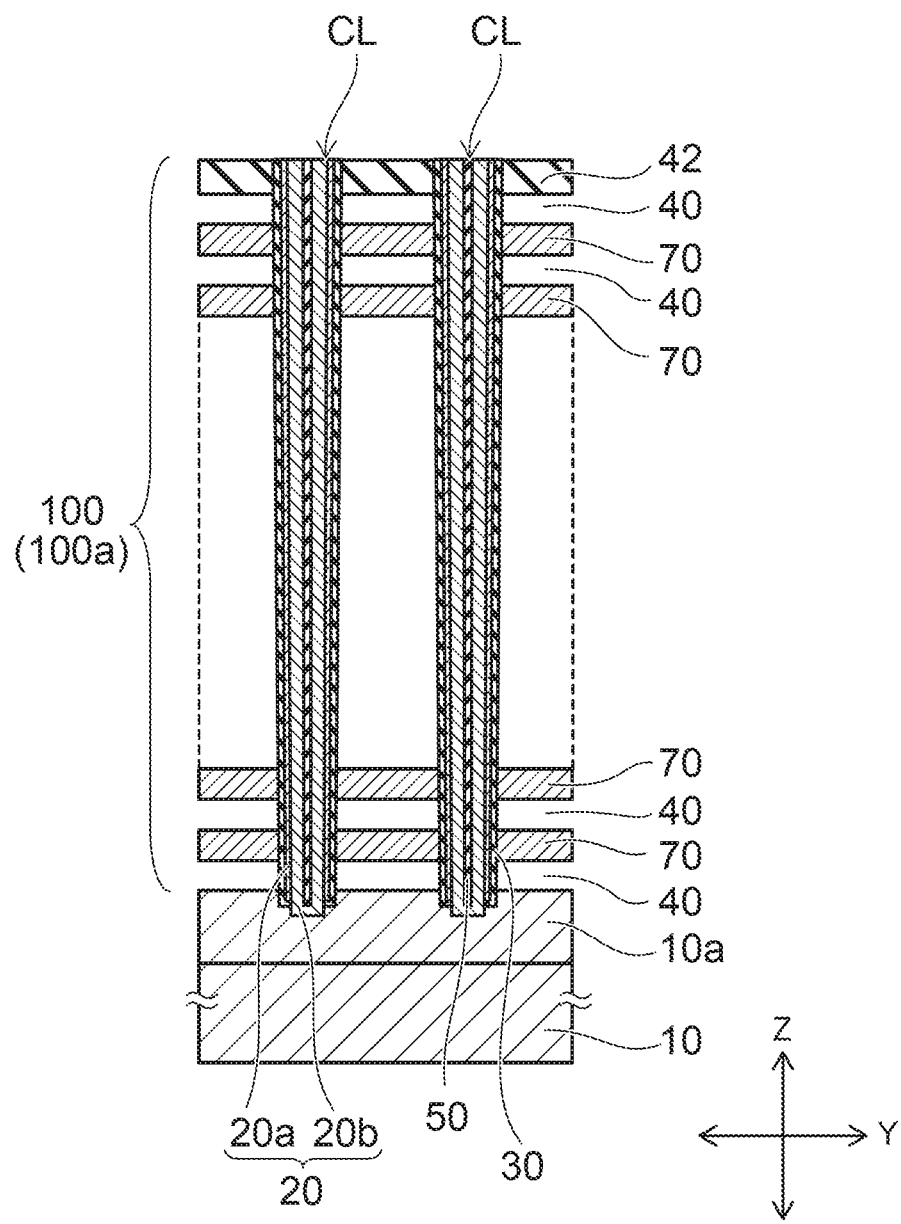
FIG. 63 is a schematic cross-sectional view of a memory cell array of the semiconductor device of the embodiment.

The insulating layers 72 are removed; and as shown in FIG. 63, gaps 40 are formed as an insulator between the electrode layers 70 of the cell array region. The gaps 40 are formed also between the electrode layers 70 of the second stacked portion 100b where the stairstep portion 2 is formed.

The electrode layers 70 of the first stacked portion 100a are supported by the physical bond with the columnar portions CL; the electrode layers 70 of the second stacked portion 100b are supported by the physical bond with the columnar portions 45; and the gaps 40 between the electrode layers 70 are maintained.

The gaps 40 are formed between the electrode layers 70 which are the control gates of the memory cells MC adjacent to each other in the stacking direction. The gaps (air gaps) 40 having lower dielectric constant than an insulating film such as a silicon oxide film, etc., reduce the interconnect capacitance between the electrode layers 70 above and below and make high-speed operations of the memory cells MC possible. Further, interference between adjacent cells such as the threshold fluctuation due to capacitive coupling between the electrode layers 70 above and below, etc., can be suppressed.

Also, in the process of forming the stacked body 100 on the substrate 10, the electrode layers 70 may be formed as the first layers; and sacrificial layers may be formed as the second layers. After forming the columnar portions CL, the columnar portions 45, etc., described above for the stacked body 100 including the electrode layers 70 and the sacrificial layers, the sacrificial layers may be removed; and the gaps 40 may be formed between the electrode layers 70.

Figure 64:
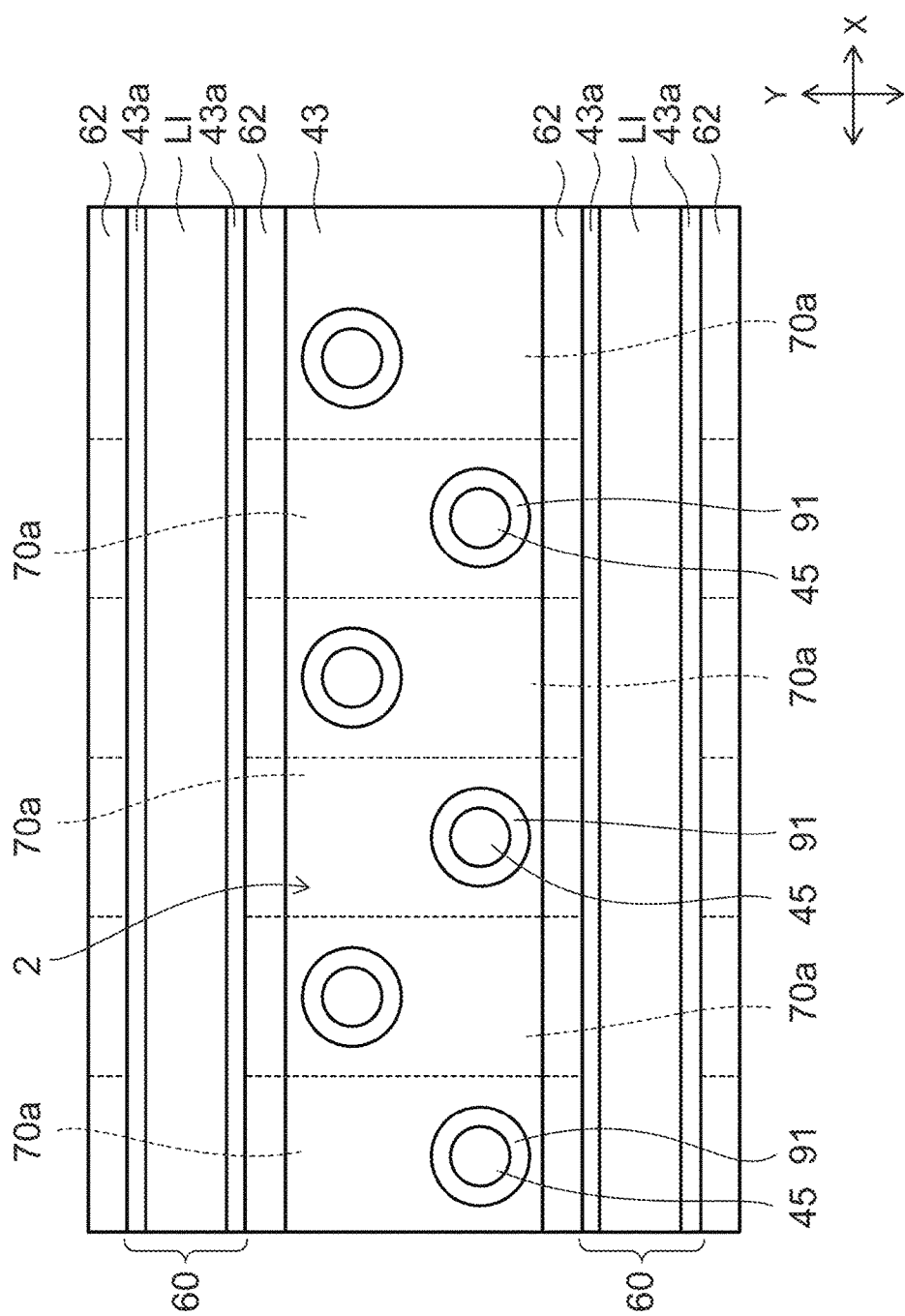
FIG. 64 is a schematic plan view of a stairstep portion of the semiconductor device of the embodiment.

FIG. 64 is a schematic plan view showing another example of the planar layout of the columnar portions 45 and the contact portions 91.

In the layout of FIG. 64, the position in the Y-direction of the pair of the columnar portion 45 and the contact portion 91 overlapping in concentric circular configurations is shifted between the terrace portions 70a adjacent to each other in the X-direction.

Figure 65:
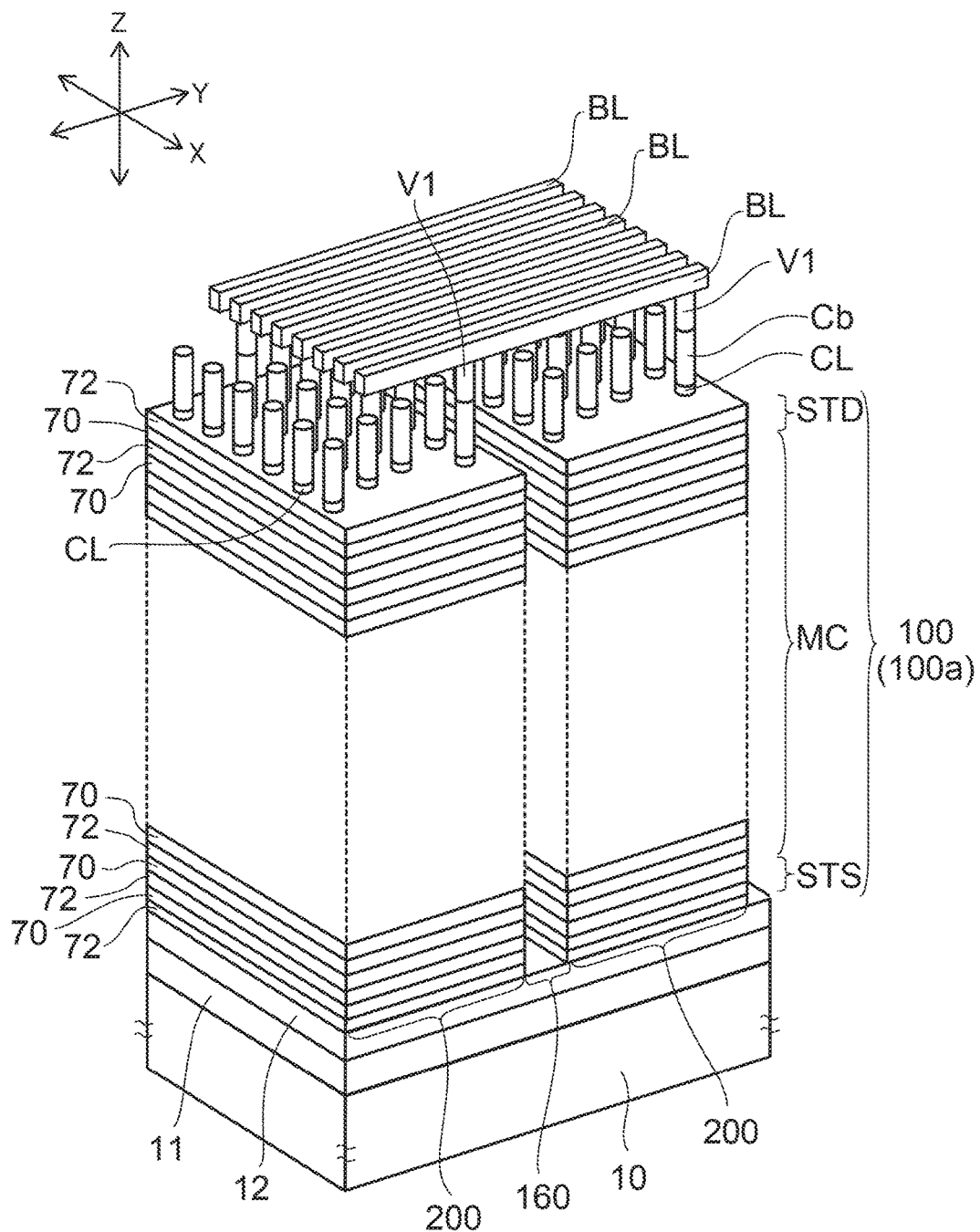
FIG. 65 is a schematic perspective view of a memory cell array of the semiconductor device of the embodiment.

FIG. 65 is a schematic perspective view of another example of the memory cell array of the embodiment.

A first foundation layer 11 and a second foundation layer 12 are provided between the substrate 10 and the stacked body 100. The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer. The first foundation layer 11 includes transistors and interconnects forming a control circuit.

The lower ends of the semiconductor bodies 20 of the columnar portions CL contact the second foundation layer 12; and the second foundation layer 12 is connected to the control circuit. Accordingly, the lower ends of the semiconductor bodies 20 of the columnar portions CL are electrically connected to the control circuit via the second foundation layer 12. The second foundation layer 12 can be used as a source layer.

The stacked body 100 is divided into multiple blocks 200 in the Y-direction by a separation portion 160. The separation portion 160 is an insulating film and does not include an interconnect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a foundation layer;
   a stacked body provided above the foundation layer, the stacked body including a plurality of electrode layers stacked with an insulator interposed, the electrode layers having a plurality of terrace portions arranged in a stairstep configuration with a difference in levels;
   an insulating layer provided above the terrace portions;
   a plurality of columnar portions extending in a stacking direction of the stacked body through the insulating layer and through the stacked body under the insulating layer, the columnar portions being insulative; and
   a plurality of contact portions provided at side surfaces of the columnar portions on the terrace portions, the contact portions being connected to the terrace portions, the contact portions being provided in tubular configurations surrounding the columnar portions.

2. The semiconductor device according to claim 1, wherein the electrode layers and the contact portions include the same metal as major components.

3. The semiconductor device according to claim 1, further comprising:
   a semiconductor body extending in the stacking direction through the stacked body, and
   a charge storage portion provided between the semiconductor body and one of the electrode layers.

4. The semiconductor device according to claim 1, further comprising a separation portion extending in a first direction and dividing the stacked body into a plurality of blocks in a second direction, the terrace portions being arranged in the stairstep configuration in the first direction, the second direction intersecting the first direction.

5. The semiconductor device according to claim 4, wherein a width in the second direction of the separation portion is greater than outer diameters of the columnar portions.

6. The semiconductor device according to claim 4, wherein
   a width in the second direction of the separation portion is greater than outer diameters of the contact portions.

7. The semiconductor device according to claim 1, further comprising a metal oxide film provided between one of the electrode layers and the insulator, and between one of the electrode layers and the columnar portions.

8. The semiconductor device according to claim 7, wherein the metal oxide film is provided also between the contact portions and the columnar portions, and between the contact portions and the insulating layer.

9. The semiconductor device according to claim 1, wherein
   lengths in the stacking direction of the columnar portions are substantially equal, and
   a length in the stacking direction of a contact portion of the contact portions disposed on an upper level side is shorter than a length in the stacking direction of a contact portion of the contact portions disposed on a lower level side.

* * * * *